(12) United States Patent
Kurokawa et al.

(10) Patent No.: US 12,120,443 B2
(45) Date of Patent: Oct. 15, 2024

(54) SEMICONDUCTOR DEVICE AND ELECTRONIC DEVICE

(71) Applicant: Semiconductor Energy Laboratory Co., Ltd., Atsugi (JP)

(72) Inventors: Yoshiyuki Kurokawa, Sagamihara (JP); Munehiro Kozuma, Atsugi (JP); Takeshi Aoki, Ebina (JP); Takuro Kanemura, Sapporo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 265 days.

(21) Appl. No.: 17/793,104

(22) PCT Filed: Jan. 8, 2021

(86) PCT No.: PCT/IB2021/050107
§ 371 (c)(1),
(2) Date: Jul. 15, 2022

(87) PCT Pub. No.: WO2021/148897
PCT Pub. Date: Jul. 29, 2021

(65) Prior Publication Data
US 2023/0043910 A1    Feb. 9, 2023

(30) Foreign Application Priority Data
Jan. 21, 2020   (JP) .................. 2020-007624

(51) Int. Cl.
*H04N 25/74* (2023.01)
*H01L 27/12* (2006.01)
(Continued)

(52) U.S. Cl.
CPC ............. *H04N 25/74* (2023.01); *H10K 39/32* (2023.02); *H01L 27/1207* (2013.01);
(Continued)

(58) Field of Classification Search
CPC .... H04N 25/74; H10K 39/32; H01L 27/1207; H01L 27/1225; H01L 27/1255;
(Continued)

(56) References Cited

U.S. PATENT DOCUMENTS 7,443,202 B2   10/2008   Kimura et al.
7,649,787 B2    1/2010   Kozuma et al.
(Continued)

FOREIGN PATENT DOCUMENTS

EP    0466331 A    1/1992
JP    04-067259 A    3/1992
(Continued)

OTHER PUBLICATIONS

International Search Report (Application No. PCT/IB2021/050107) Dated May 11, 2021.
(Continued)

*Primary Examiner* — Usman A Khan
(74) *Attorney, Agent, or Firm* — Eric J. Robinson; Robinson Intellectual Property Law Office, P.C.

(57) ABSTRACT

A semiconductor device that has low power consumption and is capable of performing a product-sum operation is provided. The semiconductor device includes first and second cells, a first circuit, and first to third wirings. Each of the first and second cells includes a capacitor, and a first terminal of each of the capacitors is electrically connected to the third wiring. Each of the first and second cells has a function of feeding a current based on a potential held at a second terminal of the capacitor, to a corresponding one of the first and second wirings. The first circuit is electrically connected to the first and second wirings and stores currents I1 and I2 flowing through the first and second wirings. When the potential of the third wiring changes and accordingly the amount of current of the first wiring changes from I1 to I3

(Continued)

and the amount of current of the second wiring changes from I2 to I4, the first circuit generates a current with an amount I1−I2−I3+I4. Note that the potential of the third wiring is changed by firstly inputting a reference potential to the third wiring and then inputting a potential based on internal data or a potential based on information obtained by a sensor.

11 Claims, 35 Drawing Sheets

(51) Int. Cl.
*H01L 29/786* (2006.01)
*H10B 12/00* (2023.01)
*H10K 39/32* (2023.01)

(52) U.S. Cl.
CPC ...... *H01L 27/1225* (2013.01); *H01L 27/1255* (2013.01); *H01L 29/78648* (2013.01); *H01L 29/7869* (2013.01); *H10B 12/00* (2023.02)

(58) Field of Classification Search
CPC ........... H01L 29/78648; H01L 29/7869; H01L 27/14634; H01L 27/14636; H01L 29/786; H10B 12/00; G06F 7/523; G06G 7/60; G06N 3/063
USPC ........................................................ 348/294
See application file for complete search history.

(56) References Cited

U.S. PATENT DOCUMENTS

| | | | |
|---|---|---|---|
| 8,687,416 B2 | 4/2014 | Kurokawa | |
| 8,730,730 B2 | 5/2014 | Koyama et al. | |
| 9,350,358 B2 | 5/2016 | Okamoto. et al. | |
| 9,779,660 B2 * | 10/2017 | Yao | G09G 3/3233 |
| 9,851,942 B2 | 12/2017 | Kurokawa | |
| 10,109,633 B2 | 10/2018 | Kurokawa | |
| 10,141,069 B2 | 11/2018 | Ikeda et al. | |
| 11,335,813 B2 | 5/2022 | Kobayashi et al. | |
| 2013/0228773 A1 | 9/2013 | Kurokawa | |
| 2013/0314124 A1 | 11/2013 | Ikeda et al. | |
| 2014/0159771 A1 | 6/2014 | Ikeda et al. | |
| 2014/0241054 A1 | 8/2014 | Koyama | |
| 2016/0295152 A1 | 10/2016 | Kurokawa | |
| 2017/0063351 A1 | 3/2017 | Kurokawa | |
| 2017/0116512 A1 | 4/2017 | Kurokawa | |
| 2017/0118479 A1 | 4/2017 | Kurokawa | |
| 2017/0221553 A1 | 8/2017 | Ishizu et al. | |
| 2017/0270405 A1 | 9/2017 | Kurokawa | |
| 2017/0317085 A1 | 11/2017 | Kurokawa | |

FOREIGN PATENT DOCUMENTS

| | | |
|---|---|---|
| JP | 2017-168099 A | 9/2017 |
| JP | 2017-201570 A | 11/2017 |
| JP | 2019-047006 A | 3/2019 |
| WO | WO-2018/234925 | 12/2018 |
| WO | WO-2021/130595 | 7/2021 |

OTHER PUBLICATIONS

Written Opinion (Application No. PCT/IB2021/050107) Dated May 11, 2021.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) 2012, vol. 51, pp. 021201-1-021201-7.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Ishizu. T et al., "Embedded Oxide Semiconductor Memories: A Key Enabler for Low-Power ULSI", ECS Transactions, May 21, 2017, vol. 79, No. 1, pp. 149-156, The Electrochemical Society.

Guo.X et al., "Fast, Energy-Efficient, Robust, and Reproducible Mixed-Signal Neuromorphic Classifier Based on Embedded NOR Flash Memory Technology", IEDM 17: Technical Digest of International Electron Devices Meeting, Dec. 2, 2017, pp. 151-154.

* cited by examiner

MAC1

100

FIG. 30A
| Amorphous | Intermediate state<br>New crystalline phase<br>Crystalline | Crystal |
|---|---|---|
| • completely amorphous | • CAAC<br>• nc<br>• CAC<br>excluding single crystal and poly crystal | • single crystal<br>• poly crystal |
FIG. 30B
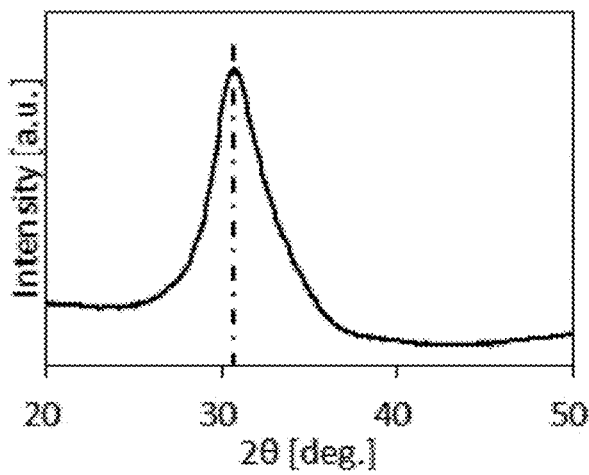
FIG. 30C
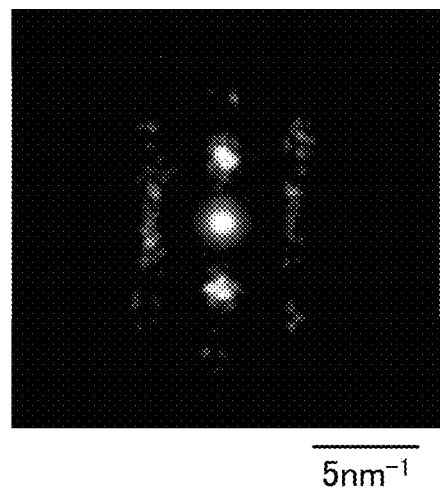

SEMICONDUCTOR DEVICE AND ELECTRONIC DEVICE

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, an operation method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a sensor, a processor, an electronic device, a system, a driving method thereof, a manufacturing method thereof, and a testing method thereof.

BACKGROUND ART

Integrated circuits that imitate the mechanism of the human brain are currently under active development. The integrated circuits incorporate electronic circuits as the brain mechanism and include circuits corresponding to "neurons" and "synapses" of the human brain. Such integrated circuits may therefore be called "neuromorphic", "brain-morphic", or "brain-inspired" circuits, for example. The integrated circuits have a non-von Neumann architecture and are expected to be able to perform parallel processing with extremely low power consumption as compared with a von Neumann architecture, in which power consumption increases with increasing processing speed.

An information processing model that imitates a biological neural network including "neurons" and "synapses" is called an artificial neural network (ANN). By using an artificial neural network, inference with an accuracy as high as or higher than that of a human can be carried out. In an artificial neural network, the main arithmetic operation is the weighted sum operation of outputs from neurons, i.e., the product-sum operation.

For example, Patent Document 1 discloses an invention that utilizes a memory cell using an OS transistor as a circuit that executes a product-sum operation. An OS transistor (sometimes referred to as an oxide semiconductor transistor) is a transistor in which a channel formation region contains a metal oxide semiconductor, and has been reported to exhibit an ultralow off-state current (e.g., Non-Patent Documents 1 and 2). A variety of semiconductor devices using OS transistors have been manufactured (e.g., Non-Patent Documents 3 and 4). The manufacturing process of an OS transistor can be incorporated in a CMOS process with a conventional Si transistor, and an OS transistor can be stacked over a Si transistor (e.g., Non-Patent Document 4).

REFERENCE

Patent Document

[Patent Document 1] Japanese Published Patent Application No. 2017-168099

Non-Patent Document

[Non-Patent Document 1] S. Yamazaki et al., "Properties of crystalline In—Ga—Zn-oxide semiconductor and its transistor characteristics", Jpn. J. Appl. Phys., vol. 53, 04ED18 (2014).

[Non-Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51, 021201 (2012).

[Non-Patent Document 3] S. Amano et al., "Low Power LC Display Using In—Ga—Zn-Oxide TFTs Based on Variable Frame Frequency," SID Symp. Dig. Papers, vol. 41, pp. 626-629 (2010).

[Non-Patent Document 4] T. Ishizu et al., "Embedded Oxide Semiconductor Memories: A Key Enabler for Low-Power ULSI", ECS Tran., vol. 79, pp. 149-156 (2017).

SUMMARY OF THE INVENTION

Problems to be Solved by the Invention

When a digital circuit carries out a product-sum operation, a digital multiplication circuit carries out multiplication of multiplier digital data (multiplier data) and multiplicand digital data (multiplicand data). Then, the digital data yielded by the multiplication (product data) are added in a digital addition circuit to yield digital data (product-sum data) resulted from the product-sum operation. The digital multiplication circuit and the digital addition circuit preferably have specifications that allow a multi-bit arithmetic operation. However, in this case, the circuit scale of the digital multiplication circuit and the digital addition circuit is sometimes increased, which might lead to an increase in the circuit area of the entire arithmetic circuit and an increase in power consumption.

In the case where calculation is performed using a processor or the like, data of the calculation results is stored once in a digital memory, for example. In the case of performing a product-sum operation, for example, product data obtained by the digital multiplication circuit is stored once in the digital memory, and the product data is read out when product-sum data is calculated by the digital addition circuit. After the product-sum data is calculated by the digital addition circuit, the product-sum data is stored in the digital memory. In other words, in the case of performing a product-sum operation, data access to the digital memory is performed every time multiplication and addition of digital data are performed. In particular, in the case of performing an arithmetic operation for an artificial neural network, multiplication and addition of digital data are performed repeatedly; hence, the frequency of data access to the digital memory is extremely high. Thus, the speed of data writing and data reading to/from the digital memory affects arithmetic processing speed. In addition, power consumption required for data writing and data reading to/from the digital memory, for example, accounts for a large part of power consumption required for a neural network and the like performing repeated operations.

An arithmetic circuit that carries out a neural network arithmetic operation and a sensor are combined, whereby electronic devices and the like can recognize various information in some cases. For example, an optical sensor (e.g., a photodiode) as a sensor is combined with the arithmetic circuit, whereby image data obtained through the optical sensor can be used for a pattern recognition such as face recognition and image recognition. However, since an electric signal obtained from the optical sensor is weak, the electric signal needs to be amplified by an amplifier circuit to be input to the arithmetic circuit. In the case where the arithmetic circuit is composed of a digital circuit, the electric signal needs to be converted into a digital signal by an analog-to-digital converter circuit or the like. Thus, in order to input an electric signal obtained from the optical sensor to the arithmetic circuit, the electric signal needs to be processed by various circuits; hence, power consumption in the circuit may be increased.

An object of one embodiment of the present invention is to provide a semiconductor device capable of performing a product-sum operation. Another object of one embodiment of the present invention is to provide a semiconductor device with low power consumption.

Another object of one embodiment of the present invention is to provide a novel semiconductor device and the like. Another object of one embodiment of the present invention is to provide an electronic device including the semiconductor device.

Note that the objects of one embodiment of the present invention are not limited to the objects listed above. The objects listed above do not preclude the existence of other objects. The other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)

One embodiment of the present invention is a semiconductor device including a first cell, a second cell, a first circuit, a second circuit, a third circuit, a fourth circuit, a first wiring, a second wiring, and a third wiring. The first cell includes a first capacitor, and the second cell includes a second capacitor. The first circuit includes a fifth circuit and a sixth circuit, and the third circuit includes a sensor. The first cell is electrically connected to the first circuit through the first wiring, and a first terminal of the first capacitor in the first cell is electrically connected to the third wiring. The second cell is electrically connected to the first circuit through the second wiring, and a first terminal of the second capacitor in the second cell is electrically connected to the third wiring. The second circuit is electrically connected to the fourth circuit, the third circuit is electrically connected to the fourth circuit, and the third wiring is electrically connected to the fourth circuit. The fourth circuit has a function of setting one of a continuity state and a discontinuity state between the second circuit and the third wiring and setting the other of the continuity state and the discontinuity state between the third circuit and the third wiring. The first cell has a function of holding a first potential at a second terminal of the first capacitor when a first input potential is input to the third wiring; a function of feeding a current based on the first potential between the first cell and the first wiring; and a function of feeding a current based on a second potential between the first cell and the first wiring when the first potential held at the second terminal of the first capacitor changes to the second potential in response to a change of the first input potential of the third wiring to a second input potential. The second cell has a function of holding a third potential at a second terminal of the second capacitor when the first input potential is input to the third wiring; a function of feeding a current based on the third potential between the second cell and the second wiring; and a function of feeding a current based on a fourth potential between the second cell and the second wiring when the third potential held at the second terminal of the second capacitor changes to the fourth potential in response to a change of the first input potential of the third wiring to the second input potential. When the potential of the third wiring is the first input potential, a first current flows between the first circuit and the first wiring and a second current flows between the first circuit and the second wiring; when the potential of the third wiring is the second input potential, a third current flows between the first circuit and the first wiring and a fourth current flows between the first circuit and the second wiring. The fifth circuit has a function of feeding the first current with an amount $I_1$ to the first wiring when the potential of the third wiring is the second input potential, and the sixth circuit has a function of feeding the second current with an amount $I_2$ to the first wiring when the potential of the third wiring is the second input potential. The first circuit has a function of obtaining an amount $I_3$ of the third current and an amount $I_4$ of the fourth current and generating a current with an amount $I_1-I_2-I_3+I_4$ when the potential of the third wiring is the second input potential. The second circuit has a function of generating a fifth potential; a function of generating a sixth potential based on internal data input to the second circuit; and a function of outputting the fifth potential as the first input potential or the sixth potential as the second input potential to the fourth circuit. The third circuit has a function of generating a seventh potential before the sensor obtains information; a function of generating an eighth potential based on the information obtained by the sensor; and a function of outputting the seventh potential as the first input potential or the eighth potential as the second input potential to the fourth circuit.

(2)

In the above (1), one embodiment of the present invention may be configured such that the third circuit includes a first transistor, a second transistor, a third transistor, and a fourth transistor. Specifically, it is preferred that a first terminal of the sensor be electrically connected to a first terminal of the first transistor, a second terminal of the first transistor be electrically connected to a first terminal of the second transistor and a gate of the third transistor, and a first terminal of the third transistor and a first terminal of the fourth transistor be electrically connected to the third wiring through the fourth circuit.

(3)

In the above (2), one embodiment of the present invention may be configured such that the sensor includes a photodiode. Specifically, it is preferred that an output terminal of the photodiode be electrically connected to the first terminal of the sensor.

(4)

In the above (1), one embodiment of the present invention may be configured such that the first cell includes a fifth transistor and a sixth transistor and the second cell includes a seventh transistor and an eighth transistor. Specifically, it is preferred that a first terminal of the fifth transistor be electrically connected to the second terminal of the first capacitor and a gate of the sixth transistor, a first terminal of the sixth transistor be electrically connected to the first wiring, a first terminal of the seventh transistor be electrically connected to the second terminal of the second capacitor and a gate of the eighth transistor, and a first terminal of the eighth transistor be electrically connected to the second wiring.

(5)

In any one of the above (1) to (4), one embodiment of the present invention may be configured such that the second circuit includes a digital-to-analog converter circuit. Specifically, it is preferred that the digital-to-analog converter circuit convert an input digital signal based on the internal data into the sixth potential and output the sixth potential to the fourth circuit.

(6)

In any one of the above (1) to (5), one embodiment of the present invention may be configured such that the third circuit is positioned above the first cell and the second cell.

(7)

One embodiment of the present invention is an electronic device including the semiconductor device according to any one of the above (1) to (6) and a housing, in which the semiconductor device has a function of performing a product-sum operation.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means devices that can function by utilizing semiconductor characteristics. For example, an integrated circuit, a chip including an integrated circuit, an electronic component including a chip in a package, and the like are examples of the semiconductor device. Moreover, a memory device, a display device, a light-emitting device, a lighting device, an electronic device, and the like themselves are semiconductor devices, or include semiconductor devices in some cases.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, at least one element that enables electrical connection between X and Y (e.g., a switch, a transistor, a capacitor, an inductor, a resistor, a diode, a display device, a light-emitting device, or a load) can be connected between X and Y. Note that a switch has a function of being controlled to be turned on or off. That is, the switch has a function of being in a conducting state (on state) or a non-conducting state (off state) to control whether a current flows or not.

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description, X and Y are electrically connected, includes the case where X and Y are electrically connected (i.e., the case where X and Y are connected through another element or another circuit) and the case where X and Y are directly connected (i.e., the case where X and Y are connected without through another element or another circuit).

It can be expressed as, for example, "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope. Note that the above expressions are examples, and there is no limitation on the expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both of the components, the function of a wiring and the function of an electrode. Thus, electrical connection in this specification includes, in its category, such a case where one conductive film has functions of a plurality of components.

In this specification and the like, a "resistor" can be, for example, a circuit element or a wiring having a resistance value higher than $0\Omega$. Therefore, in this specification and the like, a "resistor" sometimes includes a wiring having a resistance value, a transistor in which current flows between its source and drain, a diode, and a coil. Thus, the term "resistor" can be replaced with the terms "resistance", "load", "region having a resistance value", and the like; inversely, the terms "resistance", "load", and "region having a resistance value" can be replaced with the term "resistor" and the like. The resistance value can be, for example, preferably greater than or equal to 1 m$\Omega$ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to $1×10^9$Ω.

In this specification and the like, a "capacitor" can be, for example, a circuit element having an electrostatic capacitance value higher than 0 F, a region of a wiring having an electrostatic capacitance value, parasitic capacitance, or gate capacitance of a transistor. Therefore, in this specification and the like, a "capacitor" sometimes includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; inversely, the term "capacitance" can be replaced with the terms "capacitor", "parasitic capacitance", "gate capacitance", and the like. The term "pair of electrodes" of "capacitor" can be replaced with "pair of conductors", "pair of conductive regions", "pair of regions", and the like. Note that the electrostatic capacitance value can be greater than or equal to 0.05 fF and less than or equal to 10 pF, for example. As another example, the electrostatic capacitance value may be greater than or equal to 1 pF and less than or equal to 10 μF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Therefore, the terms "source" and "drain" can be replaced with each other in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. In some cases, the terms "gate" and "back gate" can be replaced with each other in one transistor. In the case where a transistor includes three or more gates, the gates may be referred to as a first gate, a second gate, and a third gate, for example, in this specification and the like.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, are changed with a change of the reference potential.

In this specification and the like, the terms "high-level potential" and "low-level potential" do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles is caused" can be rephrased as "electrical conduction of negatively charged particles is caused in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The direction of current in a wiring or the like refers to the direction in which a positive carrier moves, and the amount of current is expressed as a positive value. In other words, the direction in which a negative carrier moves is opposite to the direction of current, and the amount of current is expressed as a negative value. Thus, in the case where the polarity of a current (or the direction of a current) is not specified in this specification and the like, the description "a current flows from element A to element B" can be rephrased as "a current flows from element B to element A", for example. As another example, the description "current is input to element A" can be rephrased as "current is output from element A".

Ordinal numbers such as "first", "second", and "third" in this specification and the like are used in order to avoid confusion among components. Thus, the terms do not limit the number of components. Furthermore, the terms do not limit the order of components. For example, a "first" component in one embodiment in this specification and the like can be referred to as a "second" component in other embodiments or the scope of claims. As another example, a "first" component in one embodiment in this specification and the like can be omitted in other embodiments or the scope of claims.

In this specification and the like, the terms for describing positioning, such as "over" and "under", are sometimes used for convenience to describe the positional relation between components with reference to drawings. The positional relation between components is changed as appropriate in accordance with the direction from which each component is described. Thus, the positional relation is not limited to that described with a term in this specification and the like and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the terms such as "over" and "under" do not necessarily mean that a component is placed directly over or directly under and in direct contact with another component.

For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms such as "film" and "layer" can be interchanged with each other depending on the situation. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "electrode," "wiring," and "terminal" do not functionally limit those components. For example, an "electrode" is used as part of a wiring in some cases, and vice versa. Furthermore, the term "electrode" or "wiring" also includes the case where a plurality of "electrodes" or "wirings" are formed in an integrated manner, for example. For example, a "terminal" is used as part of a "wiring," an "electrode," or the like in some cases, and vice versa. Furthermore, the term "terminal" can also include the case where a plurality of "electrodes", "wirings", "terminals", or the like are formed in an integrated manner. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region", for example.

In this specification and the like, the terms "wiring", "signal line", "power supply line", and the like can be interchanged with each other depending on the case or according to circumstances. For example, the term "wiring" can be changed into the term "signal line" in some cases. As another example, the term "wiring" can be changed into the term "power supply line" in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or according to circumstances. Conversely, the term "signal" or the like can be changed into the term "potential" in some cases.

In this specification and the like, an impurity in a semiconductor refers to, for example, elements other than the main components of a semiconductor layer. For instance, an element with a concentration of lower than 0.1 atomic % is an impurity. When an impurity is contained, for example, the density of defect states in a semiconductor may be increased, the carrier mobility may be decreased, or the crystallinity may be decreased. In the case where the semiconductor is an oxide semiconductor, examples of impurities that change the characteristics of the semiconductor include Group 1 elements, Group 2 elements, Group 13 elements, Group 14 elements, Group 15 elements, and transition metals other than the main components; specific examples are hydrogen (including water), lithium, sodium, silicon, boron, phosphorus, carbon, and nitrogen. Specifically, when the semiconductor is a silicon layer, examples of impurities that change the characteristics of the semiconductor include Group 1 elements except hydrogen, Group 2 elements, Group 13 elements, Group 15 elements, and oxygen.

In this specification and the like, a switch has a function of being in a conducting state (on state) or a non-conducting state (off state) to determine whether a current flows or not. Alternatively, a switch has a function of selecting and changing a current path. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conducting state" of the transistor refers to a state where a source electrode and a drain electrode of the transistor can be regarded as being electrically short-circuited. Furthermore, a "non-conducting state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. Moreover, "approximately parallel" or "substantially parallel" indicates a state where two straight lines are placed at an angle greater than or equal to −30° and less than or equal to 30°. In addition, "perpendicular" indicates a state where two straight lines are placed at an angle greater than or equal to 80° and less than or equal to 100°. Thus, the case where the angle is greater than or equal to 850 and less than or equal to 950 is also included. Furthermore, "approximately perpendicular" or "substantially perpendicular" indicates a state where two straight lines are placed at an angle greater than or equal to 60° and less than or equal to 120°.

Effect of the Invention

One embodiment of the present invention can provide a semiconductor device capable of performing a product-sum operation. Alternatively, one embodiment of the present invention can provide a semiconductor device with low power consumption.

Alternatively, one embodiment of the present invention can provide a novel semiconductor device and the like. Alternatively, one embodiment of the present invention can provide an electronic device including the semiconductor device.

Note that the effects of one embodiment of the present invention are not limited to the effects listed above. The effects listed above do not preclude the existence of other effects. The other effects are effects that are not described in this section and will be described below. The effects that are not described in this section are derived from the description of the specification, the drawings, or the like and can be extracted as appropriate from the description by those skilled in the art. Note that one embodiment of the present invention has at least one of the effects listed above and the other effects. Accordingly, one embodiment of the present invention does not have the effects listed above in some cases.

BRIEF DESCRIPTION OF THE DRAWINGS

FIG. 30A is a diagram showing classification of crystal structures of IGZO, FIG. 30B is a diagram showing an XRD spectrum of crystalline IGZO, and FIG. 30C is a diagram showing a nanobeam electron diffraction pattern of crystalline IGZO.

MODE FOR CARRYING OUT THE INVENTION

Figure 1:
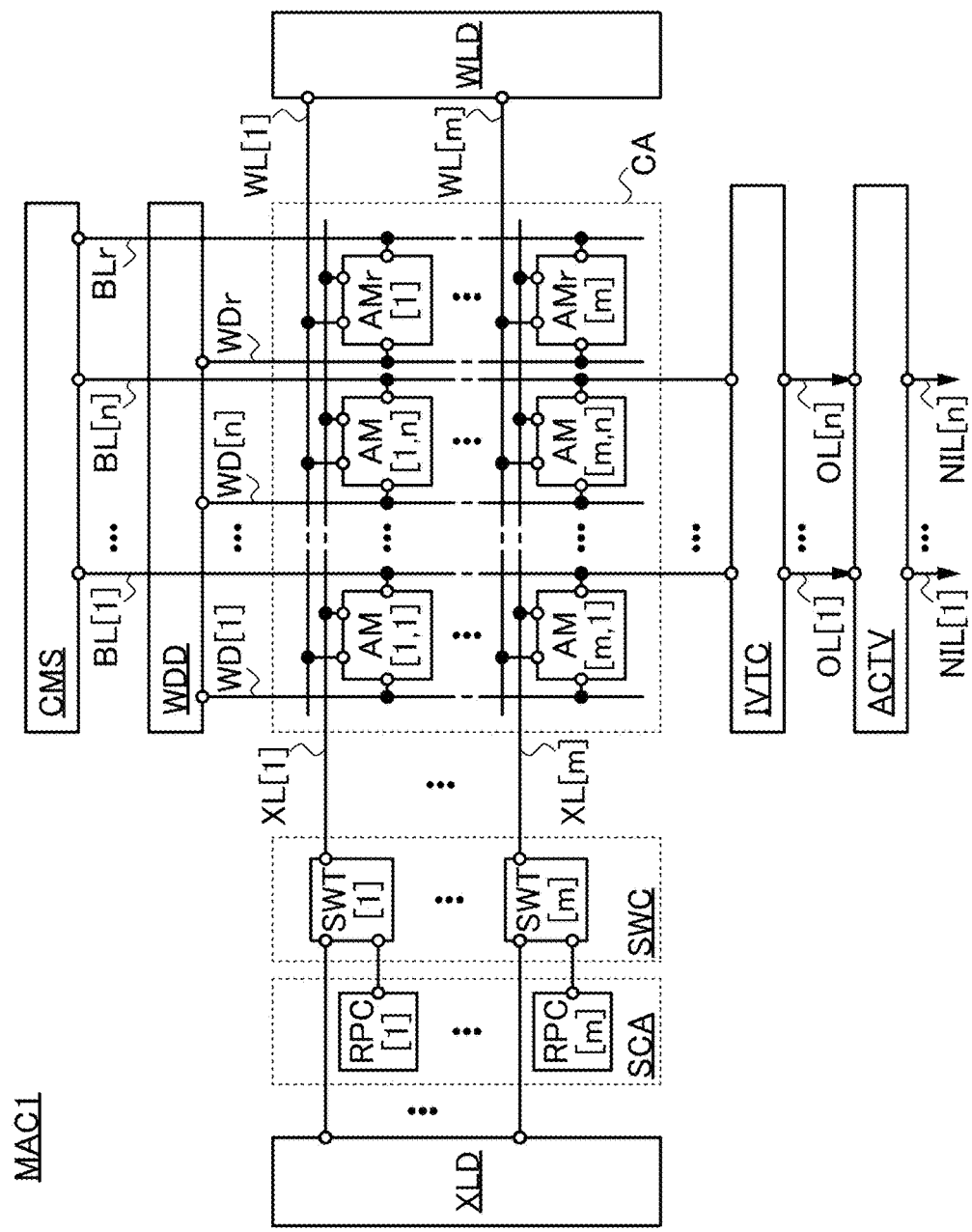
FIG. 1 is a block diagram illustrating a configuration example of a semiconductor device.

In an artificial neural network (hereinafter referred to as a neural network), the connection strength between synapses can be changed by providing the neural network with existing information. The processing for determining a connection strength by providing a neural network with existing data in such a manner is called "learning" in some cases.

Furthermore, when a neural network in which "learning" has been performed (the connection strength has been determined) is provided with some type of information, new information can be output on the basis of the connection strength. The processing for outputting new information on the basis of provided information and the connection strength in a neural network in such a manner is called "inference" or "recognition" in some cases.

Examples of the model of a neural network include a Hopfield neural network and a hierarchical neural network. In particular, a neural network with a multilayer structure is called a "deep neural network" (DNN) and machine learning using a deep neural network is called "deep learning" in some cases.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment (or the example), a content described in the embodiment is a content described with reference to a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification will be described with reference to the drawings. Note that the embodiments can be implemented in many different modes, and it will be readily appreciated by those skilled in the art that modes and details can be changed in various ways without departing from the spirit and scope thereof. Therefore, the present invention should not be construed as being limited to the description of the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted by the same reference numerals, and in particular need to be distinguished from each other, an identification sign such as "_1", "[n]", or "[m,n]" is sometimes added to the reference numerals.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, an example of an arithmetic circuit that is a semiconductor device of one embodiment of the present invention will be described.

Configuration Example 1 of Arithmetic Circuit

An arithmetic circuit MAC1 illustrated in FIG. 1 shows a configuration example of an arithmetic circuit capable of performing a product-sum operation and an operation using a function. The arithmetic circuit MAC1 is a circuit that performs a product-sum operation using first data retained in a memory cell described below and input second data and performs an activation function operation using the product-sum operation result. Note that the first data and the second data can be analog data or multilevel data (discrete data), for example.

The arithmetic circuit MAC1 includes a sensor and can treat information obtained by sensing with the sensor as second data of a product-sum operation. As the sensor, an optical sensor including a photodiode, a pressure sensor, a gyroscope sensor, an acceleration sensor, a sound sensor, a temperature sensor, a humidity sensor, or the like can be used.

Furthermore, the arithmetic circuit MAC1 can treat data that is stored in advance in a memory device or the like (hereinafter referred to as internal data), instead of information obtained by the sensor, as the second data. That is, the arithmetic circuit MAC1 has a function of selecting information obtained from the sensor or the internal data as the second data.

The arithmetic circuit MAC1 includes, for example, a memory cell array CA, a circuit CMS, a circuit WDD, a circuit XLD, a circuit SCA, a circuit SWC, a circuit WLD, a circuit IVTC, and a circuit ACTV.

The memory cell array CA includes a memory cell AM[1,1] to a memory cell AM[m,n] and a memory cell AMr[1] to a memory cell AMr[m]. In the memory cell array CA, the memory cell AM[1,1] to the memory cell AM[m,n] are arranged in a matrix of m rows and n columns (m is an integer greater than or equal to 1 and n is an integer greater than or equal to 1). The memory cell AMr[1] to the memory cell AMr[m] are arranged in an (n+1)th column of the memory cell array CA.

The memory cell AM[1,1] to the memory cell AM[m,n] have a function of retaining the first data, and the memory cell AMr[1] to the memory cell AMr[m] have a function of retaining first reference data that is needed to perform a product-sum operation. Note that the reference data can also be analog data or multilevel data (discrete data), like the first data and the second data.

The memory cell AM[1,1] is electrically connected to a wiring WD[1], a wiring BL[1], a wiring WL[1], and a wiring XL[1]. The memory cell AM[m,1] is electrically connected to the wiring WD[1], the wiring BL[1], a wiring WL[m], and a wiring XL[m]. The memory cell AM[1,n] is electrically connected to a wiring WD[n], a wiring BL[n], the wiring WL[1], and the wiring XL[1]. The memory cell AM[m,n] is electrically connected to the wiring WD[n], the wiring BL[n], the wiring WL[m], and the wiring XL[m]. The memory cell AMr[1] is electrically connected to a wiring WDr, a wiring BLr, the wiring WL[1], and the wiring XL[1]. The memory cell AMr[m] is electrically connected to the wiring WDr, the wiring BLr, the wiring WL[m], and the wiring XL[m].

An example of a detailed circuit configuration of the memory cell AM[1,1] to the memory cell AM[m,n] and the memory cell AMr[1] to the memory cell AMr[m] will be described later.

The circuit CMS is electrically connected to the wiring BL[1] to the wiring BL[n] and the wiring BLr. The circuit CMS has a function of supplying a current from the wiring BL[1] to the memory cell AM[1,1] to the memory cell AM[m,1] and a function of setting the current to a constant current. The circuit CMS also has a function of supplying a current from the wiring BL[n] to the memory cell AM[1,n] to the memory cell AM[m,n] and a function of setting the current to a constant current. The circuit CMS also has a function of supplying a current from the wiring BLr to the memory cell AMr[1] to the memory cell AMr[m] and a function of setting the current to a constant current. The circuit CMS also has a function of subtracting the amount of constant current flowing through the wiring BLr from the amount of constant current flowing through the wiring BL[1] to the wiring BL[n].

The circuit WDD is electrically connected to the wiring WD[1] to the wiring WD[n] and the wiring WDr. The circuit WDD has a function of transmitting data that is to be stored in each memory cell included in the memory cell array CA. For example, the circuit WDD can transmit the first data as the data to the wiring WD[1] to the wiring WD[n] and transmit the reference data as the data to the wiring WDr.

The circuit WLD is electrically connected to the wiring WL[1] to the wiring WL[m]. The circuit WLD has a function of selecting a memory cell to which data is written when data is written to the memory cell included in the memory cell array CA. As a specific example, when data is written to memory cells in an i-th row (i is an integer greater than or equal to 1 and less than or equal to m) of the memory cell array CA, the circuit WLD supplies a high-level potential to the wiring WL[i] and supplies a low-level potential to the wiring WL[1] to the wiring WL[m] except the wiring WL[i], thereby selecting the memory cell AM[i,1] to the memory cell AM[i,n] and the memory cell AMr[i] to which data is written.

The circuit SWC includes a circuit SWT[1] to a circuit SWT[m], for example.

The circuit SCA includes a circuit RPC[1] to a circuit RPC[m], for example.

A first terminal of the circuit SWT[1] is electrically connected to the wiring XL[1], a second terminal of the circuit SWT[1] is electrically connected to the circuit XLD, and a third terminal of the circuit SWT[1] is electrically connected to the circuit RPC[1]. A first terminal of the circuit SWT[m] is electrically connected to the wiring XL[m], a second terminal of the circuit SWT[m] is electrically connected to the circuit XLD, and a third terminal of the circuit SWT[m] is electrically connected to the circuit RPC[m].

The circuit SWT[1] to the circuit SWT[m] each have, for example, a function of establishing one of the continuity state and the discontinuity state between the first terminal and the second terminal and establishing the other state between the first terminal and the third terminal.

The circuit RPC[1] to the circuit RPC[m] each include a sensor that generates second data corresponding to information obtained by sensing. Accordingly, the circuit RPC[1] has a function of supplying a voltage based on the second data to the third terminal of the circuit SWT[1]. Similarly, the circuit RPC[m] has a function of supplying a voltage based on the second data to the third terminal of the circuit SWT[m].

Although FIG. 1 illustrates the circuit SCA in which the circuit RPC[1] to the circuit RPC[m] are arranged in one column, the semiconductor device of one embodiment of the present invention is not limited thereto. For example, the circuit RPC[1] to the circuit RPC[m] may be arranged in a matrix instead of being arranged in one column. Similarly, the circuit SWT[1] to the circuit SWT[m] may be arranged in a matrix instead of being arranged in one column.

Figure 2:
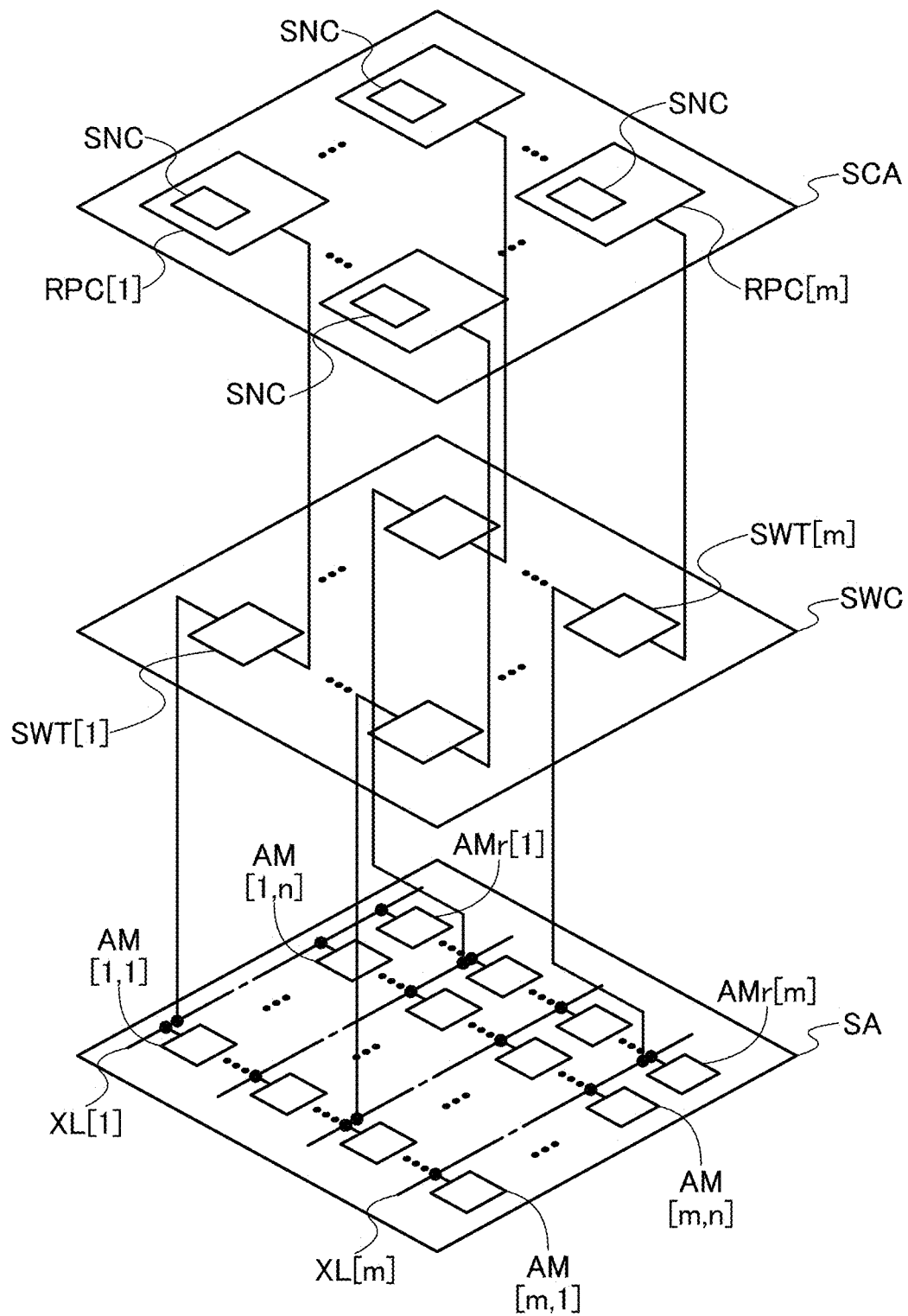
FIG. 2 is a block diagram illustrating a configuration example of a semiconductor device.

A configuration of the arithmetic circuit MAC1 that includes the circuit SCA including a matrix of the circuit RPC[1] to the circuit RPC[m] and the circuit SWC including a matrix of the circuit SWT[1] to the circuit SWT[m] may be, for example, a configuration example illustrated in FIG. 2. Note that FIG. 2 selectively illustrates a circuit SA, the circuit SWC, and the circuit SCA.

In the arithmetic circuit MAC1 illustrated in FIG. 2, the circuit SWC including a matrix of the circuit SWT[1] to the circuit SWT[m] is positioned above the memory cell array CA, and the circuit SCA including a matrix of the circuit RPC[1] to the circuit RPC[m] is positioned above the circuit SWC. Note that the circuit SWC may be positioned below the memory cell array CA (not illustrated), instead of above the memory cell array CA.

The circuit XLD has a function of inputting a voltage based on the second data to the memory cell AM[1,1] to the memory cell AM[1,n] and the memory cell AMr[1] included in the memory cell array CA through the first terminal of the circuit SWT[1] and the second terminal of the circuit SWT[1]. The circuit XLD also has a function of inputting a voltage based on the second data to the memory cell AM[m,1] to the memory cell AM[m,n] and the memory cell AMr[m] included in the memory cell array CA through the first terminal of the circuit SWT[m] and the second terminal of the circuit SWT[m].

The circuit IVTC is electrically connected to the wiring BL[1] to the wiring BL[n] and a wiring OL[1] to a wiring OL[n]. The circuit IVTC has, for example, a function of converting the amount of current flowing from the wiring BL[1] to the circuit IVTC into a voltage or the like and a function of outputting the voltage to the wiring OL[1]. Moreover, the circuit IVTC has, for example, a function of converting the amount of current flowing from the wiring BL[n] to the circuit IVTC into a voltage or the like and a function of outputting the voltage to the wiring OL[n].

The circuit ACTV is electrically connected to the wiring OL[1] to the wiring OL[n] and a wiring NIL[1] to a wiring NIL[n]. A voltage output from the circuit IVTC is input to the circuit ACTV through the wiring OL[1]. The circuit ACTV has a function of performing an arithmetic operation on the voltage according to a function system defined in advance. As the function system, for example, a sigmoid function, a tanh function, a softmax function, a ReLU function, a threshold function, or the like can be used, and these functions are used as activation functions in a neural network.

Configuration Example of Memory Cell

Next, a configuration example of the memory cell AM[1,1] to the memory cell AM[m,n] and the memory cell AMr[1] to the memory cell AMr[m] included in the memory cell array CA will be described.

Figure 3:
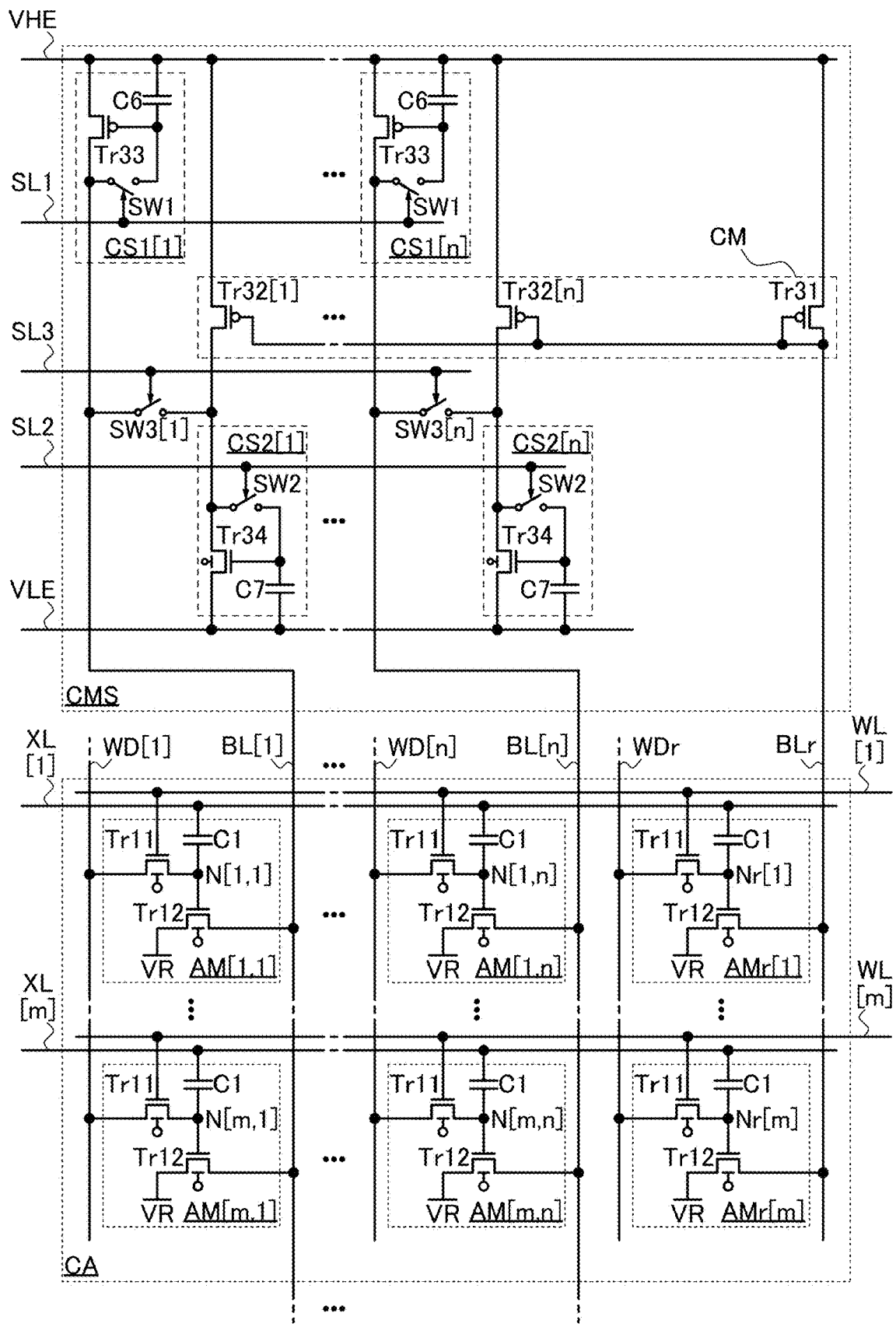
FIG. 3 is a circuit diagram illustrating a configuration example of a circuit included in a semiconductor device.

FIG. 3 is a circuit diagram illustrating a configuration example of the memory cell array CA and the circuit CMS. The memory cell array CA and the circuit CMS have a function of calculating a product-sum of the first data and the second data.

In the memory cell array CA illustrated in FIG. 3, the memory cell AM[1,1] to the memory cell AM[m,n] and the memory cell AMr[1] to the memory cell AMr[m] each include a transistor Tr11, a transistor Tr12, and a capacitor C1.

The transistors Tr11 included in the memory cell AM[1,1] to the memory cell AM[m,n] and the memory cell AMr[1] to the memory cell AMr[m] preferably have the same size (e.g., channel length, channel width, and transistor structure). The transistors Tr12 included in the memory cell AM[1,1] to the memory cell AM[m,n] and the memory cell AMr[1] to the memory cell AMr[m] preferably have the same size.

By making the transistors have the same size, each transistor can have almost the same electrical characteristics. Thus, by making the transistors Tr11 included in the memory cell AM[1,1] to the memory cell AM[m,n] and the memory cell AMr[1] to the memory cell AMr[m] have the same size and making the transistors Tr12 included in the memory cell AM[1,1] to the memory cell AM[m,n] and the memory cell AMr[1] to the memory cell AMr[m] have the same size, the memory cell AM[1,1] to the memory cell AM[m,n] and the memory cell AMr[1] to the memory cell AMr[m] can perform substantially the same operation when in the same condition. The same condition here means, for example, potentials of a source, a drain, a gate, and the like of the transistor Tr11; potentials of a source, a drain, a gate, and the like of the transistor Tr12; and voltages input to the memory cell AM[1,1] to the memory cell AM[m,n] and the memory cell AMr[1] to the memory cell AMr[m].

Note that the transistor Tr11 may function as a switching element unless otherwise specified. That is, the gate voltage, the source voltage, and the drain voltage of the transistor Tr11 may be appropriately biased to voltages in a range where the transistor Tr11 operates as a switching element. Thus, the transistor Tr11 in the on state may operate in a saturation region or may operate both in a linear region and a saturation region.

Unless otherwise specified, the transistor Tr12 may operate in a saturation region when being in the on state. In other words, the gate voltage, the source voltage, and the drain voltage of each of the above transistors may be appropriately biased to voltages in the range where the transistor operates in a saturation region.

Note that the transistor Tr11 is preferably an OS transistor. In addition, it is further preferable that a channel formation region of the transistor Tr11 include an oxide containing at least one of indium, gallium, and zinc. Alternatively, the channel formation region of the transistor Tr11 may be an oxide containing at least one of indium, an element M (examples of the element M include one or more kinds selected from aluminum, yttrium, copper, vanadium, beryllium, boron, titanium, iron, nickel, germanium, zirconium, molybdenum, lanthanum, cerium, neodymium, hafnium, tantalum, tungsten, magnesium, and the like), and zinc. It is further preferable that the transistor Tr11 have a structure of the transistor described in Embodiment 5.

With the use of an OS transistor as the transistor Tr11, the leakage current of the transistor Tr11 can be suppressed, so that a product-sum operation circuit with high calculation accuracy can be obtained in some cases. Moreover, the use of an OS transistor as the transistor Tr11 achieves an extremely low leakage current from retention nodes (e.g., a node N[1,1], a node N[m,1], a node N[1,n], a node N[m,n], a node Nr[1], and a node Nr[m] described later) to write word lines (e.g., the wiring WD[1] to the wiring WD[n] and the wiring WDr) at the time when each transistor Tr11 is in the non-conducting state. In other words, the frequency of refresh operation for the potential at the retention node can be reduced; thus, power consumption of the product-sum operation circuit can be reduced.

The use of an OS transistor also as the transistor Tr12 allows the transistor Tr12 to be formed concurrently with the transistor Tr11, which sometimes results in a reduction in the number of manufacturing steps for the product-sum operation circuit. The channel formation region of the transistor Tr12 may contain silicon instead of an oxide (in this specification and the like, a transistor including silicon in its channel formation region is referred to as a Si transistor). The silicon may be amorphous silicon (referred to as hydrogenated amorphous silicon in some cases), microcrystalline silicon, polycrystalline silicon, single crystal silicon, or the like, for example.

When a semiconductor device or the like is highly integrated into a chip or the like, the chip may have heat when the circuit is driven. This heat makes the temperature of a transistor rise to change the characteristics of the transistor, and the field-effect mobility might change or the operating frequency might decrease, for example. Since an OS transistor has a higher heat resistance than a Si transistor, a change in field-effect mobility and a decrease in operating frequency due to a temperature change do not easily occur. That is, an OS transistor is likely to maintain its electrical characteristics even when the temperature rises. Hence, with the use of an OS transistor, an arithmetic operation, processing, or the like can be easily performed even in a high temperature environment. Consequently, an OS transistor is preferably used as a transistor for fabricating a semiconductor device highly resistant to heat due to driving.

For each of the transistor Tr11 and the transistor Tr12 in FIG. 3, the back gate is illustrated but the connection structure of the back gate is not illustrated; a target to which the back gate is electrically connected can be determined at the design stage. For example, in a transistor including a back gate, a gate and the back gate may be electrically connected to each other to increase the on-state current of the transistor. That is, for example, the gate and the back gate of the transistor Tr11 may be electrically connected to each other, and the gate and the back gate of the transistor Tr12 may be electrically connected to each other. Alternatively, for example, in a transistor including a back gate, a wiring electrically to connect the back gate of the transistor to an external circuit or the like may be provided and a potential may be supplied to the back gate of the transistor with the external circuit or the like to change the threshold voltage of the transistor or to reduce the off-state current of the transistor.

The transistor Tr11 and the transistor Tr12 illustrated in FIG. 3 have back gates; however, the semiconductor device of one embodiment of the present invention is not limited thereto. For example, the transistor Tr11 and the transistor Tr12 illustrated in FIG. 3 may each be a transistor having a structure not including a back gate, that is, a single-gate structure. It is also possible that some transistors have a structure including a back gate and the other transistors have a structure not including a back gate.

The transistor Tr11 and the transistor Tr12 illustrated in FIG. 3 are n-channel transistors; however, the semiconductor device of one embodiment of the present invention is not limited thereto. For example, some or all of the transistors Tr11 and the transistors Tr12 may be replaced with p-channel transistors.

The above-described examples of changes in the structure and the polarity of the transistors are not limited to the transistor Tr11 and the transistor Tr12. For example, the same applies to a transistor Tr33, a transistor Tr34, and a transistor Tr41 to a transistor Tr44 described later, transistors described in other parts of this specification, and transistors illustrated in other drawings.

In each of the memory cell AM[1,1] to the memory cell [m,n] and the memory cell AMr[1] to the memory cell AMr[m], a first terminal of the transistor Tr11 is electrically connected to a gate of the transistor Tr12. A first terminal of the transistor Tr12 is electrically connected to a wiring VR.

A first terminal of the capacitor C1 is electrically connected to the gate of the transistor Tr12.

In the memory cell AM[1,1], a second terminal of the transistor Tr11 is electrically connected to the wiring WD[1], and a gate of the transistor Tr11 is electrically connected to the wiring WL[1]. A second terminal of the transistor Tr12 is electrically connected to the wiring BL[1], and a second terminal of the capacitor C1 is electrically connected to the wiring XL[1]. In the memory cell AM[1,1], an electrical connection portion of the first terminal of the transistor Tr11, the gate of the transistor Tr12, and the first terminal of the capacitor C1 is the node N[1,1].

In the memory cell AM[m,1], the second terminal of the transistor Tr11 is electrically connected to the wiring WD[1], and the gate of the transistor Tr11 is electrically connected to the wiring WL[m]. The second terminal of the transistor Tr12 is electrically connected to the wiring BL[1], and the second terminal of the capacitor C1 is electrically connected to the wiring XL[m]. In the memory cell AM[m,1], an electrical connection portion of the first terminal of the transistor Tr11, the gate of the transistor Tr12, and the first terminal of the capacitor C1 is the node N[m,1].

In the memory cell AM[1,n], the second terminal of the transistor Tr1 is electrically connected to the wiring WD[n], and the gate of the transistor Tr11 is electrically connected to the wiring WL[1]. The second terminal of the transistor Tr12 is electrically connected to the wiring BL[n], and the second terminal of the capacitor C1 is electrically connected to the wiring XL[1]. In the memory cell AM[1,n], an electrical connection portion of the first terminal of the transistor Tr11, the gate of the transistor Tr12, and the first terminal of the capacitor C1 is the node N[1,n].

In the memory cell AM[m,n], the second terminal of the transistor Tr11 is electrically connected to the wiring WD[n], and the gate of the transistor Tr11 is electrically connected to the wiring WL[m]. The second terminal of the transistor Tr12 is electrically connected to the wiring BL[n], and the second terminal of the capacitor C1 is electrically connected to the wiring XL[m]. In the memory cell AM[m,n], an electrical connection portion of the first terminal of the transistor Tr11, the gate of the transistor Tr12, and the first terminal of the capacitor C1 is the node N[m,n].

In the memory cell AMr[1], the second terminal of the transistor Tr1 is electrically connected to the wiring WDr, and the gate of the transistor Tr11 is electrically connected to the wiring WL[1]. The second terminal of the transistor Tr12 is electrically connected to the wiring BLr, and the second terminal of the capacitor C1 is electrically connected to the wiring XL[1]. In the memory cell AMr[1], an electrical connection portion of the first terminal of the transistor Tr1, the gate of the transistor Tr12, and the first terminal of the capacitor C1 is the node Nr[1]. In addition, a current that flows from the wiring BLr to the second terminal of the transistor Tr12 is $I_{AMr[1]}$.

In the memory cell AMr[m], the second terminal of the transistor Tr11 is electrically connected to the wiring WDr, and the gate of the transistor Tr11 is electrically connected to the wiring WL[m]. The second terminal of the transistor Tr12 is electrically connected to the wiring BLr, and the second terminal of the capacitor C1 is electrically connected to the wiring XL[m]. In the memory cell AMr[m], an electrical connection portion of the first terminal of the transistor Tr11, the gate of the transistor Tr12, and the first terminal of the capacitor C1 is the node Nr[m]. In addition, a current that flows from the wiring BLr to the second terminal of the transistor Tr12 is $I_{AMr[2]}$.

The node N[1], the node N[m], the node Nr[1], and the node Nr[m] described above function as retention nodes of their respective memory cells.

The wiring VR is a wiring for feeding a current between the first terminal and the second terminal of the transistor Tr12 in each of the memory cell AM[1,1] to the memory cell AM[m,n] and the memory cell AMr[1] to the memory cell AMr[m]. Thus, the wiring VR functions as a wiring for supplying a predetermined potential. In this embodiment, a potential supplied from the wiring VR can be, for example, a low-level potential, a ground potential, or a potential lower than the ground potential.

Configuration Example of Circuit CMS

Next, a configuration example of the circuit CMS will be described.

In FIG. 3, the circuit CMS includes a circuit CS1[1] to a circuit CS1[n], a circuit CS2[1] to a circuit CS2[n], a circuit CM, and a switch SW3[1] to a switch SW3[n].

A control terminal of each of the switch SW3[1] to the switch SW3[n] is electrically connected to a wiring SL3.

The wiring SL3 functions as a wiring that supplies a voltage for switching the conducting state and the non-conducting state of each of the switch SW3[1] to the switch SW3[n].

The circuit CS1[1] to the circuit CS1[n] each function as, for example, a current source circuit that feeds a constant current. Although the details will be described later, the circuit CS1[1] to the circuit CS1[n] each have a function of setting the amount of the constant current.

The circuit CS1[1] to the circuit CS1[n] each include the transistor Tr33 that is a p-channel transistor, a capacitor C6, and a switch SW1.

Note that the transistor Tr33 is preferably a Si transistor. Silicon included in the channel formation region of the transistor Tr33 can be, for example, amorphous silicon (sometimes referred to as hydrogenated amorphous silicon), microcrystalline silicon, polycrystalline silicon, single crystal silicon, or the like.

The transistors Tr33 included in the circuit CS1[1] to the circuit CS1[n] preferably have the same electrical characteristics. To achieve this, the transistors Tr33 in the circuit CS1[1] to the circuit CS1[n] preferably have the same size, for example.

Unless otherwise specified, the transistors Tr33 included in the circuit CS1[1] to the circuit CS1[n] may operate in a saturation region when being in the on state. In other words, the gate voltage, the source voltage, and the drain voltage of each of the above transistors may be appropriately biased to voltages in the range where the transistor operates in a saturation region.

In each of the circuit CS1[1] to the circuit CS1[n], a first terminal of the transistor Tr33 is electrically connected to a wiring VHE, a gate of the transistor Tr33 is electrically connected to a first terminal of the capacitor C6 and a first terminal of the switch SW1, and a second terminal of the transistor Tr33 is electrically connected to a second terminal of the switch SW1. A second terminal of the capacitor C6 is electrically connected to the wiring VHE. A control terminal of the switch SW1 is electrically connected to a wiring SL1.

In the circuit CS1[1], a first terminal of the switch SW3[1] and the wiring BL[1] are electrically connected to the second terminal of the transistor Tr33 and the second terminal of the switch SW1.

In the circuit CS1[n], a first terminal of the switch SW3[n] and the wiring BL[n] are electrically connected to the second terminal of the transistor Tr33 and the second terminal of the switch SW1.

The wiring VHE functions as a wiring that supplies a constant voltage. The constant voltage is preferably a high-level potential, for example.

The wiring SL1 functions as a wiring that supplies a voltage for switching the conducting state and the non-conducting state of the switch SW1 in each of the circuit CS1[1] to the circuit CS1[n].

The circuit CS1[1] to the circuit CS1[n] each have a function of keeping the amount of current flowing between the source and the drain of the transistor Tr33 constant even when the source-drain voltage of the transistor Tr33 changes, for example. Specifically, in each of the circuit CS1[1] to the circuit CS1[n], the switch SW1 is turned on, so that the transistor Tr33 is diode-connected. At this time, a current based on the voltage between the source and drain (gate) of the transistor Tr33 flows between the source and the drain of the transistor Tr33. Moreover, the potential of the gate of the transistor Tr33 becomes substantially equal to the potential of the drain. Here, by turning off the switch SW1 and holding the potential of the gate of the transistor Tr33 by the first terminal of the capacitor C6, the gate-source voltage of the transistor Tr33 can be kept constant. Thus, in the case where the transistor Tr33 operates in a saturation region, even if the potential of the drain is changed, the amount of current flowing between the source and the drain can be kept constant to be the amount of current flowing when the switch SW1 is on.

Note that in this specification and the like, making a transistor temporarily have a diode-connected structure so that the gate potential of the transistor is substantially equal to the drain potential, and then breaking continuity between the gate and the drain of the transistor so that the amount of current between the source and the drain of the transistor is kept constant in the above manner is referred to as "setting (programming) the amount of current flowing between the source and the drain of the transistor", for example. In the case where the transistor is included in a circuit as in each of the circuit CS1[1] to the circuit CS1[n], the above is referred to as "setting (programming) the amount of current flowing through the circuit" or "setting (programming) the amount of current flowing from the circuit (flowing into the circuit)", for example.

The circuit CS2[1] to the circuit CS2[n] each function as, for example, a current source circuit that feeds a constant current. Like the circuit CS1[1] to the circuit CS1[n], the circuit CS2[1] to the circuit CS2[n] have a function of setting the amount of the constant current.

The circuit CS2[1] to the circuit CS2[n] each include the transistor Tr34 that is an n-channel transistor, a capacitor C7, and a switch SW2.

As the transistor Tr34, an OS transistor, which can be used as the transistor Tr11, or a Si transistor can be used, for example. In the case where a Si transistor is used as the transistor Tr34, silicon included in the channel formation region of the transistor Tr34 can be, for example, amorphous silicon (sometimes referred to as hydrogenated amorphous silicon), microcrystalline silicon, polycrystalline silicon, single crystal silicon, or the like.

The transistors Tr34 included in the circuit CS2[1] to the circuit CS2[n] preferably have the same electrical characteristics. To achieve this, the transistors Tr34 in the circuit CS2[1] to the circuit CS2[n] preferably have the same size, for example.

Unless otherwise specified, the transistors Tr34 included in the circuit CS2[1] to the circuit CS2[n] may operate in a saturation region when being in the on state. In other words, the gate voltage, the source voltage, and the drain voltage of each of the above transistors may be appropriately biased to voltages in the range where the transistor operates in a saturation region.

In each of the circuit CS2[1] to the circuit CS2[n], a first terminal of the transistor Tr34 is electrically connected to a wiring VLE, a gate of the transistor Tr34 is electrically connected to a first terminal of the capacitor C7 and a first terminal of the switch SW2, and a second terminal of the transistor Tr34 is electrically connected to a second terminal of the switch SW2. A second terminal of the capacitor C7 is electrically connected to the wiring VLE. A control terminal of the switch SW2 is electrically connected to a wiring SL2.

In the circuit CS2[1], a second terminal of the switch SW3[1] is electrically connected to the second terminal of the transistor Tr34 and the second terminal of the switch SW2.

In the circuit CS2[n], a second terminal of the switch SW3[n] is electrically connected to the second terminal of the transistor Tr34 and the second terminal of the switch SW2.

The wiring VLE functions as a wiring that supplies a constant voltage. The constant voltage is preferably a low-level potential, for example.

The wiring SL2 functions as a wiring that supplies a voltage for switching the conducting state and the non-conducting state of the switch SW2 in each of the circuit CS2[1] to the circuit CS2[n].

Like the circuit CS1[1] to the circuit CS1[n], for example, the circuit CS2[1] to the circuit CS2[n] each have a function of keeping the amount of current flowing between the source and the drain of the transistor Tr34 constant even when the source-drain voltage of the transistor Tr34 changes. Specifically, in each of the circuit CS2[1] to the circuit CS2[n], the switch SW2 is turned on, so that the transistor Tr34 is diode-connected. At this time, a current based on the voltage between the source and drain (gate) of the transistor Tr34 flows between the source and the drain of the transistor Tr34. Moreover, the potential of the gate of the transistor Tr34 becomes substantially equal to the potential of the drain. Here, by turning off the switch SW2 and holding the potential of the gate of the transistor Tr34 by the first terminal of the capacitor C7, the gate-source voltage of the transistor Tr34 can be kept constant. Thus, in the case where the transistor Tr34 operates in a saturation region, even if the potential of the drain is changed, the amount of current flowing between the source and the drain can be kept constant to be the amount of current flowing when the switch SW2 is on.

The circuit CM functions as a current mirror circuit, for example. The circuit CM includes a transistor Tr31 and a transistor Tr32[1] to a transistor Tr32[n], for example.

In order that the circuit CM functions as a current mirror circuit, the transistor Tr31 and the transistor Tr32[1] to the transistor Tr32[n] preferably have the same electrical characteristics. To achieve this, the transistor Tr31 and the transistor Tr32[1] to the transistor Tr32[n] preferably have the same size, for example.

Unless otherwise specified, the transistor Tr31 and the transistor Tr32[1] to the transistor Tr32[n] may operate in a saturation region when being in the on state. In other words, the gate voltage, the source voltage, and the drain voltage of each of the above transistors may be appropriately biased to voltages in the range where the transistor operates in a saturation region.

First terminals of the transistor Tr31 and the transistor Tr32[1] to the transistor Tr32[n] are electrically connected to the wiring VHE. A second terminal of the transistor Tr31 is electrically connected to a gate of the transistor Tr31, gates of a transistor Tr31[1] to a transistor Tr31[n], and the wiring BLr.

A second terminal of the transistor Tr32[1] is electrically connected to the second terminal of the switch SW3[1], the second terminal of the transistor Tr34 in the circuit CS2[1], and the second terminal of the switch SW2 in the circuit CS2[1]. A second terminal of the transistor Tr32[n] is electrically connected to the second terminal of the switch SW3[n], the second terminal of the transistor Tr34 in the circuit CS2[n], and the second terminal of the switch SW2 in the circuit CS2[n].

With the configuration illustrated in FIG. 3, the circuit CM enables a current whose amount is substantially the same as the amount of current flowing between the first terminal and the second terminal of the transistor Tr31, to flow between the first terminal and the second terminal of each of the transistor Tr32[1] to the transistor Tr32[n].

As the switch SW1, the switch SW2, and the switch SW3[1] to the switch SW3[n], analog switches or electrical switches such as transistors can be used, for example. As another example, mechanical switches may be used as the switch SW1, the switch SW2, and the switch SW3[1] to the switch SW3[n]. In the case where transistors are used as the switch SW1, the switch SW2, and the switch SW3[1] to the switch SW3[n], the transistors can be OS transistors or Si transistors.

Figure 4:
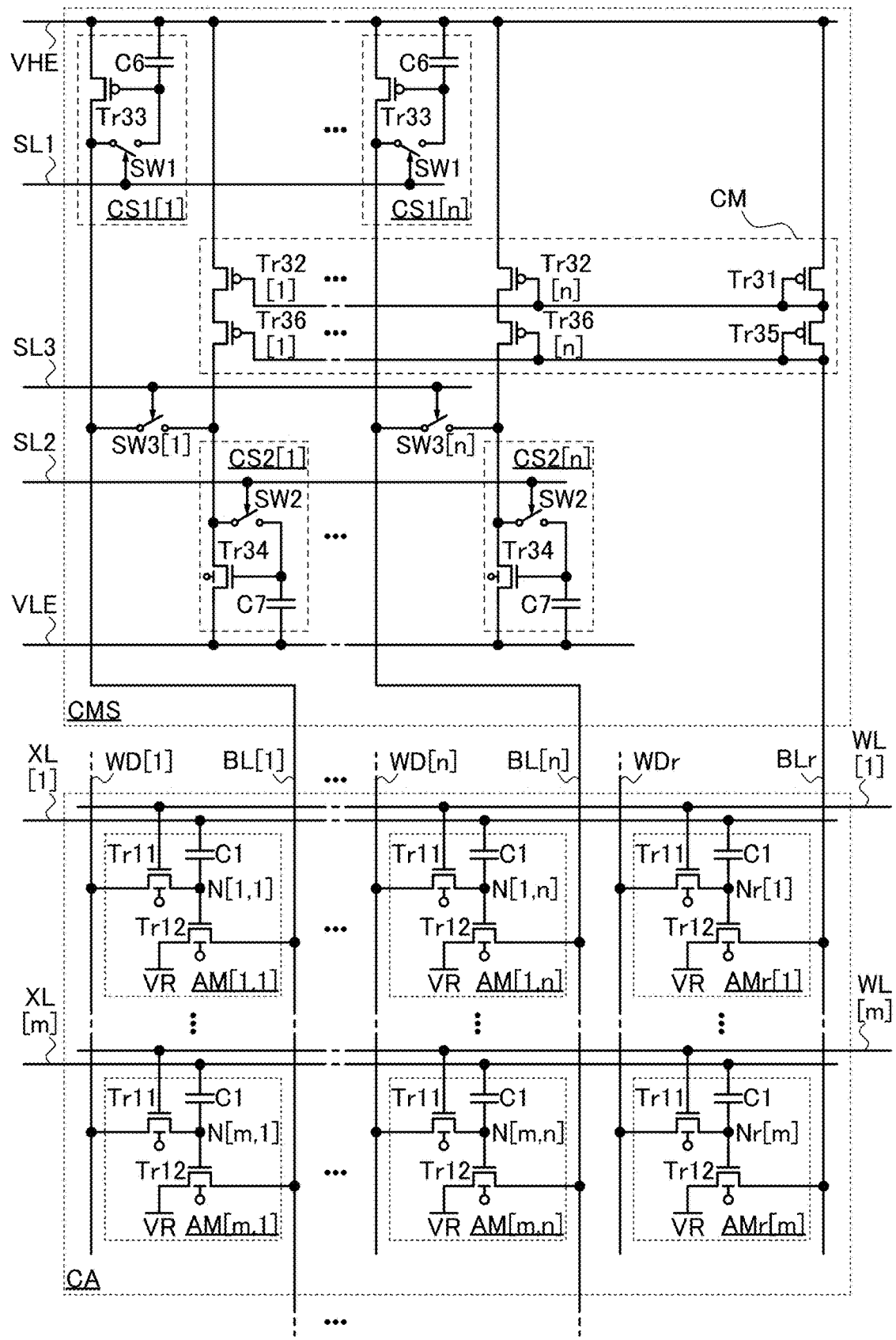
FIG. 4 is a circuit diagram illustrating a configuration example of a circuit included in a semiconductor device.

The configuration of the circuit CM is not limited to the configuration illustrated in FIG. 3. The circuit CM may have, for example, a configuration in which the transistor Tr31 and a transistor Tr35 are cascode-connected and the transistor Tr32[1] to the transistor Tr32[n] are respectively cascode-connected to a transistor Tr36[1] to a transistor Tr36[n] as in the circuit CM illustrated in FIG. 4. When the transistors included in the current mirror circuit are cascode-connected as in the circuit CM illustrated in FIG. 4, the operation of the current mirror circuit can be more stable.

Note that in this embodiment, each of the switch SW1, the switch SW2, and the switch SW3[1] to the switch SW3[n] is turned on when a high-level potential is input to the control terminal, and is turned off when a low-level potential is input to the control terminal.

Configuration Example of Circuit IVTC

Next, a configuration example of the circuit IVTC will be described.

Figure 5A:
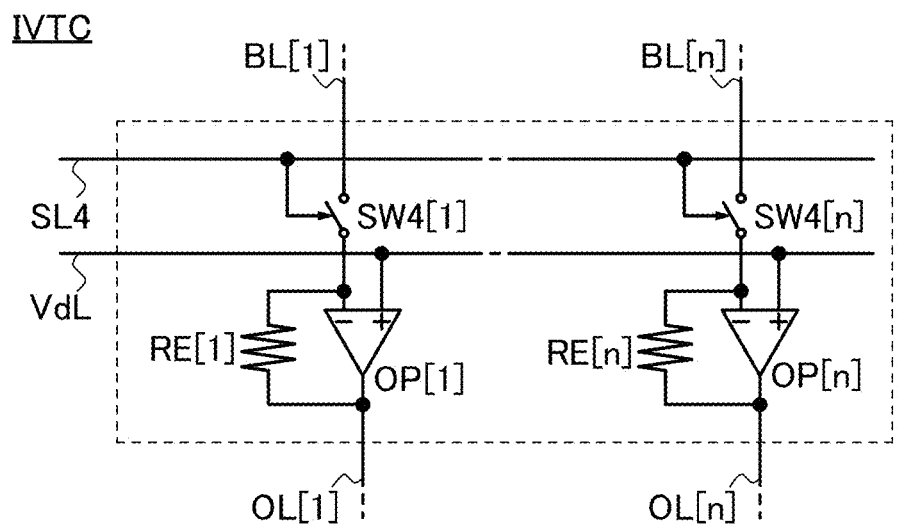
FIG. 5A and FIG. 5B are circuit diagrams illustrating configuration examples of a circuit included in a semiconductor device.

FIG. 5A is a circuit diagram illustrating a configuration example of the circuit IVTC. The circuit IVTC includes a resistor RE[1] to a resistor RE[n], an operational amplifier OP[1] to an operational amplifier OP[n], and a switch SW4[1] to a switch SW4[n], for example.

A first terminal of the switch SW4[1] is electrically connected to the wiring BL[1], and a second terminal of the switch SW4[1] is electrically connected to a first terminal of the resistor RE[1] and an inverting input terminal of the operational amplifier OP[1]. A non-inverting input terminal of the operational amplifier OP[1] is electrically connected to a wiring VdL, and an output terminal of the operational amplifier OP[1] is electrically connected to a second terminal of the resistor RE[1] and the wiring OL[1]. In other words, a current-to-voltage converter circuit is configured with the resistor RE[1] and the operational amplifier OP[1].

Similarly, a first terminal of the switch SW4[n] is electrically connected to the wiring BL[n], and a second terminal of the switch SW4[n] is electrically connected to a first terminal of the resistor RE[n] and an inverting input terminal of the operational amplifier OP[n]. Control terminals of the switch SW4[1] to the switch SW4[n] are electrically connected to a wiring SL4.

The wiring SL4 functions as a wiring that supplies a voltage for switching the conducting state and the non-conducting state of each of the switch SW4[1] to the switch SW4[n], for example.

A non-inverting input terminal of the operational amplifier OP[n] is electrically connected to the wiring VdL, and an output terminal of the operational amplifier OP[n] is electrically connected to a second terminal of the resistor RE[n] and the wiring OL[n].

The wiring VdL functions as a wiring that supplies a constant voltage, for example. The constant voltage can be a ground potential or a low-level potential, for example.

That is, in the circuit IVTC, n current-to-voltage converter circuits are configured with the resistor RE[1] to the resistor RE[n], the operational amplifier OP[1] to the operational amplifier OP[n], and the wiring VdL.

As the switch SW4[1] to the switch SW4[n], it is possible to use, for example, switches usable as the switch SW1, the switch SW2, and the switch SW3[1] to the switch SW3[n]. In this specification and the like, like the switch SW1, the switch SW2, and the switch SW3[1] to the switch SW3[n], each of the switch SW4[1] to the switch SW4[n] is turned on when a high-level potential is input to the control terminal, and is turned off when a low-level potential is input to the control terminal.

Figure 5B:
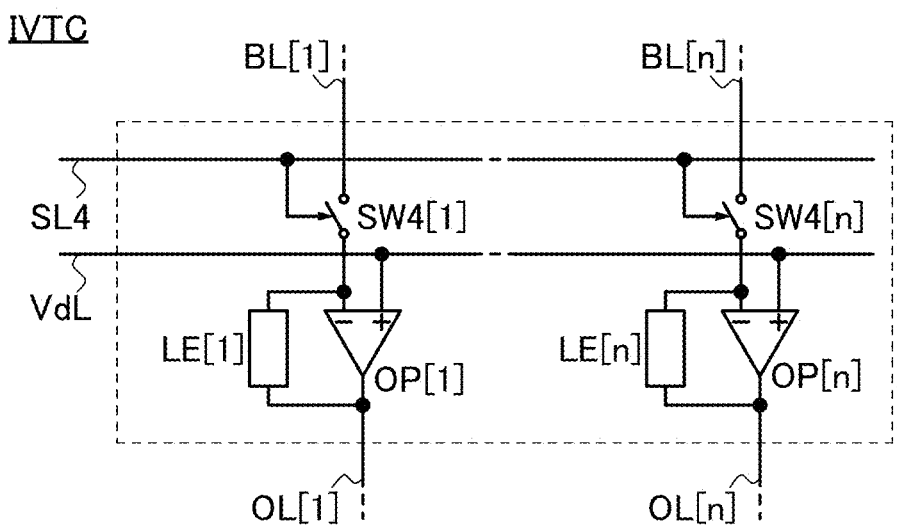

Note that the circuit IVTC that can be used in the arithmetic circuit MAC1 is not limited to the circuit IVTC illustrated in FIG. 5A. For example, as in the circuit IVTC illustrated in FIG. 5B, the resistor RE[1] to the resistor RE[n] provided in the circuit IVTC in FIG. 5A may be replaced with a load LE[1] to a load LE[n]. As the load LE[1] to the load LE[n], diodes or transistors may be used, for example; in the case of using such circuit elements, n current-to-voltage converter circuits can be configured with the load LE[1] to the load LE[n] and the operational amplifier OP[1] to the operational amplifier OP[n].

Configuration Example of Circuit SWC

Next, a configuration example of the circuit SWC will be described.

Figure 6:
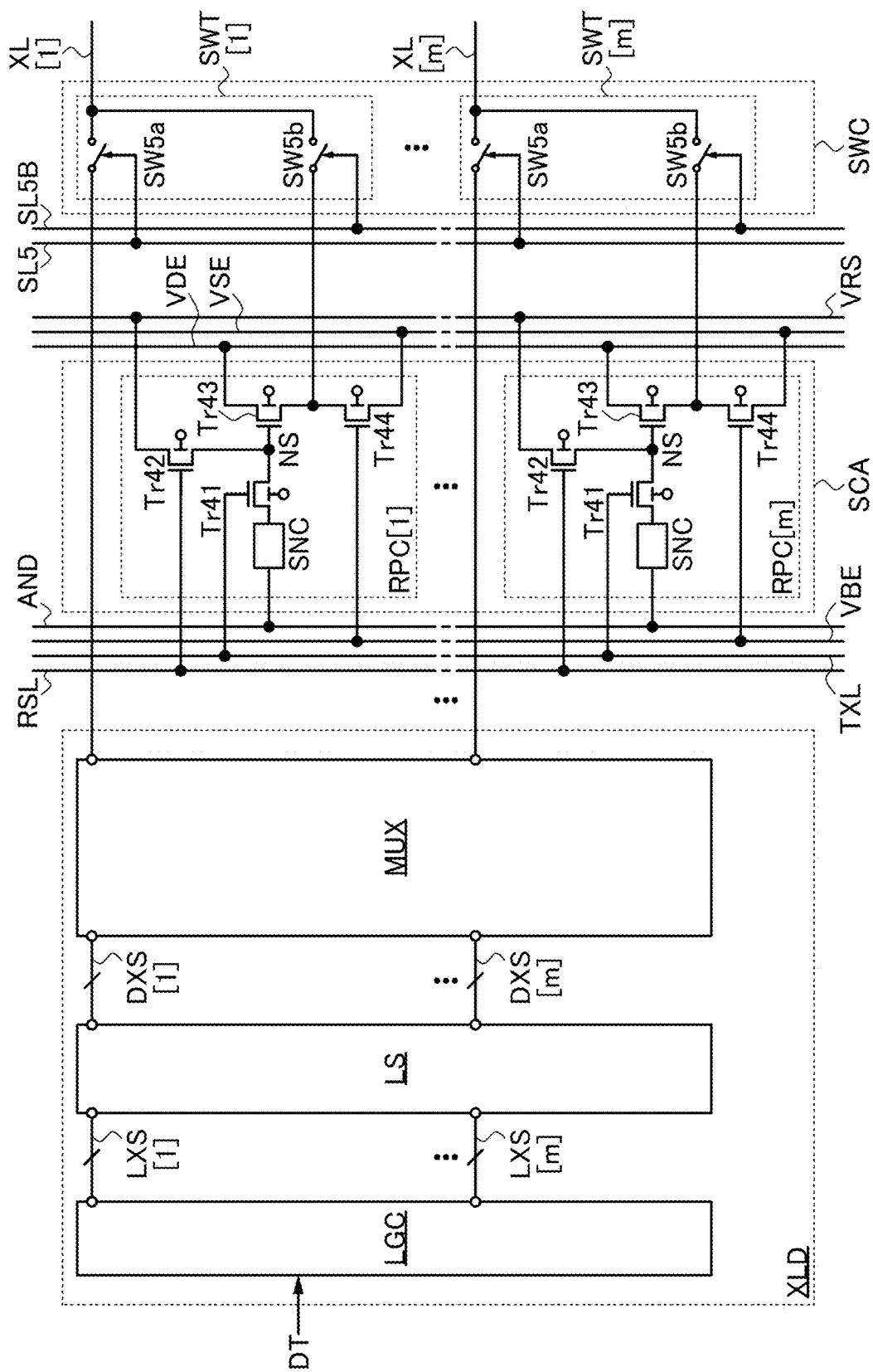
FIG. 6 is a circuit diagram illustrating a configuration example of a circuit included in a semiconductor device.

FIG. 6 is a circuit diagram illustrating a configuration example of the circuit SWC, the circuit SCA, and the circuit XLD. In the circuit SWC illustrated in FIG. 6, the circuit SWT[1] to the circuit SWT[m] each include a switch SW5a and a switch SW5b.

In the circuit SWT[1], a first terminal of the switch SW5a is electrically connected to the wiring XL[1] and a first terminal of the switch SW5b. A control terminal of the switch SW5a is electrically connected to a wiring SL5, and a control terminal of the switch SW5b is electrically connected to a wiring SL5B.

In the circuit SWT[m], the first terminal of the switch SW5a is electrically connected to the wiring XL[m] and the first terminal of the switch SW5b. The control terminal of the switch SW5a is electrically connected to the wiring SL5, and the control terminal of the switch SW5b is electrically connected to the wiring SL5B.

The wiring SL5 functions as a wiring that supplies a voltage for switching the conducting state and the non-conducting state of the switch SW5a in each of the circuit SWT[1] to the circuit SWT[m], for example. The wiring SL5B functions as a wiring that supplies a voltage for switching the conducting state and the non-conducting state of the switch SW5b in each of the circuit SWT[1] to the circuit SWT[m], for example. When voltages supplied to the wiring SL5 and the wiring SL5B are digital signals, a signal supplied to the wiring SL5 can be a signal whose logic is inverted from that of the signal supplied to the wiring SL5B.

As the switch SW5a and the switch SW5b, it is possible to use, for example, switches usable as the switch SW1, the switch SW2, and the switch SW3[1] to the switch SW3[n]. In this embodiment, like the switch SW1, the switch SW2, and the switch SW3[1] to the switch SW3[n], each of the switch SW5a and the switch SW5b is turned on when a high-level potential is input to the control terminal, and is turned off when a low-level potential is input to the control terminal.

Configuration Example of Circuit SCA

Next, a configuration example of the circuit SCA will be described.

In the circuit SCA illustrated in FIG. 6, the circuit RPC[1] to the circuit RPC[m] each include the transistor Tr41, the transistor Tr42, the transistor Tr43, the transistor Tr44, and a circuit SNC, for example.

The transistors Tr41 included in the circuit RPC[1] to the circuit RPC[m] preferably have the same size (e.g., channel length, channel width, and transistor structure). The transistors Tr42 included in the circuit RPC[1] to the circuit RPC[m] preferably have the same size. The transistors Tr43 included in the circuit RPC[1] to the circuit RPC[m] preferably have the same size. The transistors Tr44 included in the circuit RPC[1] to the circuit RPC[m] preferably have the same size. As described above, by making the transistors have the same size, each transistor can have almost the same electrical characteristics. Thus, the circuit RPC[1] to the circuit RPC[m] can perform substantially the same operation when in the same condition. The same condition here means, for example, potentials of a source, a drain, a gate, and the like of each of the transistor Tr41 to the transistor Tr44 and voltages input to the circuit RPC[1] to the circuit RPC[m].

Note that the transistor Tr41 and the transistor Tr42 may function as switching elements unless otherwise specified. That is, the gate voltage, the source voltage, and the drain voltage of the transistor Tr41 and the transistor Tr42 may be appropriately biased to voltages in a range where the transistor Tr41 and the transistor Tr42 operate as switching elements. Thus, the transistor Tr41 and the transistor Tr42 in the on state may operate in a saturation region or may operate both in a linear region and a saturation region.

Unless otherwise specified, the transistor Tr43 and the transistor Tr44 may operate in a saturation region when being in the on state. In other words, the gate voltage, the source voltage, and the drain voltage of each of the above transistors may be appropriately biased to voltages in the range where the transistor operates in a saturation region.

As the transistor Tr41 to the transistor Tr44, n-channel transistors can be used, for example. The transistor Tr41 to the transistor Tr44 can be OS transistors, which can be used as the transistor Tr12, or Si transistors, for example.

Figure 7A:
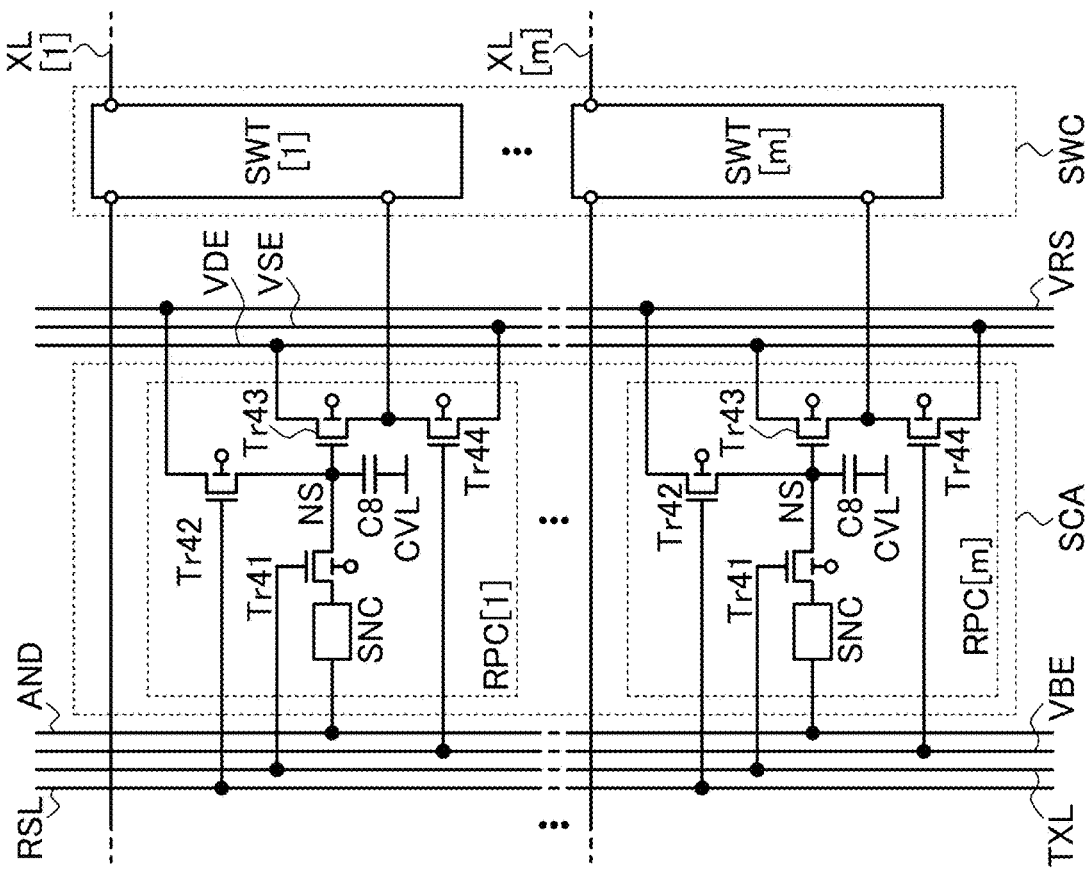
FIG. 7A and FIG. 7B are circuit diagrams illustrating configuration examples of a circuit included in a semiconductor device.

The circuit SNC includes a sensor that converts information obtained by sensing into the current amount and outputs the current amount. As described above, the sensor can be, for example, an optical sensor including a photodiode, a pressure sensor, a gyroscope sensor, an acceleration sensor, a sound sensor, a temperature sensor, a humidity sensor, or the like. In particular, when an optical sensor is used as the circuit SNC, the circuit SCA can be part of an image sensor. FIG. 7A illustrates a configuration example in which the circuit SNC including a photodiode PD is used in the circuit SCA in FIG. 6. Specifically, an input terminal of the photodiode PD is electrically connected to a first terminal of the circuit SNC, and an output terminal of the photodiode PD is electrically connected to a second terminal of the circuit SNC. Note that FIG. 7A also illustrates the circuit SWC to show electrical connection with the circuit RPC[1] to the circuit RPC[m].

In the photodiode PD included in the circuit SCA in FIG. 7A, the amount of induced current depends on the intensity of received light. The photodiode PD is driven with application of a reverse bias; hence, a current induced in the photodiode PD in FIG. 7A flows from the output terminal of the photodiode PD toward the input terminal. Note that the circuit configuration in FIG. 7A is an example; in some cases, in the circuit SCA, the input terminal of the photodiode PD may be electrically connected to the second terminal of the circuit SNC, and the output terminal of the photodiode PD may be electrically connected to the first terminal of the circuit SNC.

In each of the circuit RPC[1] to the circuit RPC[m], the first terminal of the circuit SNC is electrically connected to a wiring VBE, and the second terminal of the circuit SNC is electrically connected to a first terminal of the transistor Tr41. A gate of the transistor Tr41 is electrically connected to a wiring TXL, and a second terminal of the transistor Tr41 is electrically connected to a first terminal of the transistor Tr42 and a gate of the transistor Tr43. A gate of the transistor Tr42 is electrically connected to a wiring RSL, and a second terminal of the transistor Tr42 is electrically connected to a wiring VRS. A first terminal of the transistor Tr43 is electrically connected to a wiring VDE, a first terminal of the transistor Tr44 is electrically connected to a wiring VSE, and a gate of the transistor Tr44 is electrically connected to the wiring VBE. In particular, an electrical connection portion of the gate of the transistor Tr43, the first terminal of the transistor Tr42, and the second terminal of the transistor Tr41 is a node NS.

In the circuit RPC[1], a second terminal of the transistor Tr43 is electrically connected to a second terminal of the transistor Tr44 and a second terminal of the switch SW5b in the circuit SWT[1].

In the circuit RPC[m], the second terminal of the transistor Tr43 is electrically connected to the second terminal of the transistor Tr44 and the second terminal of the switch SW5b in the circuit SWT[m].

The wiring VDE functions as a wiring that supplies a constant voltage, for example. The wiring VSE functions as a wiring that supplies a constant voltage, for example. Note that the potential supplied from the wiring VDE is higher than the potential supplied from the wiring VSE.

The transistor Tr43 and the transistor Tr44 function as a source follower circuit owing to the connection structure of the transistor Tr43 and the transistor Tr44 and the potentials supplied from the wiring VDE and the wiring VSE.

The wiring TXL functions as a wiring for switching the conducting state and the non-conducting state of the transistor Tr41, for example.

The wiring RSL functions as a wiring for switching the conducting state and the non-conducting state of the transistor Tr42, for example.

The wiring VBE functions as a wiring that supplies a constant voltage, for example. In each of the circuit RPC[1] to the circuit RPC[m], the transistor Tr44 preferably functions as a constant current source where a constant current flows between the first terminal and the second terminal. Therefore, the potential supplied from the wiring VBE is preferably set so that a difference between the potential supplied from the wiring VBE and the potential supplied from the wiring VSE is larger than the threshold voltage of the transistor Tr44.

A wiring AND functions as a wiring that supplies a constant voltage, for example. Specifically, the wiring AND functions as a wiring for supplying a voltage for driving the circuit SNC. For example, in the case where the photodiode PD is included in the circuit SNC as illustrated in FIG. 7A, a reverse bias needs to be applied to the photodiode PD; thus, the constant voltage supplied from the wiring AND is preferably a voltage lower than a reset potential.

The wiring VRS functions as a wiring that supplies a constant voltage, for example. Specifically, the wiring VRS functions as a wiring for supplying a potential for initialization (hereinafter referred to as a reset potential) to the node NS.

The circuit RPC[1] to the circuit RPC[m] each perform an initial operation before sensing. As the initial operation, for example, a low-level potential is input to the wiring TXL and a high-level potential is input to the wiring RSL. Thus, the transistor Tr41 is turned off and the transistor Tr42 is turned on. Consequently, electrical continuity is established between the gate of the transistor Tr43 (the node NS) and the wiring VRS, and the reset potential is input to the gate of the transistor Tr43 (the node NS).

At this time, by the source follower circuit composed of the transistor Tr43 and the transistor Tr44, the potential of the gate of the transistor Tr43 (the node NS) based on the reset potential is output to the second terminal of the switch SW5b from the electrical connection point between the second terminal of the transistor Tr43 and the second terminal of the transistor Tr44.

When the circuit RPC[1] to the circuit RPC[m] each perform sensing, for example, a high-level potential is input to the wiring TXL and a low-level potential is input to the wiring RSL. Thus, the transistor Tr41 is turned on and the transistor Tr42 is turned off. Consequently, electrical continuity is established between the gate of the transistor Tr43 (the node NS) and the second terminal of the circuit SNC, and electric charge whose amount is based on information obtained by sensing with the circuit SNC is supplied to the gate of the transistor Tr43 (the node NS).

Then, by the source follower circuit composed of the transistor Tr43 and the transistor Tr44, the potential of the gate of the transistor Tr43 (the node NS) based on the amount of electric charge is output to the second terminal of the switch SW5b from the electrical connection point between the second terminal of the transistor Tr43 and the second terminal of the transistor Tr44. That is, the potential is treated as the second data input to the memory cell array CA.

Figure 7B:
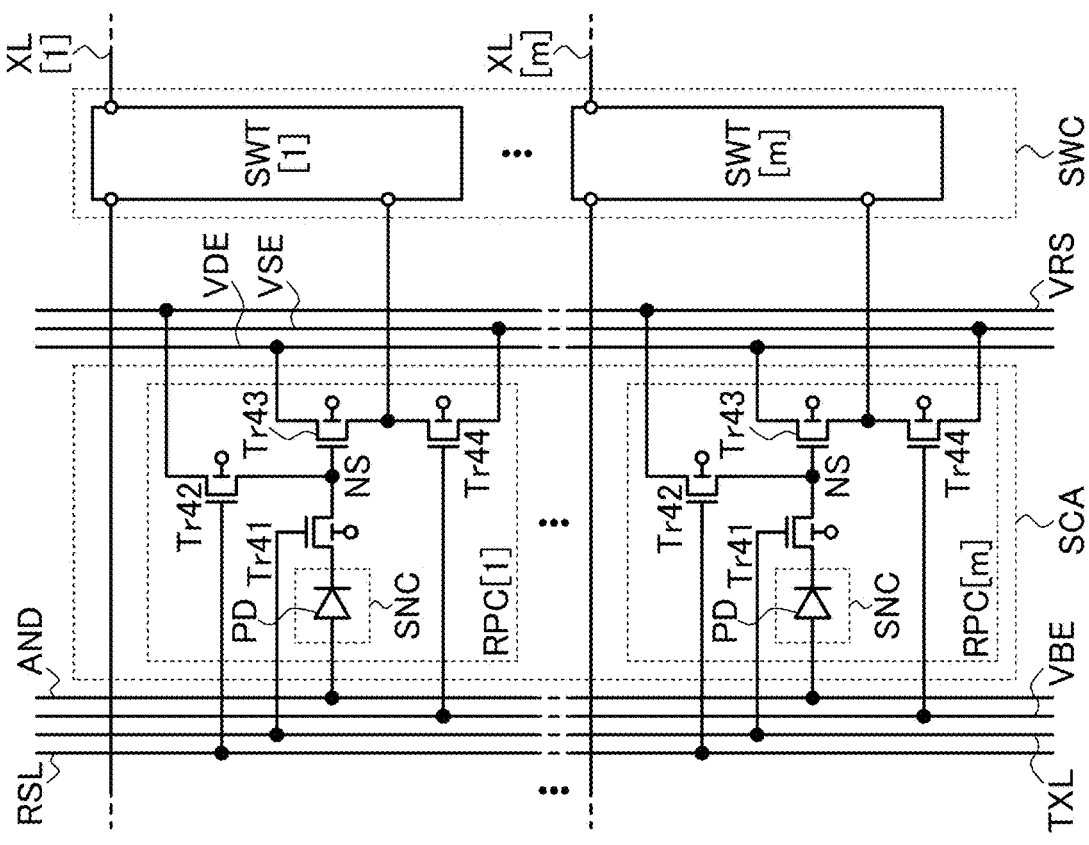

Note that the circuit configurations of the circuit RPC[1] to the circuit RPC[m] in FIG. 6 included in the semiconductor device of one embodiment of the present invention may be changed depending on the situation. For example, in each of the circuit RPC[1] to the circuit RPC[m] in FIG. 6, the node NS may be provided with a capacitor C8. In each of the circuit RPC[1] to the circuit RPC[m] illustrated in FIG. 7B, a first terminal of the capacitor C8 is electrically connected to the node NS, and a wiring CVL is electrically connected to a second terminal of the capacitor C8. By providing the capacitor C8 in each of the circuit RPC[1] to the circuit RPC[m], a potential input to the node NS can be held for a long time. Note that like FIG. 7A, FIG. 7B also illustrates the circuit SWC to show electrical connection with the circuit RPC[1] to the circuit RPC[m].

Note that the wiring CVL functions as a wiring that supplies a constant voltage, for example. The wiring CVL and any one of the wiring VDE, the wiring VSE, the wiring AND, the wiring VBE, and the wiring VRS may be one wiring.

Configuration Example of Circuit XLD

Next, a configuration example of the circuit XLD will be described.

The circuit XLD illustrated in FIG. 6 includes a circuit LGC, a circuit LS, and a circuit MUX, for example.

The circuit LGC is electrically connected to the circuit LS through a wiring LXS[1] to a wiring LXS[m]. The circuit LS is electrically connected to the circuit MUX through a wiring DXS[1] to a wiring DXS[m]. The wiring LXS[1] to the wiring LXS[m] and the wiring DXS[1] to the wiring DXS[m] may function as bus wirings that transmit digital signals.

The circuit MUX has a function of supplying a voltage based on the reference data or a voltage (digital signal) based on the second data to the second terminals of the circuit SWT[1] to the circuit SWT[m]. Specifically, for example, the circuit MUX can be a digital-to-analog converter circuit that outputs a potential based on a digital signal input to the wiring DXS[1] to a second terminal of the switch SW5a in the circuit SWT[1]. As another example, the circuit MUX can be a digital-to-analog converter circuit that outputs a potential based on a digital signal input to the wiring DXS[m] to the second terminal of the switch SW5a in the circuit SWT[m].

The circuit LS has, for example, a function of level-shifting an input potential to be a desired potential. Specifically, for example, the circuit LS level-shifts a potential input from the wiring LXS[1] to be a desired potential and outputs the level-shifted potential to the wiring DXS[1]. Therefore, the number of wirings LXS[1] can be the same as the number of wirings DXS[1]. Similarly, for example, the circuit LS level-shifts a potential input from the wiring LXS[m] to be a desired potential and outputs the level-shifted potential to the wiring DXS[m]. Therefore, the number of wirings LXS[m] can be the same as the number of wirings DXS[m].

The circuit LGC has, for example, a function of sequentially holding data DT input to the circuit LGC and outputting the data DT to the wiring LXS[1] to the wiring LXS[m] at intended timing concurrently in parallel or successively. The data DT here can be, for example, reference data or second data input to a wiring XCL[1] to a wiring XCL[m] through the circuit SWC. In other words, in order to supply a voltage based on reference data or a voltage based on second data to the wiring XCL[1] to the wiring XCL[m], the circuit LGC holds the reference data or the second data received from the outside of the circuit LGC and outputs the reference data or the second data to the wiring LXS[1] to the wiring LXS[m] at predetermined timing. Note that a specific configuration example of the circuit LGC will be described later.

In the case where it is not necessary to level-shift a voltage output from the circuit LGC, the circuit LS is not provided in the circuit XLD illustrated in FIG. 6, and the wiring LXS[1] to the wiring LXS[m] are electrically connected directly to the wiring DXS[1] to the wiring DXS[m], respectively.

Operation Example 1 of Arithmetic Circuit

Next, an operation example of the arithmetic circuit MAC1 will be described.

Figure 8:
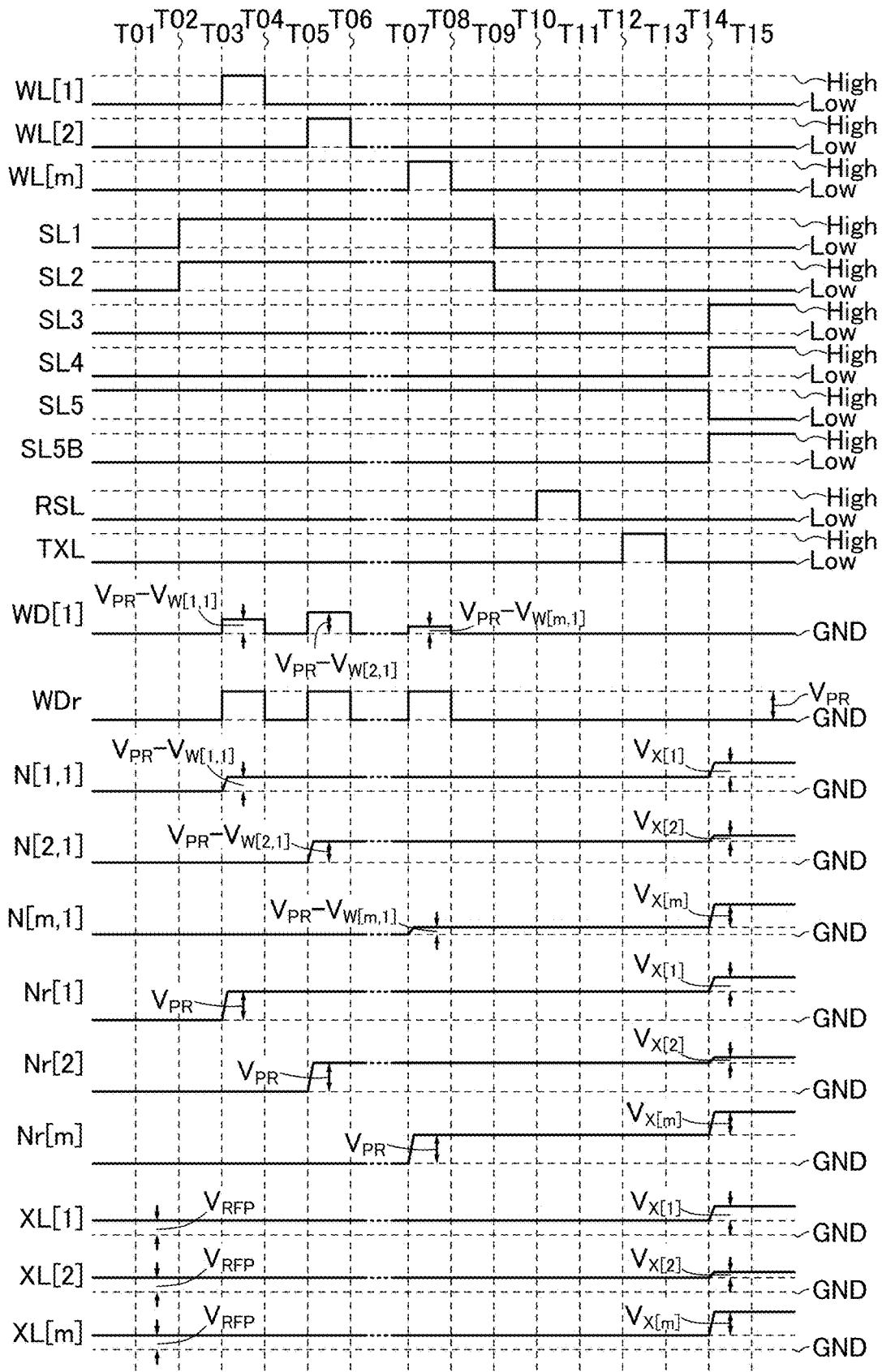
FIG. 8 is a timing chart showing an operation example of a semiconductor device.

FIG. 8 shows a timing chart of an operation example of the arithmetic circuit MAC1. The timing chart in FIG. 8 shows changes in the potentials of the wiring WL[1], the wiring WL[2], the wiring WL[m] (m is an integer greater than or equal to 4 in this operation example), the wiring SL1, the wiring SL2, the wiring SL3, the wiring SL4, the wiring SL5, the wiring SL5B, the wiring RSL, the wiring TXL, the wiring WD[1], the wiring WDr, the node N[1,1], the node N[2,1], the node N[m,1], the node Nr[1], the node Nr[2], the node Nr[m], the wiring XL[1], the wiring XL[2], and the wiring XL[m] from Time T01 to Time T15 and around the period. Note that in FIG. 8, a high-level potential is denoted by High and a low-level potential is denoted by Low.

<<From Time T01 to Time T02>>

From Time T01 to Time T02, a low-level potential is input to the wiring WL[1] to the wiring WL[m]. A low-level potential is input to the wiring SL1 to the wiring SL4, a high-level potential is input to the wiring SL5, and a low-level potential is input to the wiring SL5B. In addition, a ground potential (denoted by GND in FIG. 8) is input to the wiring WD[1] and the wiring WDr.

Since a high-level potential is input to the wiring SL5 and a low-level potential is input to the wiring SL5B, the switches SW5a included in the circuit SWT[1] to the circuit SWT[m] are turned on and the switches SW5b included in the circuit SWT[1] to the circuit SWT[m] are turned off in the circuit SWC. Thus, the wiring XL[1] to the wiring XL[m] are brought into electrical continuity with the circuit XLD but are not brought into electrical continuity with the circuit SCA. Consequently, a voltage from the circuit XLD is supplied to the wiring XL[1] to the wiring XL[m]. Here, for example, the voltage supplied from the circuit XLD to the wiring XL[1] to the wiring XL[m] is a reference potential (denoted by $V_{RFP}$ in FIG. 8).

Note that the potentials of the node N[1,1] to the node N[m,n] and the potentials of the node Nr[1] to the node Nr[m] are the ground potential (denoted by GND in FIG. 8) from Time T01 to Time T02.

From Time T02 to Time T03>>

From Time T02 to Time T03, a high-level potential is input to the wiring SL1 and the wiring SL2. Thus, in the circuit CMS, the switches SW1 included in the circuit CS1[1] to the circuit CS1[n] and the switches SW2 included in the circuit CS2[1] to the circuit CS2[n] are turned on.

Moreover, from Time T02 to Time T03, a low-level potential is continuously input to the wiring SL3 and the wiring SL4 before Time T02; a high-level potential is continuously input to the wiring SL5 before Time T02; and a low-level potential is continuously input to the wiring SL5 before Time T02.

<<From Time T03 to Time T04>>

From Time T03 to Time T04, a high-level potential is input to the wiring WL[1]. Thus, a high-level potential is applied to the gates of the transistors Tr11 included in the memory cell AM[1,1] to the memory cell AM[1,n] and the memory cell AMr[1] in the memory cell array CA, whereby the transistors Tr11 are turned on.

Moreover, from Time T03 to Time T04, a potential higher than the ground potential by $V_{PR}-V_{W[1,1]}$ is input to the wiring WD[1]. Since the transistor Tr11 in the memory cell AM[1,1] is in the on state at this time, electrical continuity is established between the wiring WD[1] and the node N[1,1], and the potential higher than the ground potential by $V_{PR}-V_{W[1,1]}$ is input to the first terminal of the capacitor C1 (the node N[1,1]) in the memory cell AM[1,1].

Note that in this operation example, $V_{PR}$ is a potential corresponding to reference data, and $V_{W[1,1]}$ is a potential corresponding to first data held in the memory cell AM[1,1].

Furthermore, from Time T03 to Time T04, a potential higher than the ground potential by $V_{PR}$ is input to the wiring WDr. Since the transistor Tr1 in the memory cell AMr[1] is in the on state at this time, electrical continuity is established between the wiring WDr and the node Nr[1], and the potential higher than the ground potential by $V_{PR}$ is input to the first terminal of the capacitor C1 (the node Nr[1]) in the memory cell AMr[1].

Since the transistors Tr11 in the memory cell AM[1,2] to the memory cell AM[1,n] are also in the on state from Time T03 to Time T04, a potential based on first data can be written to the node N[1,2] to the node N[1,n] at this timing by inputting the first data to the memory cell AM[1,2] to the memory cell AM[1,n] from the wiring WD[2] to the wiring WD[n]. Note that in this operation example, the description is made with a focus on the memory cell AM[1,1] to the memory cell AM[m,1] electrically connected to the wiring WD[1] and the memory cell AMr[1] to the memory cell AMr[m] electrically connected to the wiring WDr; hence, the description of the operation of the other memory cells is omitted.

From Time T03 to Time T04, a low-level potential is continuously input to the wiring WL[2] to the wiring WL[m] before Time T03. Thus, in the memory cell array CA, a low-level potential is applied to the gates of the transistors Tr11 included in the memory cell AM[2,1] to the memory cell AM[m,1] and the memory cell AMr[2] to the memory cell AMr[m] arranged in the second row to the m-th row; hence, these transistors Tr11 are in the off state. This prevents data input to the wiring WD[1] and the wiring WDr from being written to the node N[2,1] to the node N[m,1] and the node Nr[2] to the node Nr[m].

Here, the current flowing from the second terminal to the first terminal of the transistor Tr12 in each of the memory cell AM[1,1] and the memory cell AMr[1] is considered. When the current flowing from the wiring BL to the first terminal of the transistor Tr12 in the memory cell AM[1,1] through its second terminal is $I_{AM[1,1],1}$, $I_{AM[1,1],1}$, can be expressed by the following formula.

[Formula 1]

$$I_{AM[1,1],1} = k(V_{PR} - V_{W[1,1]} - V_{th})^2 \quad (1.1)$$

Note that k is a constant determined by the channel length, the channel width, the mobility, the capacitance of a gate insulating film, and the like of the transistor Tr12. Furthermore, $V_{th}$ is the threshold voltage of the transistor Tr12. Note that the constant k can be applied not only to the memory cell AM[1,1] but also to the other memory cells AM and the memory cells AMr. In addition, the threshold voltage of the transistor Tr12 of not only the memory cell AM[1,1] but also the other memory cells AM and the memory cells AMr is denoted as $V_{th}$.

When the current flowing from the wiring BLr to the first terminal of the transistor Tr12 in the memory cell AMr[1]

through its second terminal is $I_{AMr[1],2}$, $I_{AMr[1],2}$ can be expressed similarly by the following formula.

[Formula 2]

$$I_{AMr[1],2} = k(V_{PR} - V_{th})^2 \quad (1.2)$$

<<From Time T04 to Time T05>>

From Time T04 to Time T05, a low-level potential is input to the wiring WL[1]. Thus, a low-level potential is applied to the gates of the transistors Tr11 included in the memory cell AM[1,1] to the memory cell AM[1,n] and the memory cell AMr[1] in the memory cell array CA, whereby the transistors Tr11 are turned off.

By turning off the transistor Tr11 in the memory cell AM[1,1], the potential higher than the ground potential by $V_{PR} - V_{W[1,1]}$ is held at the first terminal of the capacitor C1 (the node N[1,1]) in the memory cell AM[1,1]. Furthermore, by turning off the transistor Tr11 in the memory cell AMr[1], the potential higher than the ground potential by $V_{PR}$ is held at the first terminal of the capacitor C1 (the node Nr[1]) in the memory cell AMr[1].

<<From Time T05 to Time T06>>

From Time T05 to Time T06, a high-level potential is input to the wiring WL[2]. Thus, a high-level potential is applied to the gates of the transistors Tr11 included in the memory cell AM[2,1] to the memory cell AM[2,n] and the memory cell AMr[2] in the memory cell array CA, whereby the transistors Tr11 are turned on.

Moreover, from Time T05 to Time T06, a potential higher than the ground potential by $V_{PR} - V_{W[2,1]}$ is input to the wiring WD[1]. Since the transistor Tr11 in the memory cell AM[2,1] is in the on state at this time, electrical continuity is established between the wiring WD[1] and the node N[2,1], and the potential higher than the ground potential by $V_{PR} - V_{W[2,1]}$ is input to the first terminal of the capacitor C1 (the node N[2,1]) in the memory cell AM[2,1].

Note that in this operation example, $V_{W[2,1]}$ is a potential corresponding to first data held in the memory cell AM[2,1].

Furthermore, from Time T05 to Time T06, a potential higher than the ground potential by $V_{PR}$ is input to the wiring WDr. Since the transistor Tr11 in the memory cell AMr[2] is in the on state at this time, electrical continuity is established between the wiring WDr and the node Nr[2], and the potential higher than the ground potential by $V_{PR}$ is input to the first terminal of the capacitor C1 (the node Nr[2]) in the memory cell AMr[2].

From Time T05 to Time T06, a low-level potential is continuously input to the wiring WL[1] and the wiring WL[3] to the wiring WL[m] before Time T05. Thus, in the memory cell array CA, a low-level potential is applied to the gates of the transistors Tr1 included in the memory cell AM[1,1], the memory cell AM[3,1] to the memory cell AM[m,1], the memory cell AMr[1], the memory cell AMr[3] to the memory cell AMr[m] arranged in the first row and the third row to the m-th row; hence, these transistors Tr11 are in the off state. This prevents data input to the wiring WD[1] and the wiring WDr from being written to the node N[1,1], the node N[3,1] to the node N[m,1], the node Nr[1], and the node Nr[3] to the node Nr[m].

Here, the current flowing from the second terminal to the first terminal of the transistor Tr12 in each of the memory cell AM[2,1] and the memory cell AMr[2] is considered. When the current flowing from the wiring BL to the first terminal of the transistor Tr12 in the memory cell AM[2,1] through its second terminal is $I_{AM[2,1],1}$, $I_{AM[2,1],1}$ can be expressed by the following formula.

[Formula 3]

$$I_{AM[2,1],1} = k(V_{PR} - V_{W[2,1]} - V_{th})^2 \quad (1.3)$$

When the current flowing from the wiring BLr to the first terminal of the transistor Tr12 in the memory cell AMr[2] through its second terminal is $I_{AMr[2],2}$, $I_{AMr[2],2}$ can be expressed similarly by the following formula.

[Formula 4]

$$I_{AMr[2],2} = k(V_{PR} - V_{th})^2 \quad (1.4)$$

<<From Time T06 to Time T07>>

From Time T06 to Time T07, a low-level potential is input to the wiring WL[2]. Thus, a low-level potential is applied to the gates of the transistors Tr11 included in the memory cell AM[2,1] to the memory cell AM[2,n] and the memory cell AMr[2] in the memory cell array CA, whereby the transistors Tr11 are turned off.

By turning off the transistor Tr11 in the memory cell AM[2,1], the potential higher than the ground potential by $V_{PR} - V_{W[2,1]}$ is held at the first terminal of the capacitor C1 (the node N[2,1]) in the memory cell AM[2,1]. Furthermore, by turning off the transistor Tr11 in the memory cell AMr[2], the potential higher than the ground potential by $V_{PR}$ is held at the first terminal of the capacitor C1 (the node Nr[2]) in the memory cell AMr[2].

From Time T06 to Time T07, a potential corresponding to the first data is held at the first terminal of the capacitor C1 in each of the memory cell AM[3,1] to the memory cell AM[m-1,n] as in the above-described operation from Time T03 to Time T05. Specifically, for example, a potential higher than the ground potential by $V_{PR} - V_{W[3,1]}$ is held at the first terminal of the capacitor C1 (the node N[3,1]) in the memory cell AM[3,1], and a potential higher than the ground potential by $V_{PR} - V_{W[m-1,1]}$ is held at the first terminal of the capacitor C1 (the node N[m-1,1]) in the memory cell AM[m-1,1].

Note that in this operation example, $V_{W[3,1]}$ is a potential corresponding to first data held in the memory cell AM[3,1], and $V_{W[m-1,1]}$ is a potential corresponding to first data held in the memory cell AM[m-1,1].

From Time T07 to Time T08>>

From Time T07 to Time T08, a high-level potential is input to the wiring WL[m]. Thus, a high-level potential is applied to the gates of the transistors Tr11 included in the memory cell AM[m,1] to the memory cell AM[m,n] and the memory cell AMr[m] in the memory cell array CA, whereby the transistors Tr11 are turned on.

Moreover, from Time T07 to Time T08, a potential higher than the ground potential by $V_{PR} - V_{W[m,1]}$ is input to the wiring WD[1]. Since the transistor Tr1 in the memory cell AM[m,1] is in the on state at this time, electrical continuity is established between the wiring WD[1] and the node N[m,1], and the potential higher than the ground potential by $V_{PR} - V_{W[m,1]}$ is input to the first terminal of the capacitor C1 (the node N[m,1]) in the memory cell AM[m,1].

Note that in this operation example, $V_{W[m,1]}$ is a potential corresponding to first data held in the memory cell AM[m, 1].

Furthermore, from Time T07 to Time T08, a potential higher than the ground potential by $V_{PR}$ is input to the wiring WDr. Since the transistor Tr11 in the memory cell AMr[m] is in the on state at this time, electrical continuity is established between the wiring WDr and the node Nr[m], and the potential higher than the ground potential by $V_{PR}$ is input to the first terminal of the capacitor C1 (the node Nr[m]) in the memory cell AMr[m].

From Time T07 to Time T08, a low-level potential is continuously input to the wiring WL[1] to the wiring WL[m−1] before Time T07. Thus, in the memory cell array CA, a low-level potential is applied to the gates of the transistors Tr11 included in the memory cell AM[1,1] to the memory cell AM[m−1,1] and the memory cell AMr[1] to the memory cell AMr[m−1] arranged in the first row to the (m−1)th row; hence, these transistors Tr11 are in the off state. This prevents data input to the wiring WD[1] and the wiring WDr from being written to the node N[1,1] to the node N[m−1,1] and the node Nr[1] to the node Nr[m−1].

Here, the current flowing from the second terminal to the first terminal of the transistor Tr12 in each of the memory cell AM[m,1] and the memory cell AMr[m] is considered. When the current flowing from the wiring BL to the first terminal of the transistor Tr12 in the memory cell AM[m,1] through its second terminal is $I_{AM[m,1]1}$, $I_{AM[m,1],1}$ can be expressed by the following formula.

[Formula 5]

$$I_{AMr[m,1],1} = k(V_{PR} - V_{W[m,1]} - V_{th}) \quad (1.5)$$

When the current flowing from the wiring BLr to the first terminal of the transistor Tr12 in the memory cell AMr[m] through its second terminal is $I_{AMr[m],2}$, $I_{AMr[m],2}$ can be expressed similarly by the following formula.

[Formula 6]

$$I_{AMr[m],2} = k(V_{PR} - V_{th})^2 \quad (1.6)$$

From Time T08 to Time T09>>

From Time T08 to Time T09, a low-level potential is input to the wiring WL[m]. Thus, a low-level potential is applied to the gates of the transistors Tr11 included in the memory cell AM[m,1] to the memory cell AM[m,n] and the memory cell AMr[m] in the memory cell array CA, whereby the transistors Tr11 are turned off.

By turning off the transistor Tr11 in the memory cell AM[m,1], the potential higher than the ground potential by $V_{PR} - V_{W[m,1]}$ is held at the first terminal of the capacitor C1 (the node N[m,1]) in the memory cell AM[m,1]. Furthermore, by turning off the transistor Tr11 in the memory cell AMr[m], the potential higher than the ground potential by $V_{PR}$ is held at the first terminal of the capacitor C1 (the node Nr[m]) in the memory cell AMr[m].

Here, the current flowing between the first terminal and the second terminal of the transistor Tr33 in the circuit CS1[1] included in the circuit CMS is considered. Note that the amount of the current is expressed as $I_1$ in this operation example.

From Time T08 to Time T09, the switch SW1 in the circuit CS1[1] is on, the switch SW3[1] is off, and the switch SW4[1] in the circuit IVTC is off, hence, the amount $I_1$ of current flowing between the first terminal and the second terminal of the transistor Tr33 in the circuit CS1[1] can be expressed by the following formula according to Kirchhoff's law.

[Formula 7]

$$I_1 = \sum_{i=1}^{m} I_{AM[i,1],1} \quad (1.7)$$

The transistor Tr33 in the circuit CS1[1] has a diode-connected structure, and the wiring VHE that supplies a high-level potential as a constant voltage is electrically connected to the first terminal of the transistor Tr33 in the circuit CS1[1]; thus, the potential of the gate (second terminal) of the transistor Tr33 in the circuit CS1[1] depends on the amount $I_1$ of current flowing between the first terminal and the second terminal of the transistor Tr33.

In addition, the current flowing between the first terminal and the second terminal of the transistor Tr34 in the circuit CS2[1] included in the circuit CMS is considered. Note that the amount of the current is expressed as $I_2$ in this operation example.

From Time T08 to Time T09, the switch SW2 in the circuit CS2[1] is on and the switch SW3[1] is off, hence, the amount of current flowing between the first terminal and the second terminal of the transistor Tr34 in the circuit CS2[1] is substantially equal to the amount of current flowing between the first terminal and the second terminal of the transistor Tr32[1].

Since the circuit CM has the configuration of the current mirror circuit, the amount of current flowing between the first terminal and the second terminal of the transistor Tr32[1] is substantially equal to the amount of current flowing between the first terminal and the second terminal of the transistor Tr31.

The amount of current flowing between the first terminal and the second terminal of the transistor Tr31 is the total amount of current flowing from the wiring BLr to the memory cell AMr[1] to the memory cell AMr[m]; therefore, the amount 12 of current flowing between the first terminal and the second terminal of the transistor Tr34 in the circuit CS2[1] can be expressed by the following formula.

[Formula 8]

$$I_2 = \sum_{i=1}^{m} I_{AMr[i],1} \quad (1.8)$$

The transistor Tr34 in the circuit CS2[1] has a diode-connected structure, and the wiring VLE that supplies a high-level potential as a constant voltage is electrically connected to the first terminal of the transistor Tr34 in the circuit CS2[1]; thus, the potential of the gate (second terminal) of the transistor Tr34 in the circuit CS2[1] depends on the amount $I_2$ of current flowing between the first terminal and the second terminal of the transistor Tr34.

<<From Time T09 to Time T10>>

From Time T09 to Time T10, a low-level potential is input to the wiring SL1, and a low-level potential is input to the wiring SL2. Thus, in the circuit CMS, the switches SW1 included in the circuit CS1[1] to the circuit CS1[n] are turned off and the switches SW2 included in the circuit CS2[1] to the circuit CS2[n] are turned off.

Accordingly, the potential of the gate of the transistor Tr33 in the circuit CS1[1] in the period from Time T09 to Time T10 is held by the first terminal of the capacitor C6, and the potential of the gate of the transistor Tr34 in the circuit CS2[1] in that period is held by the first terminal of the capacitor C7. Thus, the gate-source voltage of the transistor Tr33 in the circuit CS1[1] is held, whereby a current with the amount $I_1$ is set to constantly flow between the first terminal and the second terminal of the transistor Tr33. Similarly, the gate-source voltage of the transistor Tr34 in the circuit CS2[1] is held, whereby a current with the amount $I_2$ is set to constantly flow between the first terminal and the second terminal of the transistor Tr34. That is, the amount $I_1$ of current flowing from the circuit CS[1] is set in the circuit CS[1], and the amount $I_2$ of current flowing into the circuit CS[2] is set in the circuit CS[2].

<<From Time T10 to Time T11>>

From Time T10 to Time T11, a high-level potential is input to the wiring RSL. Thus, the transistors Tr42 in the circuit RPC[1] to the circuit RPC[m] included in the circuit SCA are turned on.

When the transistors Tr42 in the circuit RPC[1] to the circuit RPC[m] are turned on, the reset potential is supplied from the wiring VRS to the nodes NS in the circuit RPC[1] to the circuit RPC[m].

<<From Time T11 to Time T12>>

From Time T11 to Time T12, a low-level potential is input to the wiring RSL. Thus, the transistors Tr42 in the circuit RPC[1] to the circuit RPC[m] included in the circuit SCA are turned off.

When the transistors Tr42 in the circuit RPC[1] to the circuit RPC[m] are turned off, the supply of the reset potential from the wiring VRS to the nodes NS in the circuit RPC[1] to the circuit RPC[m] is stopped.

By the above-described operation from Time T10 to Time T12, the circuit RPC[1] to the circuit RPC[m] included in the circuit SCA are initialized.

At this time, a potential based on the potential of the node NS is output from the second terminal of the transistor Tr43 and the second terminal of the transistor Tr44 by the source follower circuit composed of the transistor Tr43 and the transistor Tr44. That is, a potential based on the reset potential is output from the second terminal of the transistor Tr43 and the second terminal of the transistor Tr44. For example, it is preferred that the potential output from the second terminal of the transistor Tr43 and the second terminal of the transistor Tr44 be substantially equal to $V_{RFP}$ supplied to the wiring XL[1] to the wiring XL[m] in the period from Time T01 to Time T09. Specifically, for example, by adjusting potentials supplied from the wiring VRS, the wiring VDE, the wiring VSE, the wiring VBE, and the like, a potential substantially equal to $V_{RFP}$ can be supplied to the wiring XL[1] to the wiring XL[m].

<<From Time T12 to Time T13>>

From Time T12 to Time T13, a high-level potential is input to the wiring TXL. Thus, the transistors Tr41 in the circuit RPC[1] to the circuit RPC[m] included in the circuit SCA are turned on.

When the transistor Tr41 in each of the circuit RPC[1] to the circuit RPC[m] is turned on, a current based on information obtained by sensing with the circuit SNC flows between the first terminal and the second terminal of the transistor Tr41. Accordingly, electric charge whose amount is based on the information is stored at the node NS of each of the circuit RPC[1] to the circuit RPC[m].

<<From Time T13 to Time T14>>

From Time T13 to Time T14, a low-level potential is input to the wiring TXL. Thus, the transistors Tr41 in the circuit RPC[1] to the circuit RPC[m] included in the circuit SCA are turned off.

When the transistor Tr41 in each of the circuit RPC[1] to the circuit RPC[m] is turned off, a current from the circuit SNC to the node NS in each of the circuit RPC[1] to the circuit RPC[m] is stopped.

By the above-described operation from Time T12 to Time T14, the node NS can hold the electric charge whose amount is based on information obtained by sensing with the circuit SNC.

At this time, a potential based on the potential of the node NS is output from the second terminal of the transistor Tr43 and the second terminal of the transistor Tr44 by the source follower circuit composed of the transistor Tr43 and the transistor Tr44. That is, a potential based on information obtained by sensing with the circuit SNC is output from the second terminal of the transistor Tr43 and the second terminal of the transistor Tr44.

<<From Time T14 to Time T15>>

From Time T14 to Time T15, a high-level potential is input to the wiring SL3, a high-level potential is input to the wiring SL4, a low-level potential is input to the wiring SL5, and a high-level potential is input to the wiring SL5B. Thus, in the circuit CMS, the switch SW3[1] to the switch SW3[n] are turned on. In the circuit IVTC, the switch SW4[1] to the switch SW4[n] are turned on. In the circuit SWC, the switches SW5a included in the circuit SWT[1] to the circuit SWT[m] are turned off, and the switches SW5b included in the circuit SWT[1] to the circuit SWT[m] are turned on.

When the switches SW5a included in the circuit SWT[1] to the circuit SWT[m] are turned off and the switches SW5b included in the circuit SWT[1] to the circuit SWT[m] are turned on, electrical continuity between the wiring XL[1] to the wiring XL[m] and the circuit XLD is broken, and electrical continuity is established between the wiring XL[1] to the wiring XL[m] and the circuit SCA. Hence, a potential based on information obtained by the circuit SNC included in each of the circuit RPC[1] to the circuit RPC[m] is input to a corresponding one of the wiring XL[1] to the wiring XL[m]. Here, for example, a potential input from the circuit RPC[1] to the wiring XL[1] is higher than the ground potential by $V_{RFP}+V_{X[1]}$, a potential input from the circuit RPC[2] to the wiring XL[2] is higher than the ground potential by $V_{RFP}+V_{X[2]}$, and a potential input from the circuit RPC[m] to the wiring XL[m] is higher than the ground potential by $V_{RFP}+V_{X[m]}$.

Note that in this operation example, the potentials $V_{X[1]}$ to $V_{X[m]}$ are potentials corresponding to the second data.

From Time T14 to Time T15, the potential of the wiring XL[1] increases from $V_{RFP}$, which is the reference potential, to $V_{RFP}+V_{X[1]}$; thus, $V_{RFP}+V_{X[1]}$ is applied to the second terminals of the capacitors C1 in the memory cell AM[1] and the memory cell AMr[1]. Since the node N[1,1] and the node Nr[1] are in an electrically floating state at this time, the potentials of the node N[1,1] and the node Nr[1] are changed by capacitive coupling of the capacitors C1.

In each of the memory cell AM[1] and the memory cell AMr[1], the amount of increase in the gate potential of the transistor Tr12 is a potential obtained by multiplying a change in the potential of the wiring XL[1] by a capacitive coupling coefficient determined by the memory cell configuration. The capacitive coupling coefficient is calculated using the capacitance of the capacitor C1, the gate capacitance of the transistor Tr12, the parasitic capacitance, and the like. To avoid complexity of description, this operation example is described on the assumption that the amount of increase in the potential of the wiring XL[1] is equal to the amount of increase in the gate potential of the transistor Tr12. This corresponds to the case where the capacitive coupling coefficient in the memory cell AM[1,1] and the memory cell AMr[1] is set to 1. In this operation example, the capacitive coupling coefficient in the memory cells included in the memory cell array CA other than the memory cell AM[1,1] and the memory cell AMr[1] is described as 1.

Since the capacitive coupling coefficient is set to 1, when the potential of the second terminal of the capacitor C1 in each of the memory cell AM[1,1] and the memory cell AMr[1] changes from $V_{RFP}$ to $V_{RFP}+V_{X[1]}$, the potentials of the node N[1,1] and the node Nr[1] each increase by $V_{X[1]}$.

Here, when the current flowing from the wiring BL to the first terminal of the transistor Tr12 in the memory cell AM[1,1] through its second terminal is $I_{AM[1,1],3}$, $I_{AM[1,1],3}$ can be expressed by the following formula.

[Formula 9]

$$I_{AM[1,1],3} = k(V_{PR} - V_{W[1,1]} + V_{X[1]} - V_{th})^2 \qquad (1.9)$$

Similarly, when the current flowing from the wiring BLr to the first terminal of the transistor Tr12 in the memory cell AMr[1] through its second terminal is $I_{AMr[1],4}$, $I_{AMr[1],4}$ can be expressed by the following formula.

[Formula 10]

$$I_{AMr[1],4} = k(V_{PR} + V_{X[1]} - V_{th})^2 \qquad (1.10)$$

Since the capacitive coupling coefficient is set to 1 also in the memory cell AM[2,1] and the memory cell AMr[2], when the potential of the second terminal of the capacitor C1 in each of these memory cells changes from $V_{RFP}$ to $V_{RFP} - V_{X[2]}$, the potentials of the node N[2,1] and the node Nr[2] each increase by $V_{X[2]}$.

Here, when the current flowing from the wiring BL to the first terminal of the transistor Tr12 in the memory cell AM[2,1] through its second terminal is $I_{AM[2,1],3}$, $I_{AM[2,1],3}$ can be expressed by the following formula.

[Formula 11]

$$I_{AM[2,1],3} = k(V_{PR} - V_{W[2,1]} + V_{X[2]} - V_{th})^2 \qquad (1.11)$$

Similarly, when the current flowing from the wiring BLr to the first terminal of the transistor Tr12 in the memory cell AMr[2] through its second terminal is $I_{AMr[2],4}$, $I_{AMr[2],4}$ can be expressed by the following formula.

[Formula 12]

$$I_{AMr[2],4} = k(V_{PR} + V_{X[2]} - V_{th})^2 \qquad (1.12)$$

Since the capacitive coupling coefficient is set to 1 also in the memory cell AM[m,1] and the memory cell AMr[m], when the potential of the second terminal of the capacitor C1 in each of these memory cells changes from $V_{RFP}$ to $V_{RFP} + V_{X[m]}$, the potentials of the node N[m,1] and the node Nr[m] each increase by $V_{X[m]}$.

Here, when the current flowing from the wiring BL to the first terminal of the transistor Tr12 in the memory cell AM[m,1] through its second terminal is $I_{AM[m,1],3}$, $I_{AM[m,1],3}$ can be expressed by the following formula.

[Formula 13]

$$I_{AM[m,1],3} = k_{PR} - V_{W[m,1]} + V_{X[m]} - V_{th} \qquad (1.13)$$

Similarly, when the current flowing from the wiring BLr to the first terminal of the transistor Tr12 in the memory cell AMr[2] through its second terminal is $I_{AMr[m],4}$, $I_{AMr[m],4}$ can be expressed by the following formula.

[Formula 14]

$$I_{AMr[m],4} = k(V_{PR} + V_{X[m]} - V_{th})^2 \qquad (1.14)$$

When the total amount of current flowing from the wiring BL[1] to the memory cell AM[1,1] to the memory cell AM[m,1] from Time T14 to Time T15 is denoted as $I_3$, the current amount $I_3$ can be expressed by the following formula.

[Formula 15]

$$I_3 = \sum_{i=1}^{m} I_{AM[i,1],3} \qquad (1.15)$$

Since the circuit CM has the configuration of the current mirror circuit, the amount of current flowing between the first terminal and the second terminal of the transistor Tr32[1] included in the circuit CM is substantially equal to the amount of current flowing between the first terminal and the second terminal of the transistor Tr31. The amount of current flowing between the first terminal and the second terminal of the transistor Tr31 corresponds to the total amount of current flowing from the wiring BLr to the memory cell AMr[1] to the memory cell AMr[m]. When the amount of current flowing between the first terminal and the second terminal of the transistor Tr32[1] included in the circuit CM from Time T14 to Time T15 is denoted as $I_4$, the current amount $I_4$ can be expressed by the following formula.

[Formula 16]

$$I_4 = \sum_{i=1}^{m} I_{AMr[i,1],4} \qquad (1.16)$$

Since the switch SW3[1] to the switch SW3[n] and the switch SW4[1] to the switch SW4[n] are turned on from Time T14 to Time T15, a current from the circuit CMS and the memory cell array CA flows to the circuit IVTC through the wiring BL. Specifically, for example, the current amount $I_1$ flows from the circuit CS1[1], the current amount $I_2$ flows into the circuit CS2[1], and the current amount 14 flows between the source and the drain of the transistor Tr32[1] in the circuit CM. The total amount of current flowing to the memory cell AM[1,1] to the memory cell AM[m,1] is $I_3$. Here, when the amount of current flowing from the wiring BL[1] to the wiring OL[1] is denoted as $I_S[1]$, the current amount $I_S[1]$ can be explained by the following formula according to Kirchhoff's law.

[Formula 17]

$$I_S[1] = I_1 - I_2 - I_3 + I_4 \qquad (1.17)$$

$$= 2k \sum_{i=1}^{m} V_{W[i,1]} V_{X[i]}$$

From Formula (1.17), the amount $I_S[1]$ of current input from the wiring BL[1] to the circuit IVTC is proportional to the product-sum of the potentials $V_{W[1,1]}$ to $V_{W[m,1]}$ based on the first data and the potentials $V_{X[1]}$ to $V_{X[m]}$ based on the second data. That is, the product-sum of the first data and the second data can be expressed as the current amount $I_S[1]$.

Operation Example 2 of Arithmetic Circuit

The operation performed by the semiconductor device of one embodiment of the present invention is not limited to the operation shown in the timing chart of FIG. 8. The operating of the semiconductor device of one embodiment of the present invention can be changed depending on the situation.

In the operation shown in the timing chart of FIG. 8, the circuit XLD supplies $V_{RFP}$ to the wiring XL[1] to the wiring XL[m] before Time T01 until Time T14; alternatively, the circuit RPC[1] to the circuit RPC[m] included in the circuit SNC may supply potentials to the wiring XL[1] to the wiring XL[m], respectively, before Time T01 until Time T14.

Figure 9:
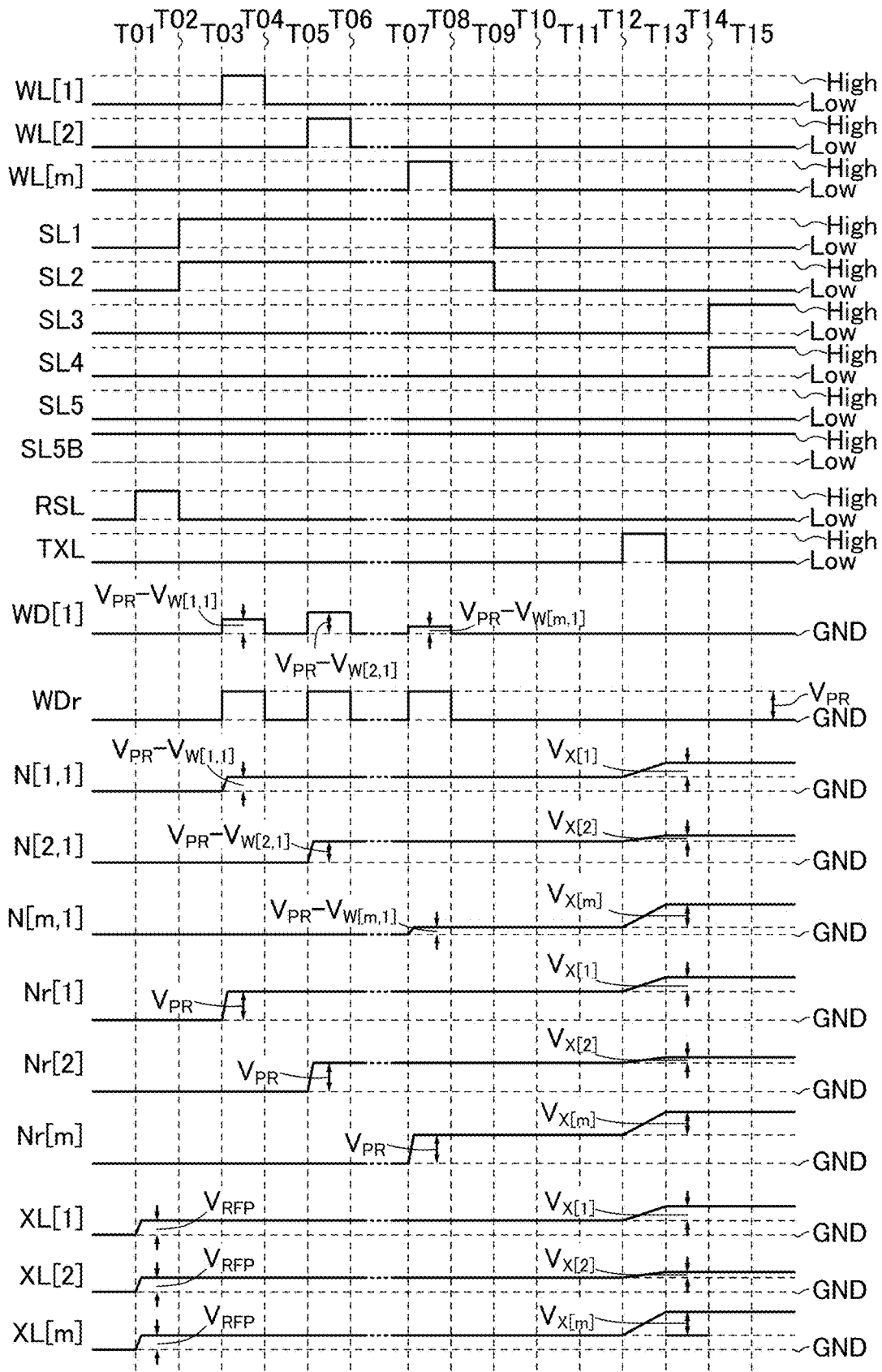
FIG. 9 is a timing chart showing an operation example of a semiconductor device.

Specifically, for example, the semiconductor device of one embodiment of the present invention may perform an operation in a timing chart shown in FIG. 9. The operation in the timing chart of FIG. 9 differs from the operation in the timing chart of FIG. 8 in that a low-level potential is always input to the wiring SL5 and a high-level potential is always input to the wiring SL5B. Thus, there is always no continuity between the wiring XL[1] to the wiring XL[m] and the circuit XLD, and there is always continuity between the wiring XL[1] to the wiring XL[m] and the circuit SCA.

In the operation in the timing chart of FIG. 9, from Time T01 to Time T02, a high-level potential is input to the wiring RSL. That is, the reset potential is supplied to the nodes NS in the circuit RPC[1] to the circuit RPC[m] included in the circuit SCA. From Time T02 to Time T12, a low-level potential is input to the wiring RSL, and the reset potential is held at the nodes NS in the circuit RPC[1] to the circuit RPC[m]. Moreover, from Time T01 to Time T12, a potential based on the reset potential of the node NS is output from the second terminal of the transistor Tr43 and the second terminal of the transistor Tr44 by the source follower circuit composed of the transistor Tr43 and the transistor Tr44. Since the supply of a high-level potential to the wiring SL5B sets the switch SW5*b* in the on state, the potential based on the reset potential of the node NS is output to the wiring XL[1] to the wiring XL[m]. Note that in the timing chart of FIG. 9, the potential output to the wiring XL[1] to the wiring XL[m] is VRP, which is the same as the potential that the circuit XLD outputs in the timing chart of FIG. 8.

In the operation in the timing chart of FIG. 9, from Time T12 to Time T13, a high-level potential is input to the wiring TXL. That is, the amount of electric charge based on information obtained by sensing with the circuit SNC is stored at the nodes NS in the circuit RPC[1] to the circuit RPC[m] included in the circuit SCA. After Time T13, a low-level potential is input to the wiring TXL, and the amount of electric charge is held at the nodes NS in the circuit RPC[1] to the circuit RPC[m]. Furthermore, after Time T13, a potential based on the amount of electric charge held at each node NS is output from the second terminal of the transistor Tr43 and the second terminal of the transistor Tr44 by the source follower circuit composed of the transistor Tr43 and the transistor Tr44. Since the supply of a high-level potential to the wiring SL5B sets the switch SW5*b* in the on state, the potential based on the amount of electric charge held at each node NS is output to the wiring XL[1] to the wiring XL[m]. Note that in the timing chart of FIG. 9, the potential output to the wiring XL[1] is $V_{RFP}+V_{X[1]}$, the potential output to the wiring XL[2] is $V_{RFP}+V_{X[2]}$, and the potential output to the wiring XL[m] is $V_{RFP}+V_{X[m]}$.

Operation Example 3 of Arithmetic Circuit

Figure 10:
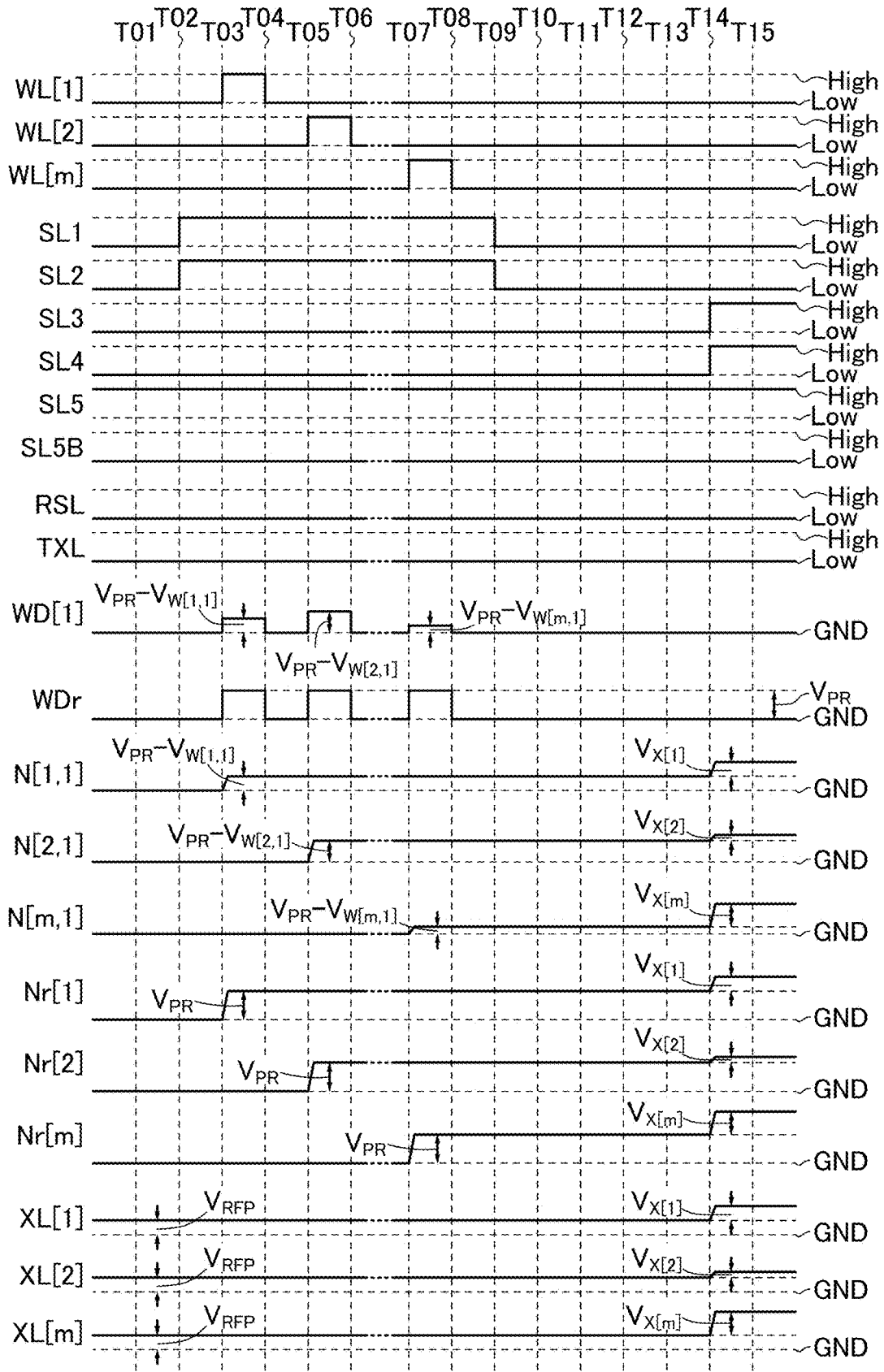
FIG. 10 is a timing chart showing an operation example of a semiconductor device.

The operation performed by the semiconductor device of one embodiment of the present invention may be an operation in a timing chart shown in FIG. 10 instead of the operations in the timing charts shown in FIG. 8 and FIG. 9.

The operation in the timing chart of FIG. 10 differs from the operation in the timing chart of FIG. 8 in that a high-level potential is always input to the wiring SL5 and a low-level potential is always input to the wiring SL5B. Thus, there is always continuity between the wiring XL[1] to the wiring XL[m] and the circuit XLD, and there is always no continuity between the wiring XL[1] to the wiring XL[m] and the circuit SCA.

Since there is always no continuity between the wiring XL[1] to the wiring XL[m] and the circuit SCA, the circuit RPC[1] to the circuit RPC[m] included in the circuit SCA do not operate in the operation in the timing chart of FIG. 10. Accordingly, in the operation in the timing chart of FIG. 10, a low-level potential is always input to the wiring RSL and the wiring TXL, for example.

The operation in the timing chart of FIG. 10 differs from the operations in the timing charts of FIG. 8 and FIG. 9 in that the circuit XLD always supplies potentials to the wiring XL[1] to the wiring XL[m].

In the operation in the timing chart of FIG. 10, before Time T01 until Time T14, the potential $V_{RFP}$ is supplied from the circuit XLD to the wiring XL[1] to the wiring XL[m] through the circuit SWC.

In the operation in the timing chart of FIG. 10, after Time T14, $V_{RFP}+V_{X[1]}$ is supplied to the wiring XL[1] from the circuit XLD through the circuit SWC. Similarly, $V_{RFP}+V_{X[2]}$ is supplied to the wiring XL[2] from the circuit XLD through the circuit SWC. Similarly, $V_{RFP}+V_{X[m]}$ is supplied from the circuit XLD through the circuit SWC.

As described above, the semiconductor device of one embodiment of the present invention can select the circuit XLD or the circuit SWC as a circuit that outputs a potential to be input to the wiring XL[1] to the wiring XL[m] through the circuit SWC. In other words, the semiconductor device of one embodiment of the present invention can select whether information obtained by the sensor or the like provided in the circuit SWC is used as second data or whether internal data held in a memory device or the like provided outside the arithmetic circuit, for example, is used as second data and perform an arithmetic operation.

When one of Operation example 2 of arithmetic circuit and Operation example 3 of arithmetic circuit described above is performed and then, the other of Operation example 2 of arithmetic circuit and Operation example 3 of arithmetic circuit is performed without updating the first data written to the memory cell array CA (without performing the operation from Time T03 to Time T08), the results output from the wiring NIL[1] to the wiring NIL[n] in these operation examples can be compared to each other. For example, when the circuit SNC including the photodiode PD is used as the circuit SNC as illustrated in FIG. 7A, an image captured by the photodiode PD in Operation example 2 of arithmetic circuit can be compared to an image corresponding to internal data input from the circuit XLD in Operation example 3 of arithmetic circuit. In particular, in the case where image recognition or the like is performed using a hierarchical neural network described in Embodiment 4, for example, relative comparison of the results output in Operation example 2 of arithmetic circuit and Operation example 3 of arithmetic circuit enables optimization of settings of the voltages of the wirings (e.g., voltages supplied from the wiring VBE, the wiring VDE, the wiring VSE, and the wiring VRS and voltages input to the wiring XL[1] to the wiring XL[n]) in Operation example 2 of arithmetic circuit. Moreover, a signal amplitude (the amount of current, voltage, or the like) can be suppressed, and inference can be performed in a short time.

In Operation example 2 of arithmetic circuit described above, when the potentials of the nodes NS in the circuit RPC[1] to the circuit RPC[m] are the reset potential, the potential supplied from the second terminal of the transistor Tr43 and the second terminal of the transistor Tr44 is $V_{RFP}$.

Given that the circuit SNC including the photodiode PD is used as the circuit SNC as illustrated in FIG. 7A, when light with a constant intensity is incident on the photodiode PD, a change in the potential supplied from the second terminal of the transistor Tr43 and the second terminal of the transistor Tr44 is roughly proportional to time (from Time T12 to Time T13). In other words, the potentials of the wiring XL[1] to the wiring XL[m] in the arithmetic circuit MAC1 are changed proportionally to time from the potential $V_{RFP}$ by data obtained by the photodiode PD. Accordingly, a difference in the output increases proportionally to the time for obtaining data by the photodiode PD (from Time T12 to Time T13). Consequently, when a relative difference that occurs between output signals is large enough to determine the inference, the inference can be terminated at that moment; hence, the inference can sometimes be performed in a short time.

Although this embodiment describes the case where the transistors included in the arithmetic circuit MAC1 are OS transistors or Si transistors, one embodiment of the present invention is not limited thereto. As the transistors included in the arithmetic circuit MAC1, it is possible to use, for example, a transistor containing Ge or the like in an active layer; a transistor containing a compound semiconductor such as ZnSe, CdS, GaAs, InP, GaN, or SiGe in an active layer; a transistor containing a carbon nanotube in an active layer; and a transistor containing an organic semiconductor in an active layer.

Note that this embodiment can be implemented in appropriate combination with the other embodiments described in this specification.

Embodiment 2

In this embodiment, an arithmetic circuit having a different configuration from that of the arithmetic circuit MAC1 described in Embodiment 1 will be described.

Configuration Example 2 of Arithmetic Circuit

Figure 11:
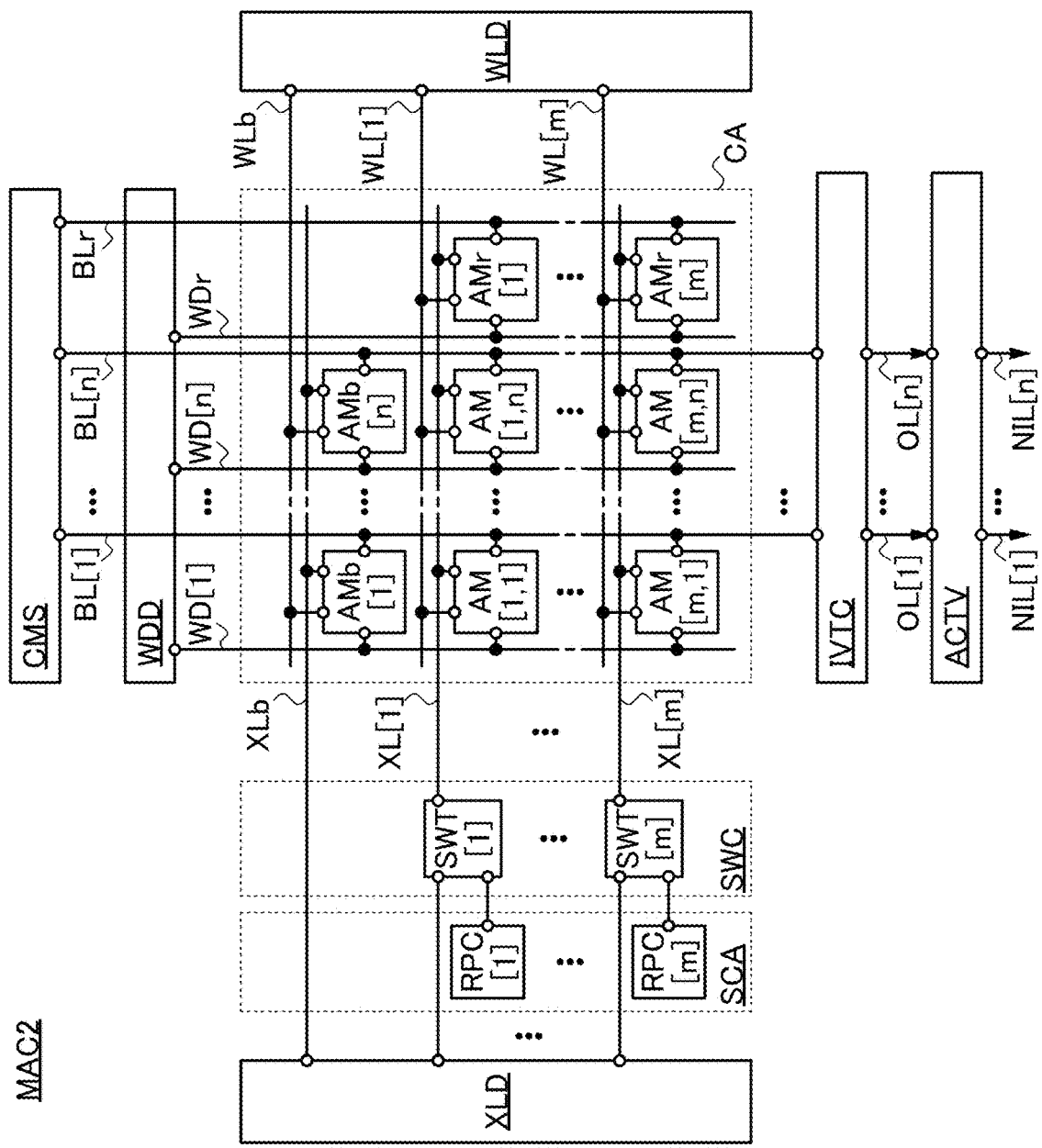
FIG. 11 is a block diagram illustrating a configuration example of a semiconductor device.

An arithmetic circuit MAC2 illustrated in FIG. 11 differs from the arithmetic circuit MAC1 in that the memory cell array CA includes a memory cell AMb[1] to a memory cell AMb[n].

The memory cell AMb[1] is electrically connected to the wiring BL[1], the wiring WD[1], a wiring XLb, and a wiring WLb. The memory cell AMb[n] is electrically connected to the wiring BL[n], the wiring WD[n], the wiring XLb, and the wiring WLb.

Figure 12:
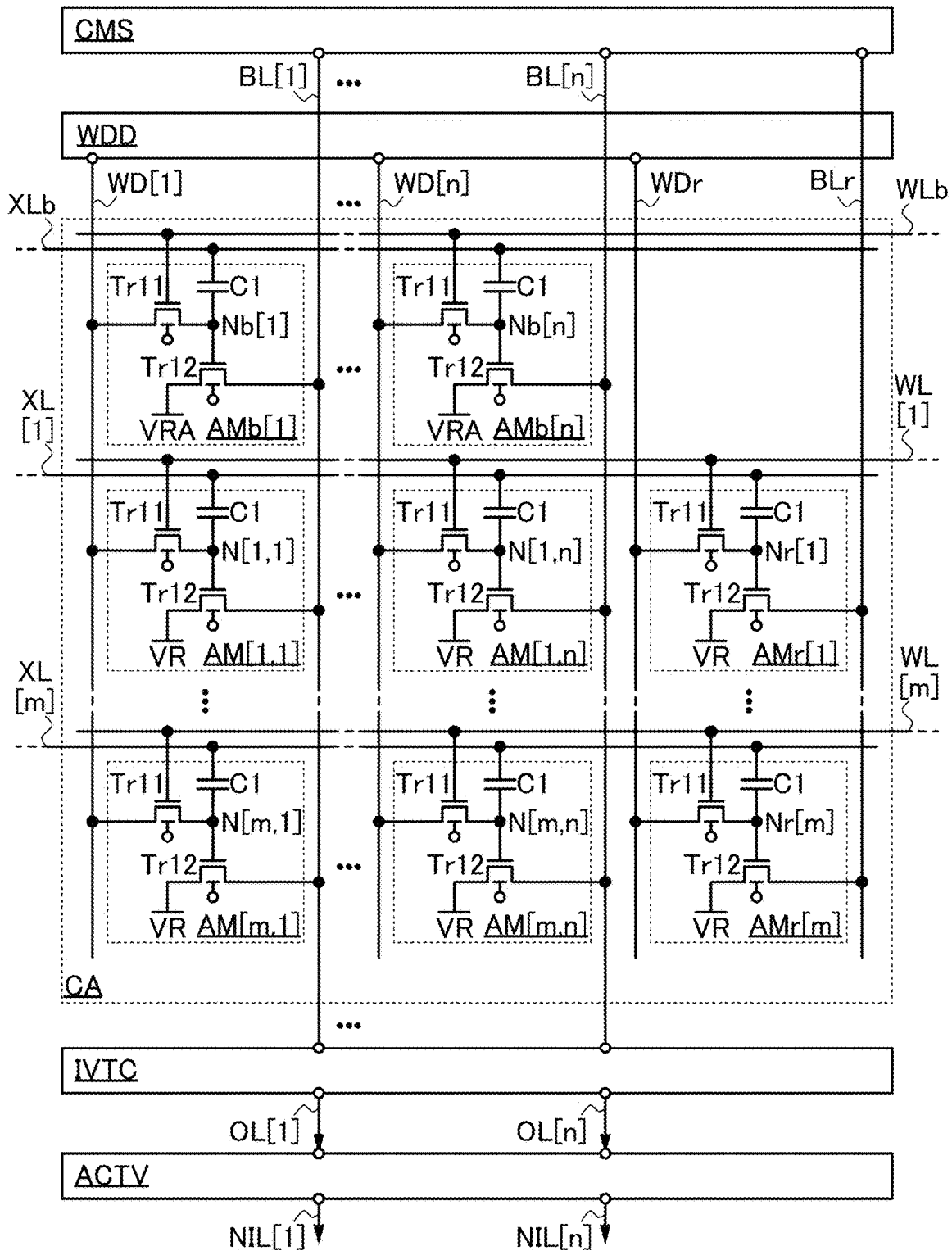
FIG. 12 is a circuit diagram illustrating a configuration example of a circuit included in a semiconductor device.

FIG. 12 illustrates a specific configuration example of the memory cell AMb[1] to the memory cell AMb[n]. Note that FIG. 12 also illustrates the memory cell AM[1,1] to the memory cell AM[m,n], the memory cell AMr[1] to the memory cell AMr[m], the circuit WDD, the circuit CMS, the circuit IVTC, and the circuit ACTV to show electrical connection with the memory cell AMb[1] to the memory cell AMb[n].

As illustrated in FIG. 12, the memory cell AMb[1] to the memory cell AMb[n] can have substantially the same configuration as the memory cell AM[1,1] to the memory cell AM[m,n] and the memory cell AMr[1] to the memory cell AMr[m]. Thus, in the arithmetic circuit MAC2 in FIG. 12, the memory cell AMb[1] to the memory cell AMb[n] each include the transistor Tr11, the transistor Tr12, and the capacitor C1.

In each of the memory cell AMb[1] to the memory cell AMb[n], the first terminal of the transistor Tr12 is electrically connected to a wiring VRA.

In the memory cell AMb[1], an electrical connection portion of the first terminal of the transistor Tr11, the gate of the transistor Tr12, and the first terminal of the capacitor C1 is a node Nb[1]. In the memory cell AMb[n], an electrical connection portion of the first terminal of the transistor Tr11, the gate of the transistor Tr12, and the first terminal of the capacitor C1 is a node Nb[n].

The wiring WLb functions as a wiring that supplies a selection signal to the memory cell AMb[1] to the memory cell AMb[n] from the circuit WLD when data is written to the memory cell AMb[1] to the memory cell AMb[n]. The wiring XLb functions as a wiring that applies a constant potential to the second terminal of the capacitor C1 in the memory cell AMb[1] to the memory cell AMb[n], for example. The constant potential is preferably a ground potential, a low-level potential, a high-level potential, or the like. Alternatively, the wiring XLb may function as a wiring for supplying a given potential from the circuit XLD.

The wirings VRA in the memory cell AMb[1] to the memory cell AMb[n] can be set to a low-level potential, the ground potential, or a potential lower than the ground potential, like the wirings VR in the memory cell AM[1,1] to the memory cell AM[m,n] and the memory cell AMr[1] to the memory cell AMr[m]. Alternatively, depending on the case, the wirings VRA in the memory cell AMb[1] to the memory cell AMb[n] may serve as wirings that supply a high-level potential. For example, in the case where a positive current is intended to flow from the memory cell AMb[1] to the wiring BL[1], the wiring VRA in the memory cell AMb[1] serves as a wiring that supplies a high-level potential.

In an operation example of the arithmetic circuit MAC2 in FIG. 12, before Time T01 until Time T14 in the timing chart of FIG. 8, for example, the ground potential, a low-level potential, or a potential supplied from the wiring VR is held at the node Nb[1] to the node Nb[n] so that the transistors Tr12 in the memory cell AMb[1] to the memory cell AMb[n] are turned off. Then, from Time T14 to Time T15 in the timing chart of FIG. 8, potentials $V_{BIAS}[1]$ to $V_{BIAS}[n]$ are held at the node Nb[1] to the node Nb[n] so that given current amounts $I_{BIAS}[1]$ to $I_{BIAS}[n]$ flow between the first terminals and the second terminals of the respective transistors Tr12 in the memory cell AMb[1] to the memory cell AMb[n]. For example, $I_{BIAS}[1]$ here is expressed by the following formula.

[Formula 18]

$$I_{BIAS}[1] = k(V_{PR} - V_{BIAS}[1] - V_{th})^2 \qquad (2.1)$$

Therefore, the amount $I_S[1]$ of current flowing from the wiring BL[1] to the wiring OL[1] through the circuit IVTC, for example, from Time T14 to Time T15 is shown as the following formula.

[Formula 19]

$$I_S[1] = I_1 - I_2 - I_3 + I_4 - I_{BIAS}[1] \qquad (2.2)$$

$$= 2k \sum_{i=1}^{m} V_{W[i,1]} V_{X[i]} - I_{BIAS}[1]$$

Formula (2.2) corresponds to an arithmetic operation for further supplying a given bias to the result of a product-sum operation. Although the details will be described in Embodiment 4, an arithmetic operation for further supplying a given bias to the result of a product-sum operation is used for an arithmetic operation of a hierarchical neural network. Therefore, it can be said that the arithmetic circuit MAC2 is suitable for performing an arithmetic operation of a hierarchical neural network.

Configuration Example 3 of Arithmetic Circuit

Next, the description will be made on a configuration example of an arithmetic circuit that is a semiconductor device of one embodiment of the present invention and differs from the arithmetic circuit MAC1 in FIG. 1 and the arithmetic circuit MAC2 in FIG. 11.

Figure 13:
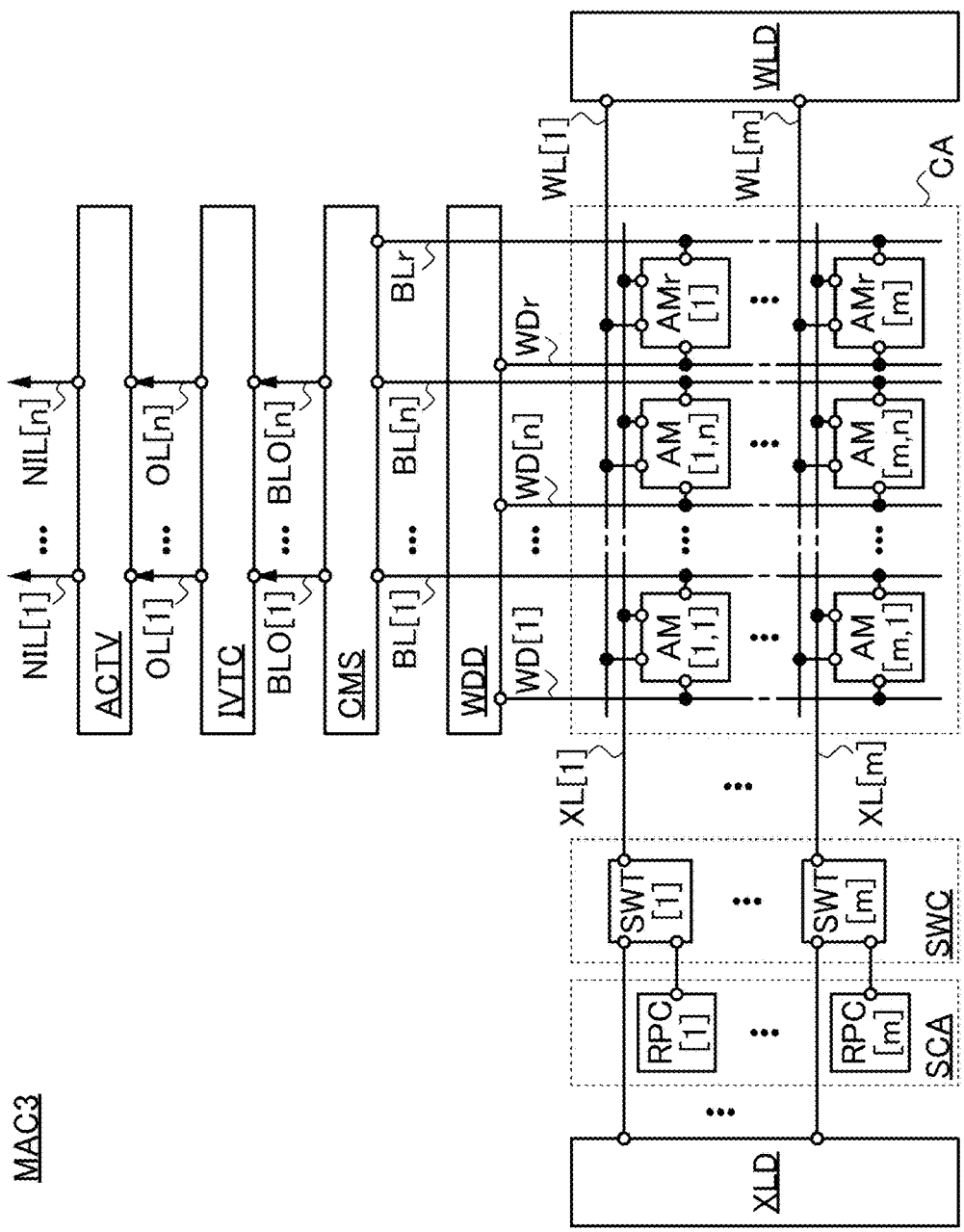
FIG. 13 is a block diagram illustrating a configuration example of a semiconductor device.

A arithmetic circuit MAC3 illustrated in FIG. 13 is different from the arithmetic circuit MAC1 and the arithmetic circuit MAC2 in that a current related to the result of a product-sum operation flows from the circuit CMS to the circuit IVTC and the circuit ACTV.

In the arithmetic circuit MAC3 in FIG. 13, the circuit CMS is electrically connected to the circuit IVTC through a wiring BLO[1] to a wiring BLO[n]. Note that the description of the arithmetic circuit MAC1 in FIG. 1 is referred to for the other circuit configuration.

Figure 14:
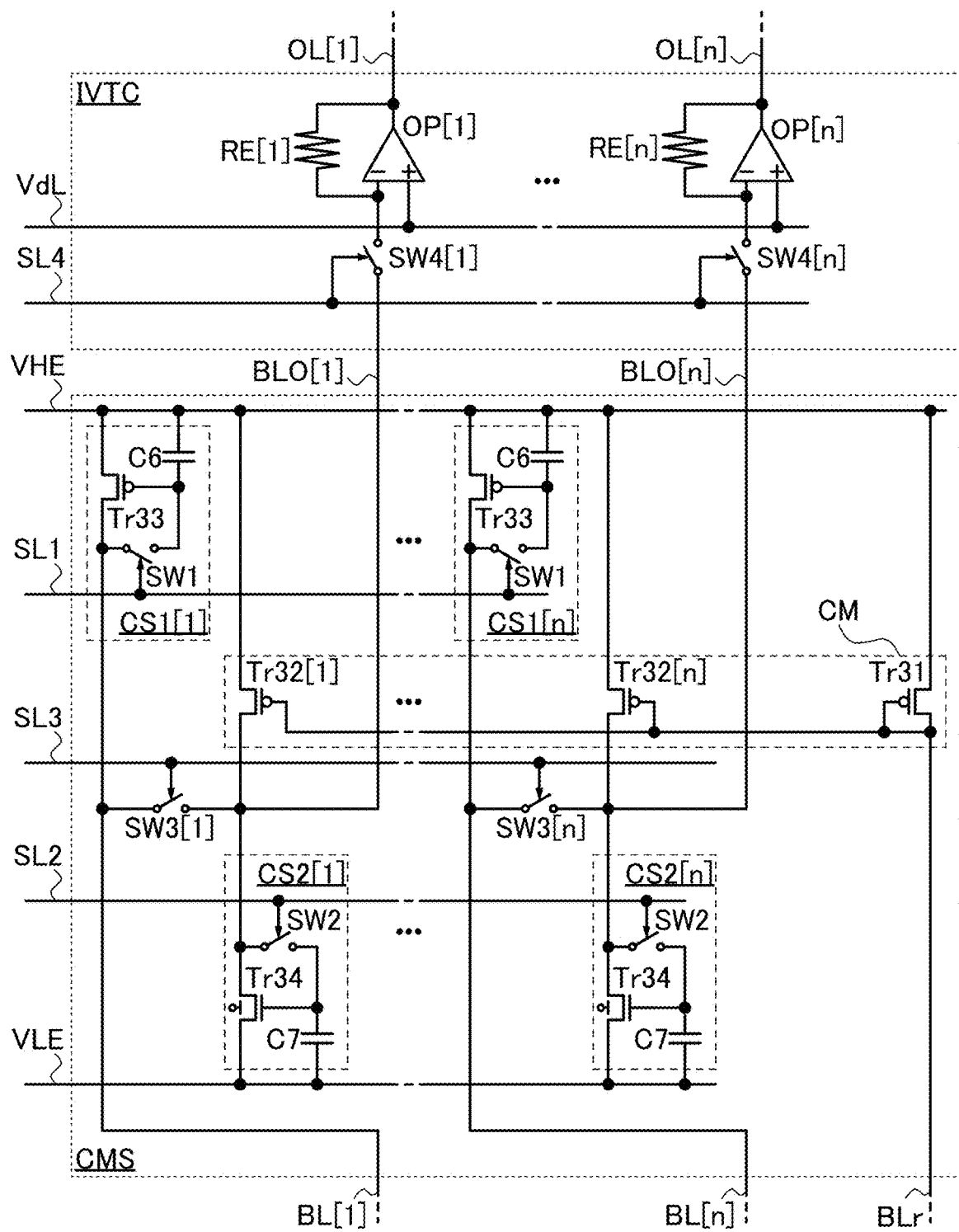
FIG. 14 is a circuit diagram illustrating a configuration example of a circuit included in a semiconductor device.

FIG. 14 illustrates a specific configuration example of the circuit CMS. Note that FIG. 14 also illustrates the circuit IVTC to show electrical connection with the circuit CMS.

The circuit CMS illustrated in FIG. 14 is configured such that in the circuit CMS in FIG. 3 described in Embodiment 1, the wiring BLO[1] is electrically connected to the second terminal of the switch SW3[1], the second terminal of the transistor Tr32[1], and the second terminal of the transistor Tr34 in the circuit CS2[1] and the wiring BLO[n] is electrically connected to the second terminal of the switch SW3[n], the second terminal of the transistor Tr32[n], and the second terminal of the transistor Tr34 in the circuit CS2[n].

The circuit IVTC illustrated in FIG. 14 has substantially the same configuration as the circuit IVTC in FIG. 5A, and is configured such that the wiring BL[1] to the wiring BL[n] illustrated in FIG. 5A are respectively replaced with the wiring BLO[1] to the wiring BLO[n]. The wiring BLO[1] to the wiring BLO[n] are electrically connected to the respective first terminals of the switch SW4[1] to the switch SW4 included in the circuit IVTC in FIG. 5A.

By using the circuit CMS and the circuit IVTC that have the configurations illustrated in FIG. 14, the arithmetic circuit MAC3 in FIG. 13 can perform an operation similar to that of the arithmetic circuit MAC1 described in Embodiment 1.

The configurations of the circuit CMS and the circuit IVTC included in the arithmetic circuit MAC3 in FIG. 13 are not limited to the configurations illustrated in FIG. 14. For example, the circuit CMS and the circuit IVTC included in the arithmetic circuit MAC3 in FIG. 13 may employ a configuration example illustrated in FIG. 15.

Figure 15:
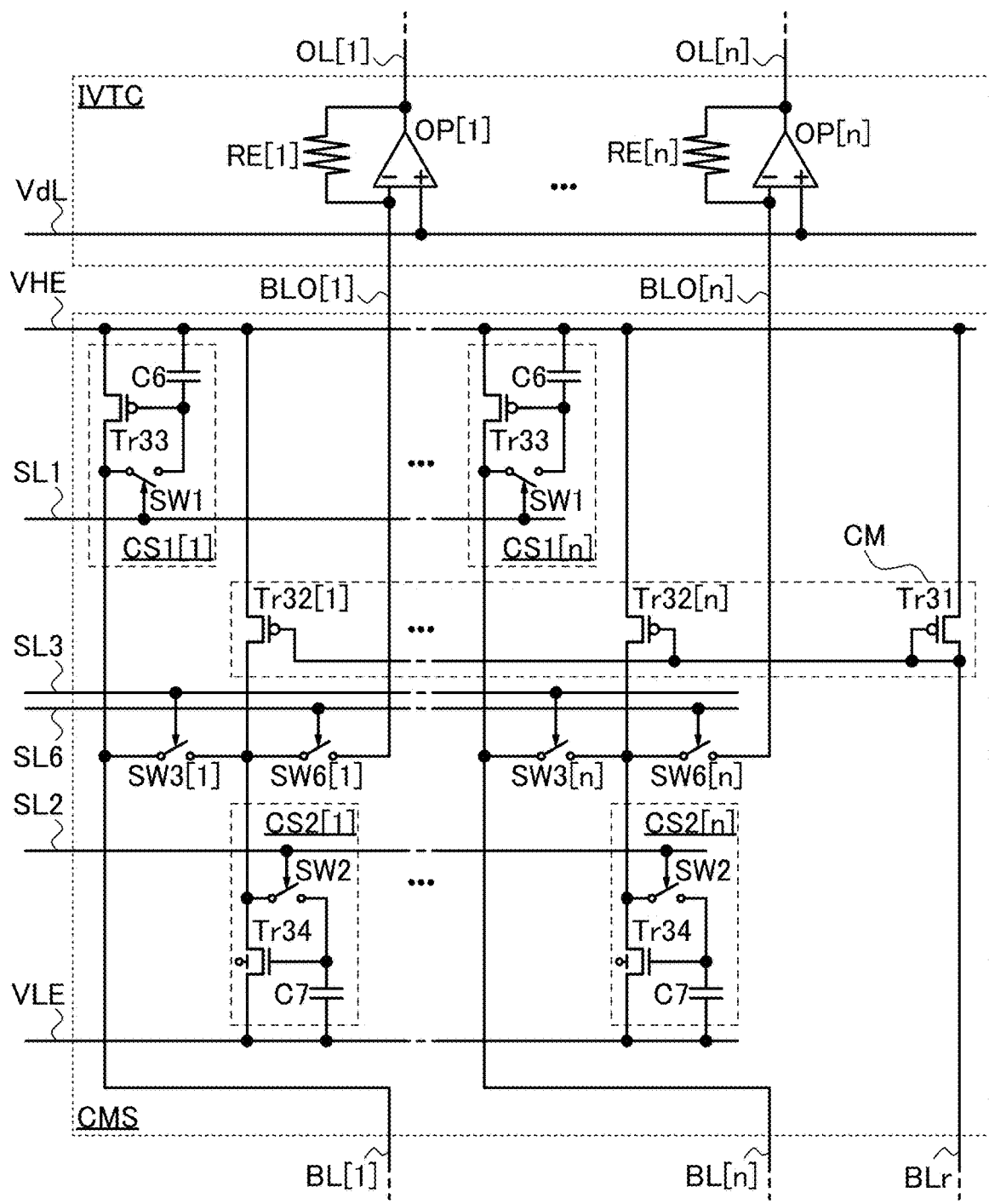
FIG. 15 is a circuit diagram illustrating a configuration example of a circuit included in a semiconductor device.

The circuit CMS illustrated in FIG. 15 is configured such that a switch SW6[1] to a switch SW6[n] are provided in the circuit CMS in FIG. 3 described in Embodiment 1. Specifically, a first terminal of the switch SW6[1] is electrically connected to the second terminal of the switch SW3[1], the second terminal of the transistor Tr32[1], and the second terminal of the transistor Tr34. A second terminal of the switch SW6[1] is electrically connected to the wiring BLO[1]. Control terminals of the switch SW6[1] to the switch SW6[n] are electrically connected to a wiring SL6.

As the switch SW6[1] to the switch SW6[n], for example, switches usable as the switch SW1, the switch SW2, the switch SW3[1] to the switch SW3[n], and the like can be used. In this specification and the like, like the switch SW1, the switch SW2, and the switch SW3[1] to the switch SW3[n], each of the switch SW6[1] to the switch SW6[n] is turned on when a high-level potential is input to the control terminal and is turned off when a low-level potential is input to the control terminal.

The circuit IVTC illustrated in FIG. 15 is configured such that the switch SW4[1] to the switch SW4[n] are not provided in the circuit IVTC in FIG. 5A. Thus, the wiring BLO[1] to the wiring BLO[n] are electrically connected to the inverting input terminals of the operational amplifier OP[1] to the operational amplifier OP[n] included in the circuit IVTC in FIG. 15.

In other words, the circuit CMS in FIG. 15 includes the switch SW6[1] to the switch SW6[n] instead of the switch SW4[1] to the switch SW4[n] included in the circuit IVTC in FIG. 14.

In the case where the operations in the timing charts of FIG. 8 to FIG. 10 described in Embodiment 1 are performed using the arithmetic circuit MAC3 including the circuit CMS and the circuit IVTC in FIG. 15, the switch SW3[1] to the switch SW3[n] and the switch SW6[1] to the switch SW6[n] are turned on or off at the same timing; hence, the wiring SL3 and the wiring SL6 may be combined into one wiring.

Note that this embodiment can be implemented in appropriate combination with the other embodiments described in this specification.

Embodiment 3

This embodiment will describe a configuration example of the circuit LGC provided in the circuit XLD of the arithmetic circuit MAC1 to the arithmetic circuit MAC3 described in Embodiment 1 and Embodiment 2.

Figure 16A:
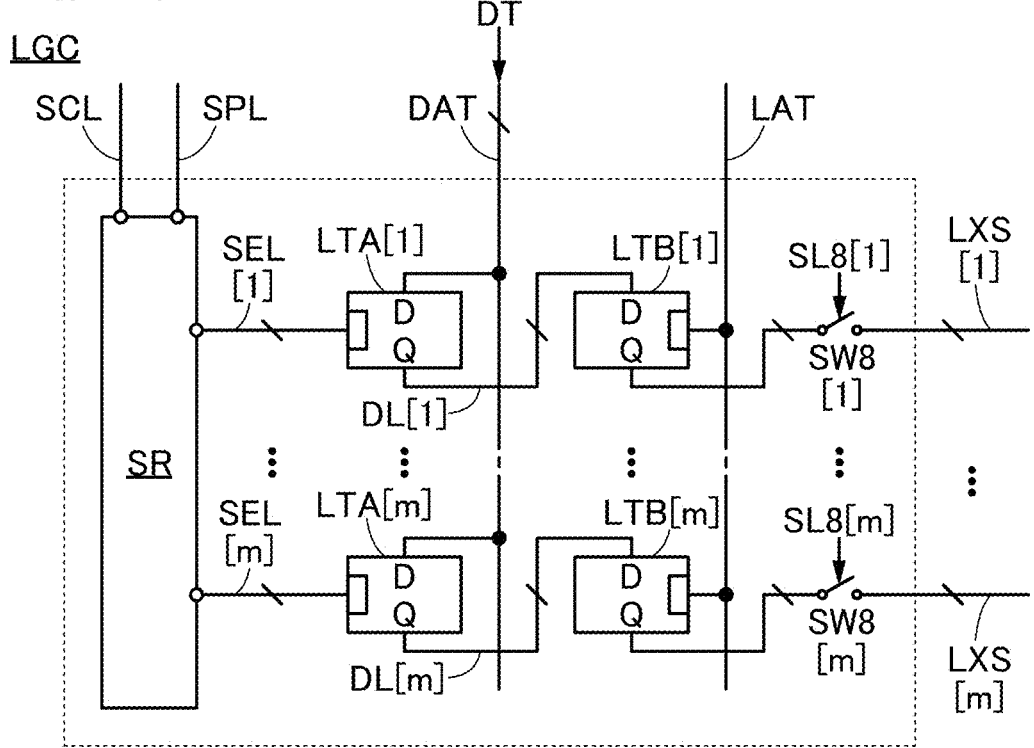
FIG. 16A and FIG. 16B are block diagrams illustrating configuration examples of a circuit included in a semiconductor device.

FIG. 16A illustrates a specific configuration example of the circuit LGC. When one of the wiring LXS[1] to the wiring LXS[m] is a bus wiring that transmits a digital signal, the data DT (reference data and the second data) input to the circuit LGC is preferably input as a digital signal. By treating the data DT as a digital signal, the circuit LGC can be configured as a logic circuit.

The circuit LGC illustrated in FIG. 16A includes a shift register SR, a latch circuit LTA[1] to a latch circuit LTA[m], a latch circuit LTB[1] to a latch circuit LTB[m], and a switch SW8[1] to a switch SW8[m].

The shift register SR is electrically connected to a wiring SPL, a wiring SCL, and a wiring SEL[1] to a wiring SEL[m].

The wiring SEL[1] to the wiring SEL[m] are electrically connected to control terminals (sometimes referred to as clock input terminals, enable signal input terminals, or the like) of the latch circuit LTA[1] to the latch circuit LTA[m], and a wiring LAT is electrically connected to control terminals of the latch circuit LTB[1] to the latch circuit LTB[m]. Input terminals D of the latch circuit LTA[1] to the latch circuit LTA[m] are electrically connected to a wiring DAT, and output terminals Q of the latch circuit LTA[1] to the latch circuit LTA[m] are electrically connected to a wiring DL[1] to a wiring DL[m]. Input terminals D of the latch circuit LTB[1] to the latch circuit LTB[m] are electrically connected to the wiring DL[1] to the wiring DL[m], and output terminals Q of the latch circuit LTB[1] to the latch circuit LTB[m] are electrically connected to first terminals of the switch SW8[1] to the switch SW8[m]. Second terminals of the switch SW8[1] to the switch SW8[m] are electrically connected to the wiring LXS[1] to the wiring LXS[m], and control terminals of the switch SW8[1] to the switch SW8[m] are electrically connected to a wiring SL8[1] to a wiring SL8[m].

As the switch SW8[1] to the switch SW8[m], it is possible to use, for example, switches usable as the switch SW1, the switch SW2, and the switch SW3[1] to the switch SW3[n]. In this specification and the like, like the switch SW1, the switch SW2, and the switch SW3[1] to the switch SW3[n], each of the switch SW8[1] to the switch SW8[m] is turned on when a high-level potential is input to the control terminal, and is turned off when a low-level potential is input to the control terminal.

The wiring SL8[1] to the wiring SL8[m] function as wirings for switching between the conducting state and the non-conducting state of the switch SW8[1] to the switch SW8[m], for example.

The wiring SPL functions as a wiring that transmits a start pulse signal to the shift register SR, for example.

The wiring SCL functions as a wiring that transmits a clock signal to the shift register SR, for example.

The wiring DAT functions as a wiring that transmits the data DT to the circuit LGC, for example.

The wiring SEL[1] to the wiring SEL[m], the wiring DL[1] to the wiring DL[m], and the wiring DAT can each be a wiring that transmits a digital signal. Therefore, the wiring SEL[1] to the wiring SEL[m], the wiring DL[1] to the wiring DL[m], and the wiring DAT can be bus wirings. The wiring SL8[1] to the wiring SL8[m] can also be bus wirings.

The shift register SR has a function of sequentially outputting a high-level potential to the wiring SEL[1] to the wiring SEL[m] in accordance with changes in potentials input to the wiring SPL and the wiring SCL, for example. Note that the shift register SR cannot output a high-level potential to two or more of the wiring SEL[1] to the wiring SEL[m]; when any one of the wiring SEL[1] to the wiring SEL[m] outputs a high-level potential, the other wirings of the wiring SEL[1] to the wiring SEL[m] output a low-level potential.

For example, when a potential rises from a low-level potential to a high-level potential with a clock signal from the wiring SCL while a high-level potential is being input as a start pulse signal to the wiring SPL, the wiring SEL[1] outputs a high-level potential. Subsequently, when a potential rises from a low-level potential to a high-level potential again with the clock signal from the wiring SCL while a low-level potential is being input to the wiring SPL, the wiring SEL[1] outputs a low-level potential and the wiring SEL[2] outputs a high-level potential. After that, when the third potential rising occurs with the clock signal from the wiring SCL while a low-level potential is being input to the wiring SPL, for example, the wiring SEL[1] and the wiring SEL[2] output a low-level potential and the wiring SEL[3] outputs a high-level potential.

As described above, the shift register SR can sequentially output a high-level potential to one of the wiring SEL[1] to the wiring SEL[m] and a low-level potential to the other wirings every time the potential rising due to the clock signal from the wiring SCL occurs.

The latch circuit LTA[1] to the latch circuit LTA[m] and the latch circuit LTB[1] to the latch circuit LTB[m] are each brought into an enable state when a high-level potential is input to their control terminals, for example, to have a function of retaining data that has been input to the input terminal D and outputting the data to the output terminal Q.

Note that the latch circuit LTA[1] to the latch circuit LTA[m] and the latch circuit LTB[1] to the latch circuit LTB[m] are each brought into a disable state when a low-level potential is input to their control terminals, for example, so that the data that has been input to the input terminal D is not retained and the data is not output to the output terminal Q.

Here, an operation example of the circuit LGC is described.

Figure 17A:
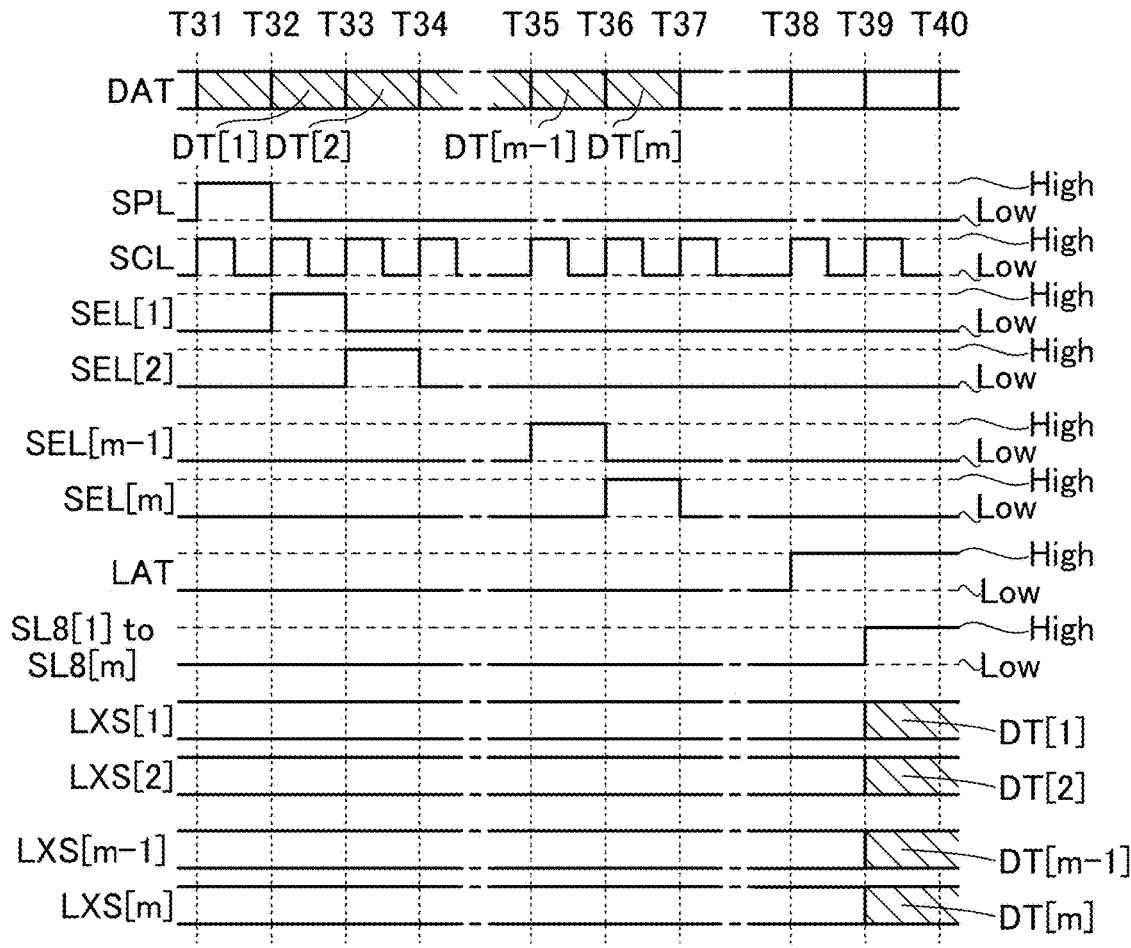
FIG. 17A and FIG. 17B are timing charts showing operation examples of a circuit included in a semiconductor device.

FIG. 17A is a timing chart showing an operation example of the circuit LGC. The timing chart shows changes in the potentials of the wiring SPL, the wiring SCL, the wiring SEL[1], the wiring SEL[2], the wiring SEL[m−1], the wiring SEL[m], the wiring SL8[1] to the wiring SL8[m], and the wiring LAT, and also shows data that have been input to the wiring DAT, the wiring LXS[1], the wiring LXS[2], the wiring LXS[m−1], and the wiring LXS[m]. Note that as for the wiring SPL, the wiring SCL, the wiring SEL[1], the wiring SEL[2], the wiring SEL[m], the wiring SEL[m−1], the wiring SL8[1] to the wiring SL8[m], and the wiring LAT, a high-level potential is shown as High and a low-level potential is shown as Low.

The timing chart in FIG. 17A shows an operation example in which the circuit LGC concurrently outputs the data DT to the wiring LXS[1] to the wiring LXS[m] in the period from Time T31 to Time T40 and the vicinity thereof. This operation example is conducted in the period from Time T14 to Time T15 in the timing chart of FIG. 8, for example.

Before Time T31, a low-level potential is input to the wiring LAT, and a low-level potential is input to the wiring SL8[1] to the wiring SL8[m]. In addition, the shift register SR outputs a low-level potential to the wiring SEL[1] to the wiring SEL[m].

From Time T31 to Time T32, a high-level potential is input as a start pulse signal to the wiring SPL. A pulse voltage is input as a clock signal to the wiring SCL. When the rising of the pulse voltage as the clock signal is input, the shift register SR obtains a high-level potential as the start pulse signal to be input to the wiring SPL.

From Time T32 to Time T33, data DT[1] is input to the wiring DAT. The pulse voltage is input as the clock signal to the wiring SCL for the second time. When the second rising of the pulse voltage as the clock signal is input, the shift register SR outputs a high-level potential to the wiring SEL[1].

At this time, the latch circuit LTA[1] is brought into an enable state and thus retains the data DT[1] that has been input to the input terminal D and outputs the data DT[1] to the output terminal Q. The data DT[1] is input to the input terminal D of the latch circuit LTB[1]. Since a low-level potential has been input to the control terminal of the latch circuit LTB[1] at this time, the latch circuit LTB[1] does not retain the data DT[1] input to the input terminal D of the latch circuit LTB[1] and does not output the data DT[1] input to the output terminal Q of the latch circuit LTB[1].

From Time T33 to Time T34, data DT[2] is input to the wiring DAT. The pulse voltage is input as the clock signal to the wiring SCL for the third time. When the third rising of the pulse voltage as the clock signal is input, the shift register SR outputs a low-level potential to the wiring SEL[1] and a high-level potential to the wiring SEL[2].

At this time, the latch circuit LTA[1] is brought into a disable state and thus does not retain the data DT[2] input to the input terminal D of the latch circuit LTA[1]. The latch circuit LTA[1] has retained the data DT[1] continuously since before Time T33, and outputs the data DT[1] from the output terminal Q.

In addition, the latch circuit LTA[2] is brought into an enable state and thus retains the data DT[2] that has been input to the input terminal D and outputs the data DT[2] to the output terminal Q. The data DT[2] is input to the input terminal D of the latch circuit LTB[2]. Since a low-level potential has been input to the control terminal of the latch circuit LTB[2] at this time, the latch circuit LTB[2] does not retain the data DT[2] input to the input terminal D of the latch circuit LTB[2] and does not output the data DT[2] input to the output terminal Q of the latch circuit LTB[2].

From Time T34 to Time T35, data DT[3] to DT[m−2] are sequentially input to the wiring DAT, and the shift register SR sequentially inputs a high-level potential to the wiring SEL[3] to the wiring SEL[m−2]. Thus, the data DT[3] to the data DT[m−2] are respectively retained in the latch LTA[3] to the latch circuit LTA[m−2]. Moreover, the data DT[3] to the data DT[m−2] are output from the output terminals Q of the latch LTA[3] to the latch circuit LTA[m−2], respectively.

From Time T35 to Time T36, data DT[m−1] is input to the wiring DAT. The pulse voltage is input as the clock signal to the wiring SCL for the m-th time. When the m-th rising of the pulse voltage as the clock signal is input, the shift register SR outputs a low-level potential to the wiring SEL[m−2] and a high-level potential to the wiring SEL[m−1].

At this time, the latch circuit LTA[m−2] is brought into a disable state and thus does not retain the data DT[m−1] input to the input terminal D of the latch circuit LTA[m−2]. The latch circuit LTA[m−2] has retained the data DT[m−2] continuously since before Time T35, and outputs the data DT[m−2] from the output terminal Q.

In addition, the latch circuit LTA[m−1] is brought into an enable state and thus retains the data DT[m−1] that has been input to the input terminal D and outputs the data DT[m−1] to the output terminal Q. The data DT[m−1] is input to the input terminal D of the latch circuit LTB[m−1]. Since a low-level potential has been input to the control terminal of the latch circuit LTB[m−1] at this time, the latch circuit LTB[m−1] does not retain the data DT[m−1] input to the input terminal D of the latch circuit LTB[m−1] and does not output the data DT[m−1] input to the output terminal Q of the latch circuit LTB[m−1].

From Time T36 to Time T37, data DT[m] is input to the wiring DAT. The pulse voltage is input as the clock signal to the wiring SCL for the (m+1)th time. When the (m+1)th rising of the pulse voltage as the clock signal is input, the shift register SR outputs a low-level potential to the wiring SEL[m−1] and a high-level potential to the wiring SEL[m].

At this time, the latch circuit LTA[m−1] is brought into a disable state and thus does not retain the data DT[m] input to the input terminal D of the latch circuit LTA[m−1]. The latch circuit LTA[m−1] has retained the data DT[m−1] continuously since before Time T36, and outputs the data DT[m−1] from the output terminal Q.

In addition, the latch circuit LTA[m] is brought into an enable state and thus retains the data DT[m] that has been input to the input terminal D and outputs the data DT[m] to the output terminal Q. The data DT[m] is input to the input terminal D of the latch circuit LTB[m]. Since a low-level potential has been input to the control terminal of the latch circuit LTB[m] at this time, the latch circuit LTB[m] does not retain the data DT[m] input to the input terminal D of the latch circuit LTB[m] and does not output the data DT[m] input to the output terminal Q of the latch circuit LTB[m].

From Time T38 to Time T39, a high-level potential is input to the wiring LAT. Thus, a high-level potential is input to the control terminals of the latch circuit LTB[1] to the latch circuit LTB[m], so that the latch circuit LTB[1] to the latch circuit LTB[m] are each brought into an enable state. Accordingly, the latch circuit LTB[1] to the latch circuit LTB[m] retain the data DT[1] to the data DT[m] that have been input to their input terminals D, and output the data DT[1] to the data DT[m] from their output terminals Q.

From Time T39 to Time T40, a high-level potential is input to the wiring SL8[1] to the wiring SL8[m]. Thus, the switch SW8[1] to the switch SW8[m] are turned on, so that electrical continuity is established between the output terminals Q of the latch circuit LTB[1] to the latch circuit LTB[m] and the wiring LXS[1] to the wiring LXS[m]. Accordingly, the circuit LGC can concurrently output the data DT[1] to the data DT[m] from the wiring LXS[1] to the wiring LXS[m].

By the operation in the timing chart shown in FIG. 17A, the circuit LGC can output the data DT[1] to the data DT[m], which are sequentially input to the circuit LGC, to the wiring LXS[1] to the wiring LXS[m] concurrently in parallel.

Figure 17B:
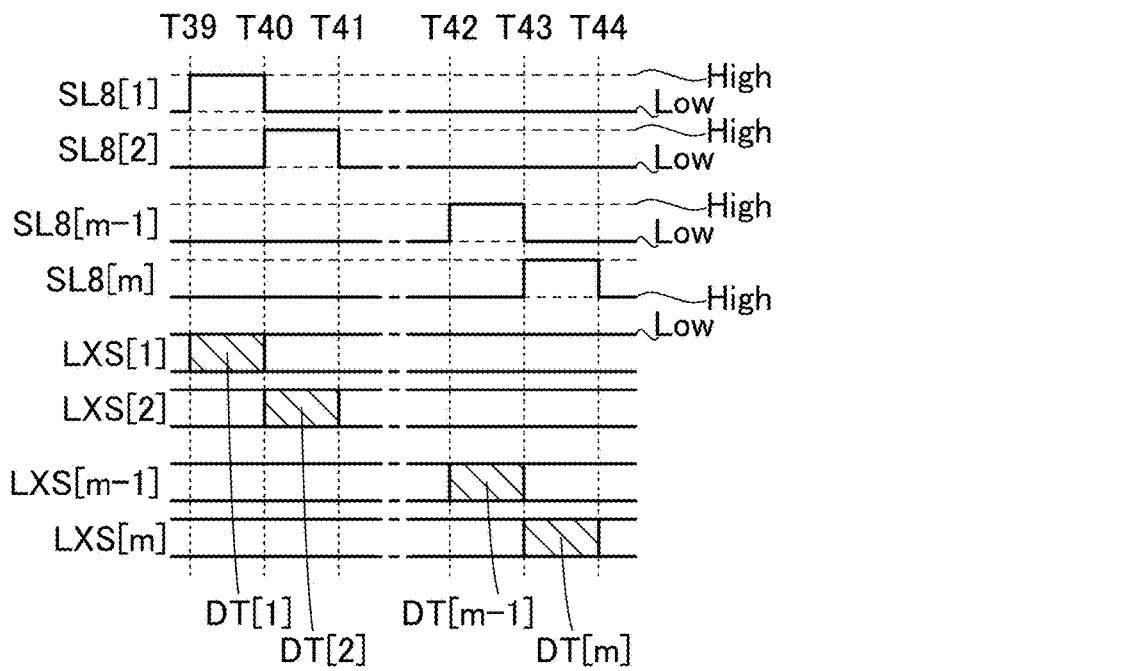

Although the timing chart of FIG. 17A shows the operation example in which the circuit LGC concurrently outputs the data DT to the wiring LXS[1] to the wiring LXS[m], the circuit LGC may sequentially output the data DT to the wiring LXS[1] to the wiring LXS[m]. A timing chart of FIG. 17B shows an operation example in which the circuit LGC sequentially outputs the data DT to the wiring LXS[1] to the wiring LXS[m]. As the operation before Time T39 in the timing chart of FIG. 17B, the operation example in the timing chart of FIG. 17A before Time T31 until Time T39 is assumed to be conducted.

The timing chart of FIG. 17B shows changes in potentials of the wiring SL8[1], the wiring SL8[2], the wiring SL8[m−1], and the wiring SL8[m], and also shows data that have been input to the wiring LXS[1], the wiring LXS[2], the wiring LXS[m−1], and the wiring LXS[m]. Note that as for the wiring SL8[1], the wiring SL8[2], the wiring SL8[m−1], and the wiring SL8[m], a high-level potential is shown as High and a low-level potential is shown as Low.

From Time T39 to Time T40, a high-level potential is input to the wiring SL8[1]. Thus, the switch SW8[1] is turned on to establish electrical continuity between the output terminal Q of the latch circuit LTB[1] and the wiring LXS[1], so that the data DT[1] output from the output terminal Q of the latch circuit LTB is transmitted to the wiring LXS[1].

From Time T40 to Time T41, a low-level potential is input to the wiring SL8[1] and a high-level potential is input to the wiring SL8[2]. Thus, the switch SW8[1] is turned off and the switch SW8[2] is turned on. Electrical continuity between the output terminal Q of the latch circuit LTB[1] and the wiring LXS[1] is broken, so that the data DT[1] output from the output terminal Q of the latch circuit LTB is not transmitted to the wiring LXS[1]. In addition, electrical continuity is established between the output terminal Q of the latch circuit LTB[2] and the wiring LXS[2], so that the data DT[2] output from the output terminal Q of the latch circuit LTB is transmitted to the wiring LXS[2].

From Time T41 to Time T42, a high-level potential is input to the wiring SL8[3] to the wiring SL8[m−2] sequentially, so that the switch SW8[3] to the switch SW8[m−2] are sequentially turned on. Thus, the data DT[3] to the data DT[m−2] that have been output to the output terminals Q of the latch circuit LTB[3] to the latch circuit LTB[m−2] are sequentially output from the wiring LXS[3] to the wiring LXS[m−2], respectively.

From Time T42 to Time T43, a low-level potential is input to the wiring SL8[m−2] and a high-level potential is input to the wiring SL8[m−1]. Thus, the switch SW8[m−2] is turned off and the switch SW8[m−1] is turned on. Electrical continuity between the output terminal Q of the latch circuit LTB[m−2] and the wiring LXS[m−2] is broken, so that the data DT[m−2] output from the output terminal Q of the latch circuit LTB is not transmitted to the wiring LXS[m−2]. In addition, electrical continuity is established between the output terminal Q of the latch circuit LTB[m−1] and the wiring LXS[m−1], so that the data DT[m−1] output from the output terminal Q of the latch circuit LTB is transmitted to the wiring LXS[m−1].

From Time T43 to Time T44, a low-level potential is input to the wiring SL8[m−1] and a high-level potential is input to the wiring SL8[m]. Thus, the switch SW8[m−1] is turned off and the switch SW8[m] is turned on. Electrical continuity between the output terminal Q of the latch circuit LTB[m−1] and the wiring LXS[m−1] is broken, so that the data DT[m−1] output from the output terminal Q of the latch circuit LTB is not transmitted to the wiring LXS[m−1]. In addition, electrical continuity is established between the output terminal Q of the latch circuit LTB[m] and the wiring LXS[m], so that the data DT[m] output from the output terminal Q of the latch circuit LTB is transmitted to the wiring LXS[m].

The circuit LGC performs the operation until Time T39 in the timing chart shown in FIG. 17A and then performs the operation in the timing chart shown in FIG. 17B, whereby the data DT[1] to the data DT[m], which are sequentially input to the circuit LGC, can be sequentially output to the wiring LXS[1] to the wiring LXS[m].

Although the timing chart shown in FIG. 17B shows the operation example in which the wiring SL8[1] to the wiring SL8[m] are sequentially turned on so that the data DT[1] to the data DT[m] are sequentially output to the wiring LXS[1] to the wiring LXS[m], an operation may be employed in which a switch to be turned on is selected from the wiring SL8[1] to the wiring SL8[m] so that the data DT is output to a wiring selected from the wiring LXS[1] to the wiring LXS[m].

With the above-described operation example, a potential based on the data DT can be supplied to any one of the wiring XCL[1] to the wiring XCL[m] of the arithmetic circuit MAC1, the arithmetic circuit MAC2, or the arithmetic circuit MAC3 in the period from Time T14 to Time T15 in the timing chart of FIG. 8, for example.

Figure 16B:
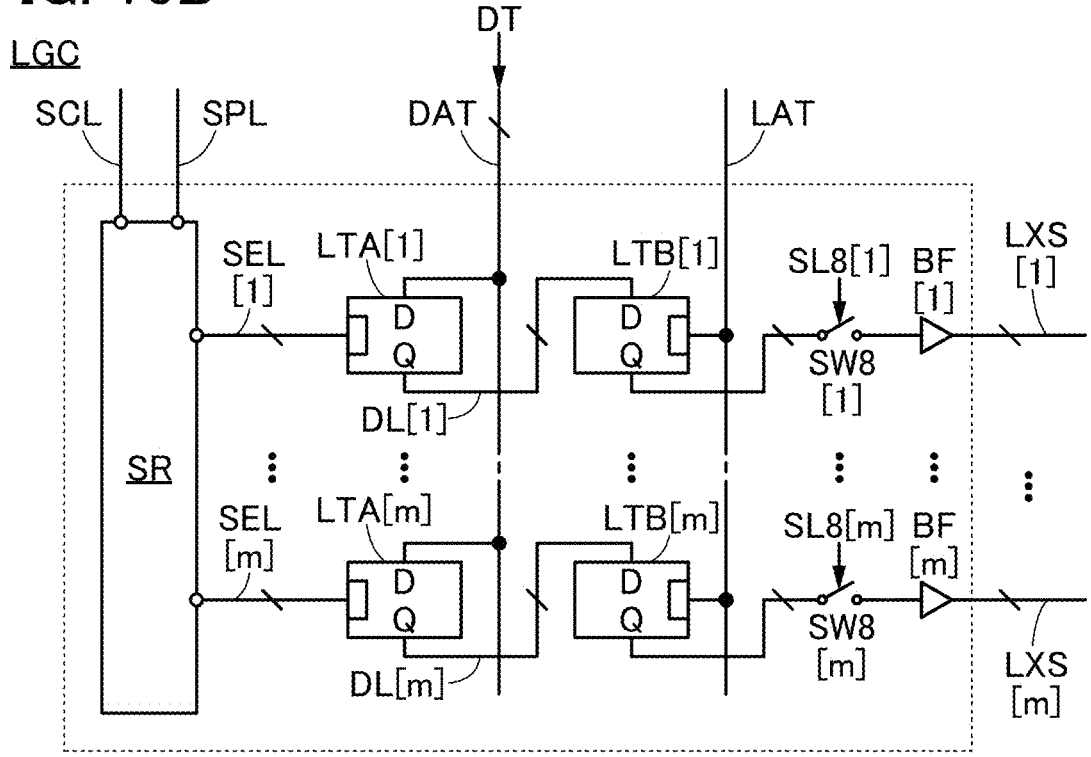

The circuit LGC in FIG. 6 included in the semiconductor device of one embodiment of the present invention is not limited to the circuit LGC illustrated in FIG. 16A and may have a circuit configuration changed from that of the circuit LGC in FIG. 16A depending on circumstances. For example, the circuit LGC in FIG. 16A may have a configuration in which buffer circuits are provided between the switch SW8[1] to the switch SW8[m] and the wiring LXS[1] to the wiring LXS[m], respectively, illustrated in FIG. 16A. In the circuit LGC illustrated in FIG. 16B, a buffer circuit BF[1] to a buffer circuit BF[m] are provided between the switch SW8[1] to the switch SW8[m] and the wiring LXS[1] to the wiring LXS[m], respectively. Providing the buffer circuit BF[1] to the buffer circuit BF[m] in the circuit LGC as illustrated in FIG. 16B can stabilize electric signals (potentials) output from the circuit LGC to the wiring LXS[1] to the wiring LXS[m].

Note that this embodiment can be implemented in appropriate combination with the other embodiments described in this specification.

Embodiment 4

This embodiment will describe a structure of a hierarchical neural network capable of performing an arithmetic operation by the semiconductor device of one embodiment of the present invention.

Figure 18A:
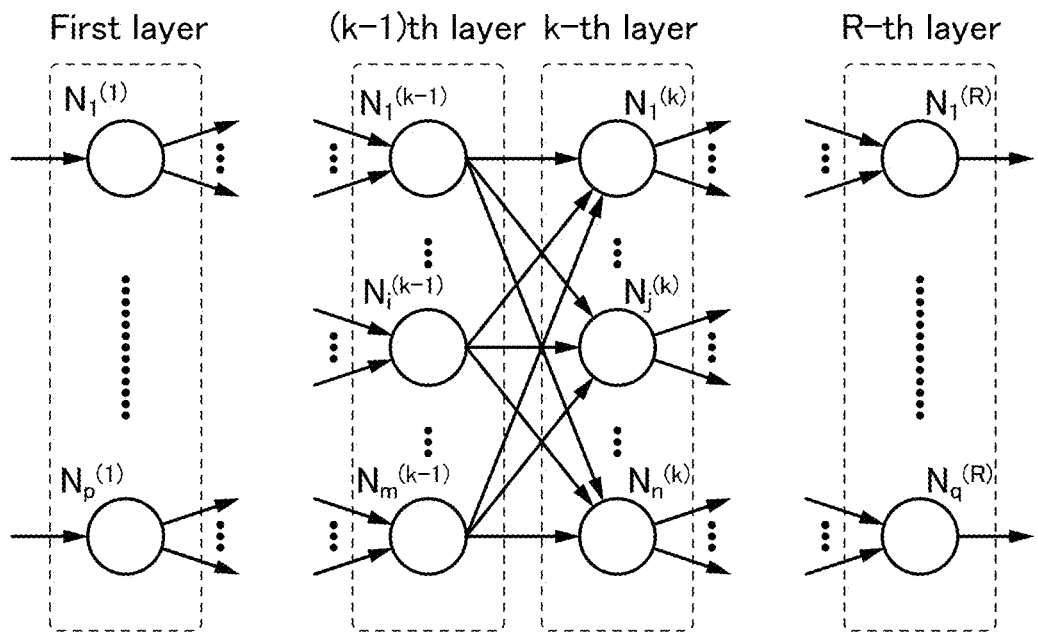
FIG. 18A and FIG. 18B are diagrams illustrating a hierarchical neural network.

A hierarchical neural network includes one input layer, one or a plurality of intermediate layers (hidden layers), and one output layer, for example, and is configured with a total of at least three layers. A hierarchical neural network 100 illustrated in FIG. 18A shows one example, and the neural network 100 includes a first layer to an R-th layer (here, R can be an integer greater than or equal to 4). Specifically, the first layer corresponds to the input layer, the R-th layer corresponds to the output layer, and the other layers correspond to the intermediate layers. Note that FIG. 18A selectively illustrates the (k−1)th layer and the k-th layer (here, k is an integer greater than or equal to 3 and less than or equal to R−1) as the intermediate layers.

Each of the layers of the neural network 100 includes one or a plurality of neurons. In FIG. 18A, the first layer includes a neuron $N_1^{(1)}$ to a neuron $N_p^{(1)}$ (here, p is an integer greater than or equal to 1); the (k−1)th layer includes a neuron $N_1^{(k-1)}$ to a neuron $N_m^{(k-1)}$ (here, m is an integer greater than or equal to 1); the k-th layer includes a neuron $N_1^{(k)}$ to a neuron $N_n^{(k)}$ (here, n is an integer greater than or equal to 1); and the R-th layer includes a neuron $N_1^{(R)}$ to a neuron $N_q^{(R)}$ (here, q is an integer greater than or equal to 1).

Note that FIG. 18A selectively illustrates a neuron $N_i^{(k-1)}$ (here, i is an integer greater than or equal to 1 and less than or equal to m) in the (k−1)th layer and a neuron $N_j^{(k)}$ (here, j is an integer greater than or equal to 1 and less than or equal to n) in the k-th layer, in addition to the neuron $N_1^{(1)}$, the neuron $N_p^{(1)}$, the neuron $N_1^{(k-1)}$, the neuron $N_m^{(k-1)}$, the neuron $N_1^{(k)}$, the neuron $N_n^{(k)}$, the neuron $N_1^{(R)}$, and the neuron $N_q^{(R)}$.

Next, signal transmission from a neuron in one layer to a neuron in the subsequent layer and signals input to and output from the neurons will be described. Note that the description here is made focusing on the neuron $N_j^{(k)}$ in the k-th layer.

Figure 18B:
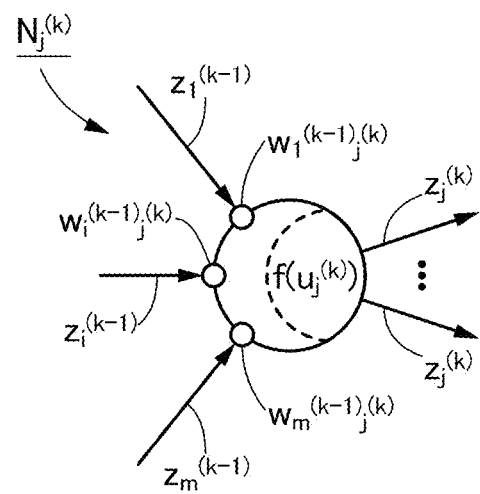

FIG. 18B illustrates the neuron $N_j^{(k)}$ in the k-th layer, signals input to the neuron $N_j^{(k)}$, and a signal output from the neuron $N_j^{(k)}$.

Specifically, $z_1^{(k-1)}$ to $z_m^{(k-1)}$ that are output signals from the neuron $N_1^{(k-1)}$ to the neuron $N_m^{(k-1)}$ in the (k−1)th layer are output to the neuron $N_j^{(k)}$. Then, the neuron $N_j^{(k)}$ generates $z_j^{(k)}$ in accordance with $z_1^{(k-1)}$ to $z_m^{(k-1)}$, and outputs $z_j^{(k)}$ as the output signal to the neurons in the (k+1)th layer (not illustrated).

The efficiency of transmitting a signal input from a neuron in one layer to a neuron in the subsequent layer depends on the connection strength (hereinafter referred to as weight coefficient) of the synapse that connects the neurons to each other. In the neural network 100, a signal output from a neuron in one layer is multiplied by the corresponding weight coefficient and then is input to a neuron in the subsequent layer. When the weight coefficient of the synapse between the neuron $N_i^{(k-1)}$ in the (k−1)th layer and the neuron $N_j^{(k)}$ in the k-th layer is $w_i^{(k-1)}{}_j^{(k)}$, a signal input to the neuron $N_j^{(k)}$ in the k-th layer can be expressed with Formula (4.1).

[Formula 20]

$$w_i^{(k-1)}{}_j^{(k)} \cdot z_i^{(k-1)} \quad (4.1)$$

That is, when the signals are transmitted from the neuron $N_1^{(k-1)}$ to the neuron $N_m^{(k-1)}$ in the (k−1)th layer to the neuron $N_j^{(k)}$ in the k-th layer, the signals $z_1^{(k-1)}$ to $z_m^{(k-1)}$ are multiplied by respective weight coefficients ($w_1^{(k-1)}{}_j^{(k)}$ to $w_m^{(k-1)}{}_j^{(k)}$). Then, $w_1^{(k-1)}{}_j^{(k)} \cdot z_1^{(k-1)}$ to $w_m^{(k-1)}{}_j^{(k)} \cdot z_m^{(k-1)}$ are input to the neuron $N_j^{(k)}$ in the k-th layer. At this time, the total sum $u_j^{(k)}$ of the signals input to the neuron $N_j^{(k)}$ in the k-th layer is expressed by Formula (4.2).

[Formula 21]

$$u_j^{(k)} = \sum_{i=1}^{m} w_i^{(k-1)}{}_j^{(k)} \cdot z_i^{(k-1)} \quad (4.2)$$

In addition, a bias may be added to the product-sum result of the weight coefficients $w_1^{(k-1)}{}_j^{(k)}$ to $w_m^{(k-1)}{}_j^{(k)}$ and the signals $z_1^{(k-1)}$ to $z_m^{(k-1)}$ of the neurons. When the bias is denoted by b, Formula (4.2) can be rewritten as the following formula.

[Formula 22]

$$u_j^{(k)} = \sum_{i=1}^{m} w_i^{(k-1)}{}_j^{(k)} \cdot z_i^{(k-1)} + b \quad (4.3)$$

The neuron $N_j^{(k)}$ generates the output signal $z_j^{(k)}$ in accordance with $u_j^{(k)}$. Here, the output signal $z_j^{(k)}$ from the neuron $N_j^{(k)}$ is defined by the following formula.

[Formula 23]

$$z_j^{(k)} = f(u_j^{(k)}) \quad (4.4)$$

A function $f(u_j^{(k)})$ is an activation function in a hierarchical neural network, and a step function, a linear ramp function, a sigmoid function, or the like can be used. Note that the activation function may be the same or different among all neurons. In addition, the neuron activation function may be the same or different between the layers.

Signals output from the neurons in the layers, the weight coefficient w, or the bias b may be an analog value or a digital value. For example, a binary or ternary digital value may be used. A value having a larger number of bits may be used. In the case of an analog value, for example, a linear ramp function, a sigmoid function, or the like is used as an activation function. In the case of a binary digital value, a step function with an output of −1 or 1 or an output of 0 or 1 is used. Alternatively, the neurons in the layers may each output a ternary or higher-level signal; in this case, a step function with an output of three or more values, for example, an output of −1, 0, or 1 or an output of 0, 1, or 2 is used as an activation function. Furthermore, as an activation function for outputting five values, a step function with an output of −2, −1, 0, 1, or 2 may be used, for example. The use of a digital value as at least one of the signals output from the neurons in the layers, the weight coefficient w, and the bias b enables a reduction of the circuit scale, a reduction of power consumption, or an increase of arithmetic operation speed, for example. Furthermore, the use of an analog value as at least one of the signals output from the neurons in the layers, the weight coefficient w, and the bias b can improve the arithmetic operation accuracy.

The neural network 100 performs an operation in which by input of an input signal to the first layer (input layer), output signals are sequentially generated in the layers from the first layer (input layer) to the last layer (output layer) according to Formula (4.1), Formula (4.2) (or Formula (4.3)), and Formula (4.4) on the basis of the signals input from the previous layers, and the output signals are output to the subsequent layers. The signal output from the last layer (the output layer) corresponds to the calculation results of the neural network 100.

An arithmetic operation performed in the first layer (input layer), the hidden layers, and the last layer (output layer) included in the neural network 100 can be carried out by using the arithmetic circuit MAC1 to the arithmetic circuit MAC3 described in Embodiment 1 and Embodiment 2.

In particular, when a bias is intended to be added to the product-sum result as in Formula (4.3), the arithmetic circuit MAC2 described in Embodiment 2 should be used. At this time, the bias b in Formula (4.3) corresponds to $I_{BIAS}[1]$ in Formula (2.1) and Formula (2.2).

The circuit XLD or the circuit SCA in the arithmetic circuit MAC1 to the arithmetic circuit MAC3 described in Embodiment 1 and Embodiment 2 can be used as the input layer described in this embodiment, for example. Note that here, given that the second layer includes a neuron $N_1^{(2)}$ to a neuron $N_r^{(2)}$ (r is an integer greater than or equal to 1), the case where a signal is transmitted from a neuron included in the first layer to the neurons included in the second layer is considered. In this case, in the memory cell array CA included in the arithmetic circuit MAC1 to the arithmetic circuit MAC3, the memory cells AM are arranged in a matrix of p rows and r columns.

A neuron $N_{s[1]}^{(1)}$ (s[1] is an integer greater than or equal to 1 and less than or equal top) in the first layer (input layer) outputs a received signal $z_{s[1]}^{(1)}$ to all the neurons in the second layer (hidden layer). By setting the signal $z_{s[1]}^{(1)}$ to a potential (second data) output from the circuit XLD or the circuit SCA, the signal $z_{s[1]}^{(1)}$ output from the first layer (input layer) can be input through the wiring XL[s[1]] to the memory cell AM[s[1],1] to the memory cell AM[s[1],r] and the memory cell AMr[s[1]] included in the memory cell array CA.

At this time, a weight coefficient $w_{s[1]}^{(1)}{}_{s[2]}^{(2)}$ is stored as the first data in the memory cells AM in the s[2]-th column (s[2] is an integer greater than or equal to 1 and less than or equal to r) of the memory cell array CA; hence, the product-sum of the signal $z_{s[1]}^{(1)}$ and the weight coefficient $w_{s[1]}^{(1)}{}_{s[2]}^{(2)}$ in the neuron $N_{s[2]}^{(2)}$ in the second layer (hidden layer) can be obtained. Specifically, the product-sum of the signal $z_{s[1]}^{(1)}$ and the weight coefficient $w_{s[1]}^{(1)}{}_{s[2]}^{(2)}$ can be obtained from a current $I_S[s[2]]$ flowing through the circuit IVTC. In addition, by obtaining the value of the activation function from the product-sum result by the circuit ACTV, the value of the activation function can be output from the wiring NIL[s[2]] as an output signal $z_{s[2]}^{(2)}$ of the neuron $N_{s[2]}^{(2)}$ in the second layer.

The arithmetic circuit MAC1 to the arithmetic circuit MAC3 described in Embodiment 1 and Embodiment 2 can be used as the above-described hidden layer. Here, the case where a signal is transmitted from a neuron included in the (k−1)th layer to neurons included in the k-th layer is considered. In this case, in the memory cell array CA included in the arithmetic circuit MAC1 to the arithmetic circuit MAC3, the memory cells AM are arranged in a matrix of m rows and n columns.

The neuron $N_i^{(k-1)}$ in the (k−1)th layer outputs a signal $z_i^{(k-1)}$ to a neuron $N_1^{(k)}$ to a neuron $N_n^{(k)}$ in the k-th layer. By setting the signal $z_i^{(k-1)}$ to a potential (second data) output from the circuit XLD, the signal $z_i^{(k-1)}$ output from the (k−1)th layer can be input through the wiring XL[i] to the memory cell AM[i,1] to the memory cell AM[i,n] and the memory cell AMr[i] included in the memory cell array CA.

At this time, a weight coefficient $w_{i\ j}^{(k-1)(k)}$ is stored as the first data in the memory cells AM in the j-th column of the memory cell array CA; hence, the product-sum of the signal $z_i^{(k-1)}$ and the weight coefficient $w_{i\ j}^{(k-1)(k)}$ in the neuron $N_j^{(k)}$ in the k-th layer can be obtained. Specifically, the product-sum of the signal $z_i^{(k-1)}$ and the weight coefficient $w_{i\ j}^{(k-1)(k)}$ can be obtained from a current $I_S[j]$ flowing through the circuit IVTC. In addition, by obtaining the value of the activation function from the product-sum result by the circuit ACTV, the value of the activation function can be output from the wiring NIL[j] as an output signal $z_j^{(k)}$ of the neuron $N_j^{(k)}$ in the k-th layer.

The arithmetic circuit MAC1 to the arithmetic circuit MAC3 described in Embodiment 1 and Embodiment 2 can be used as the above-described output layer. Here, given that the (R−1)th layer includes a neuron $N_1^{(R-1)}$ to a neuron $N_v^{(R-1)}$ (v is an integer greater than or equal to 1), the case where a signal is transmitted from a neuron included in the (R−1)th layer to neurons included in the R-th layer is considered. In this case, in the memory cell array CA included in the arithmetic circuit MAC1 to the arithmetic circuit MAC3, the memory cells AM are arranged in a matrix of v rows and q columns.

The neuron $N_{s[R-1]}^{(R-1)}$ in the (R−1)th layer (s[R−1] is an integer greater than or equal to 1 and less than or equal to v) outputs a signal $z_{s[R-1]}^{(R-1)}$ to a neuron $N_1^{(R)}$ to a neuron $N_q^{(R)}$ in the R-th layer. By setting the signal $z_{s[R-1]}^{(R-1)}$ to a potential (second data) output from the circuit XLD, the signal $z_{s[R-1]}^{(R-1)}$ output from the (R−1)th layer can be input through the wiring XL[s[R−1]] to the memory cell AM[s[R−1],1] to the memory cell AM[s[R−1],n] and the memory cell AMr[s[R−1]] included in the memory cell array CA.

At this time, a weight coefficient $w_{s[R-1]\ s[R]}^{(R-1)(R)}$ is stored as the first data in the memory cells AM in the s[R]-th column (s[R] is an integer greater than or equal to 1 and less than or equal to q) of the memory cell array CA; hence, the product-sum of the signal $z_{s[R-1]}^{(R-1)}$ and the weight coefficient $w_{s[R-1]\ s[R]}^{(R-1)(R)}$ in the neuron $N_{s[R]}^{(R)}$ in the R-th layer can be obtained. Specifically, the product-sum of the signal $z_{s[R-1]}^{(R-1)}$ and the weight coefficient $w_{s[R-1]\ s[R]}^{(R-1)(R)}$ can be obtained from a current $I_S[s[R]]$ flowing through the circuit IVTC. In addition, by obtaining the value of the activation function from the product-sum result by the circuit ACTV, the value of the activation function can be output from the wiring NIL[s[R]] as an output signal $z_{s[R]}^{(R)}$ of the neuron $N_{s[R]}^{(R)}$ in the R-th layer.

By the way, in the arithmetic circuit described in this embodiment, the number of rows of the memory cells AM corresponds to the number of neurons in the previous layer. In other words, the number of rows of the memory cells AM corresponds to the number of output signals of the neurons in a given layer that are input to one neuron in the next layer. Moreover, in the arithmetic circuit described in this embodiment, the number of columns of the memory cells AM corresponds to the number of neurons in the next layer. In other words, the number of columns of the memory cells AM corresponds to the number of output signals that are output from the neurons in the next layer. That is to say, the number of rows and the number of columns in the memory cell array of the arithmetic circuit depend on the number of neurons in each of a given layer and the next layer; thus, a neural network is designed by determining the number of rows and the number of columns in the memory cell array depending on the desired structure.

For example, when the arithmetic circuit MAC1 described in Embodiment 1 is used as the above-described hidden layer, the weight coefficient $w_{i\ j}^{(k-1)(k)}$ is used as the first data and a potential based on the first data is sequentially stored in the memory cells AM in the same column, and the output signal $z_i^{(k-1)}$ from the neuron $N_i^{(k-1)}$ in the (k−1)th layer is used as the second data and a potential based on the second data is supplied from the circuit XLD or the circuit SCA to the wiring XL in each row. Thus, a value of the product-sum of the signal $z_i^{(k-1)}$ and the weight coefficient $w_{i\ j}^{(k-1)(k)}$ is obtained from the amount $I_S$ of current flowing through the circuit IVTC, and the activation function value based on the value can be calculated by the circuit ACTV. That is, the activation function value can be used as a signal and serve as the output signal $z_j^{(k)}$ of the neuron $N_j^{(k)}$ in the k-th layer. When the circuit ACTV is configured to output a potential based on the activation function value and input the output signal $z_j^{(k)}$ of the neuron $N_j^{(k)}$ in the k-th layer to another arithmetic circuit MAC1, the another arithmetic circuit MAC1 can calculate an output signal $z_{s[k+1]}^{(k+1)}$ of a neuron $N_{s[k+1]}^{(k+1)}$ (s[k+1] is an integer greater than or equal to 1 and less than or equal to the total number of neurons included in the (k+1)th layer), which is output from the neuron in the (k+1)th layer.

Figure 19:
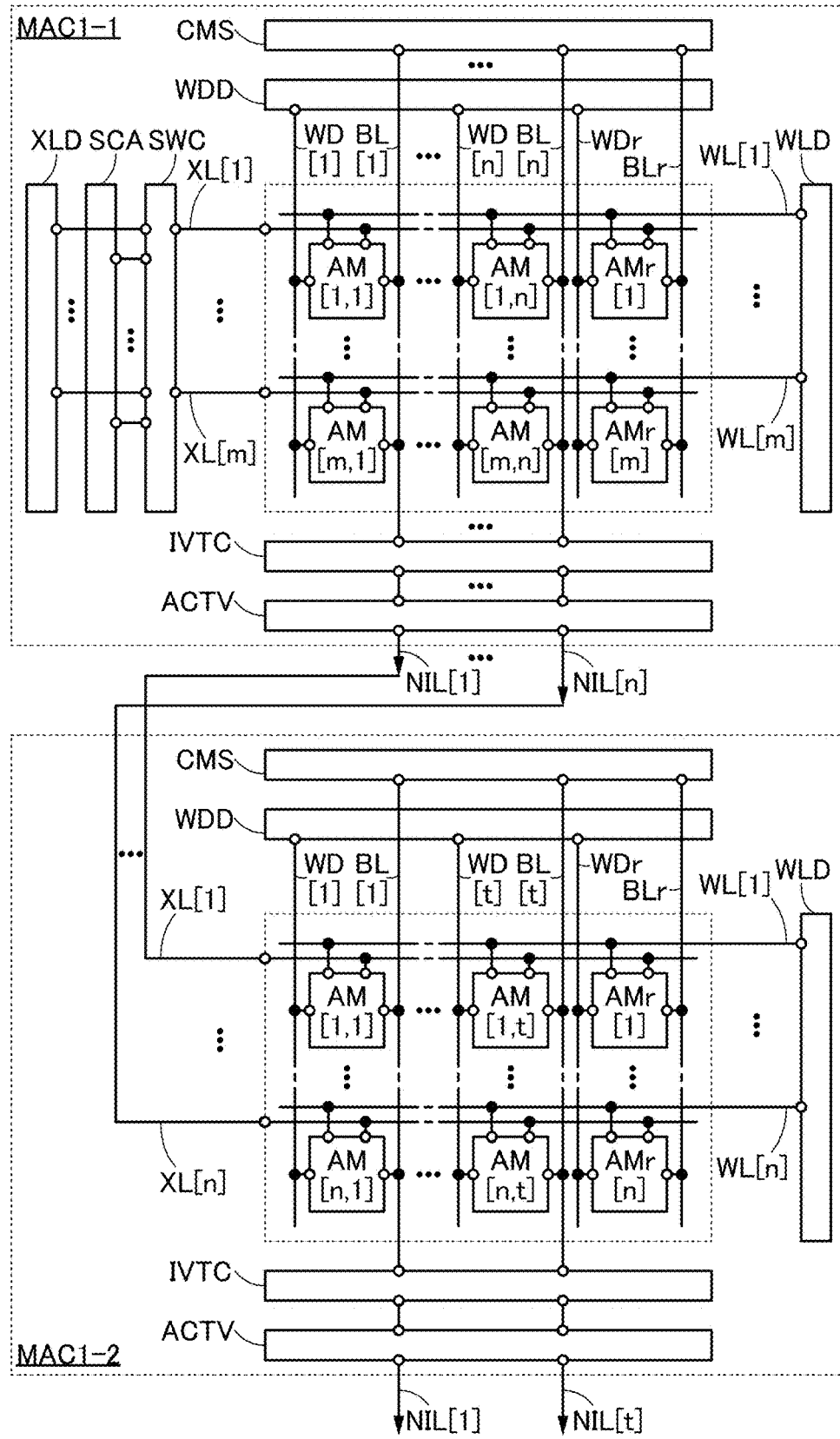
FIG. 19 is a block diagram illustrating a configuration example of a semiconductor device.

Specifically, the above-described arithmetic operation can be performed by using an arithmetic circuit MAC4 illustrated in FIG. 19. The arithmetic circuit MAC4 in FIG. 19 includes, for example, an arithmetic circuit MAC1-1 having a configuration similar to that of the arithmetic circuit MAC1 in FIG. 1 and an arithmetic circuit MAC1-2 having a configuration where the circuit XLD, the circuit SCA, and the circuit SWC are not provided in the arithmetic circuit MAC1 in FIG. 1. Note that in the memory cell array CA in the arithmetic circuit MAC1-1, m×n memory cells AM and m memory cells AMr are arranged in a matrix; in the memory cell array CA in the arithmetic circuit MAC1-2, n×t memory cells AM (t is an integer greater than or equal to 1 and is the total number of neurons included in the (k+1)th layer) and n memory cells AMr are arranged in a matrix. The wiring NIL[1] to the wiring NIL[n] in the arithmetic circuit MAC1-1 are electrically connected to the wiring XL[1] to the wiring XL[n] in the arithmetic circuit MAC1-2, respectively.

For example, in the arithmetic circuit MAC1-1 in FIG. 19, the weight coefficient between the neurons in the (k−1)th layer and the neurons in the k-th layer is used as the first data and stored in the memory cell AM[1,1] to the memory cell AM[m,n] of the memory cell array CA, and the output signal $z_{s[k-1]}^{(k-1)}$ from a neuron $N_{s[k-1]}^{(k-1)}$ in the (k−1)th layer is used as the second data and a potential based on the second data flows from the circuit XLD or the circuit SCA to the wiring XL in each row. Thus, output signals $z_1^{(k)}$ to $z_n^{(k)}$ of the neuron $N_1^{(k)}$ to the neuron $N_n^{(k)}$ in the k-th layer can be output from the wiring BL[1] to the wiring BL[n] through the wiring NIL[1] to the wiring NIL[n]. Note that the values of the output signals $z_1^{(k)}$ to $z_n^{(k)}$ can be represented as potentials output from the circuit ACTV to the wiring NIL[1] to the wiring NIL[n].

Here, in the arithmetic circuit MAC1-2 in FIG. 19, the weight coefficient between the neurons in the k-th layer and the neurons in the (k+1)th layer is used as the first data and stored in the memory cell AM[1,1] to the memory cell AM[n,t] of the memory cell array CA, and potentials supplied to the wiring XL in each row, that is, the output signals $z_1^{(k)}$ to $z_n^{(k)}$ from the neuron $N_1^{(k)}$ to the neuron $N_n^{(k)}$ in the k-th layer are used as the second data. Thus, output signals $z_1^{(k+1)}$ to $z_t^{(k+1)}$ of the neuron $N_1^{(k+1)}$ to the neuron $N_t^{(k+1)}$ in the (k+1)th layer can be output from the wiring BL[1] to the wiring BL[t] through the wiring NIL[1] to the wiring NIL[t], respectively.

As described above, in the arithmetic circuit MAC1 to the arithmetic circuit MAC3, the number of rows and the number of columns of the memory cell array CA can be determined in accordance with the scale of the hierarchical neural network. In addition, by achieving the connection as illustrated in FIG. 19 with the use of at least one of the arithmetic circuit MAC1 to the arithmetic circuit MAC3, an arithmetic operation corresponding to the number of layers of the hierarchical neural network can be performed.

Note that this embodiment can be implemented in appropriate combination with the other embodiments described in this specification.

Embodiment 5

This embodiment will describe structure examples of the semiconductor device described in the above embodiments and structure examples of a transistor that can be used in the semiconductor device described in the above embodiments.

Structure Example of Semiconductor Device

Figure 20:
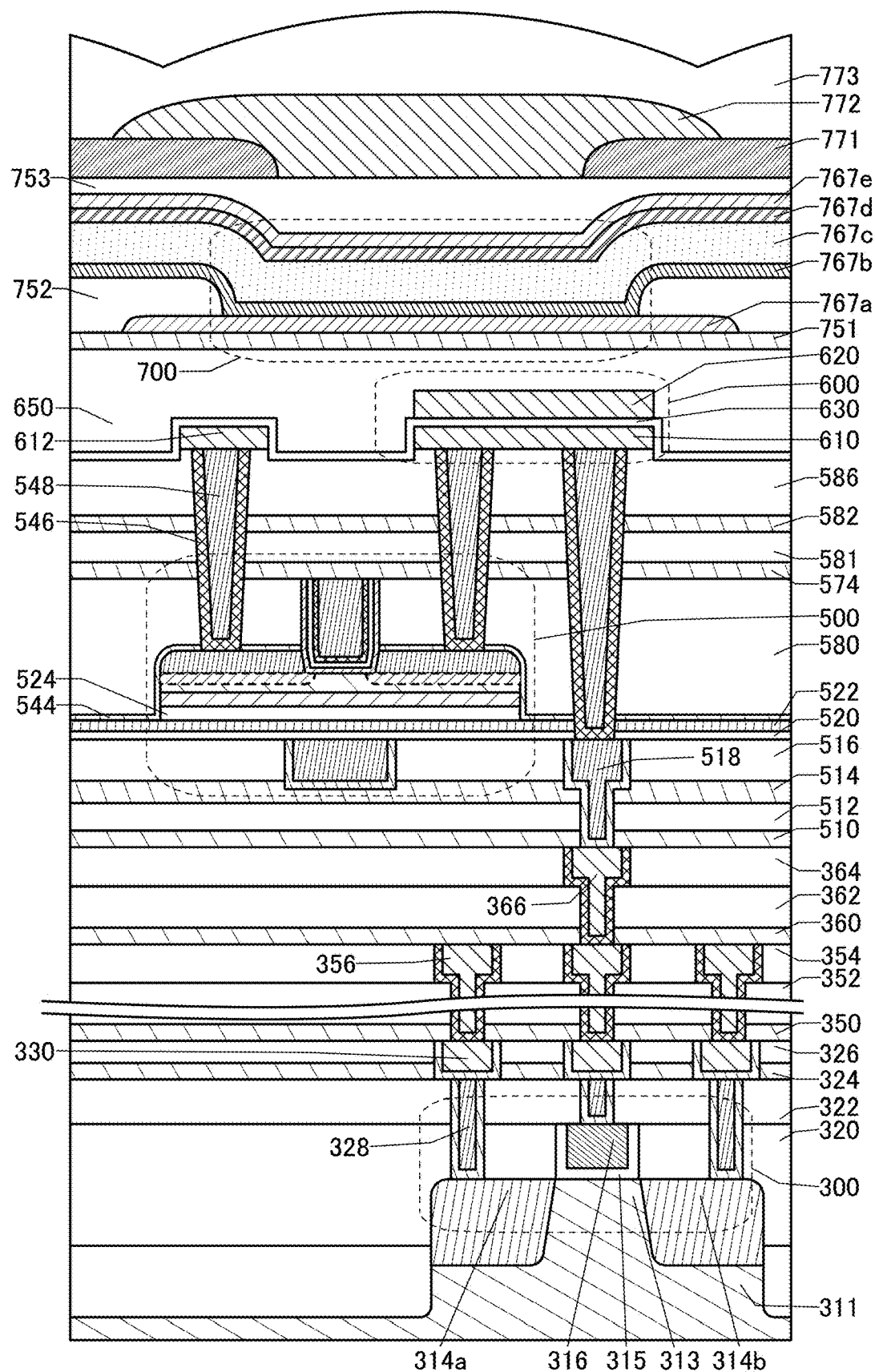
FIG. 20 is a schematic cross-sectional view illustrating a structure example of a semiconductor device.
Figure 22A:
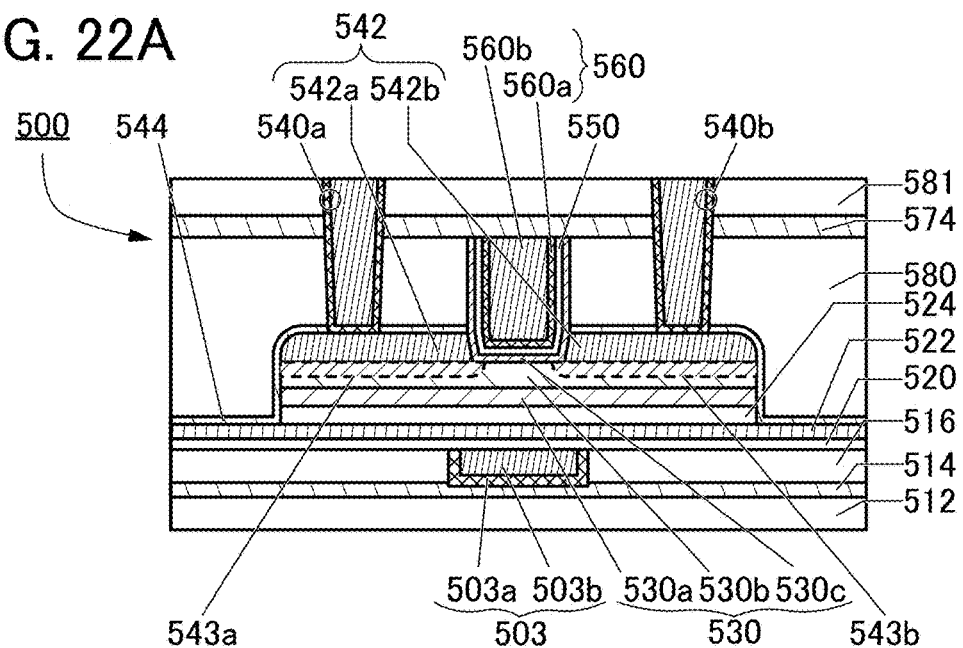
FIG. 22A to FIG. 22C are schematic cross-sectional views each illustrating a structure example of a transistor.
Figure 22B:
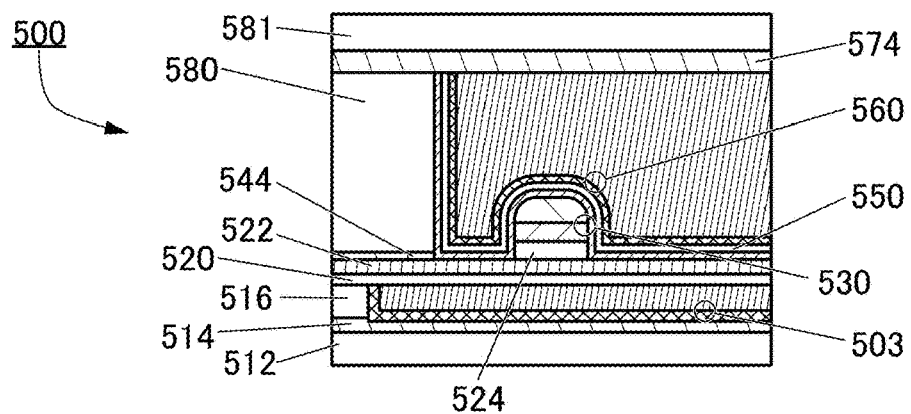
Figure 22C:
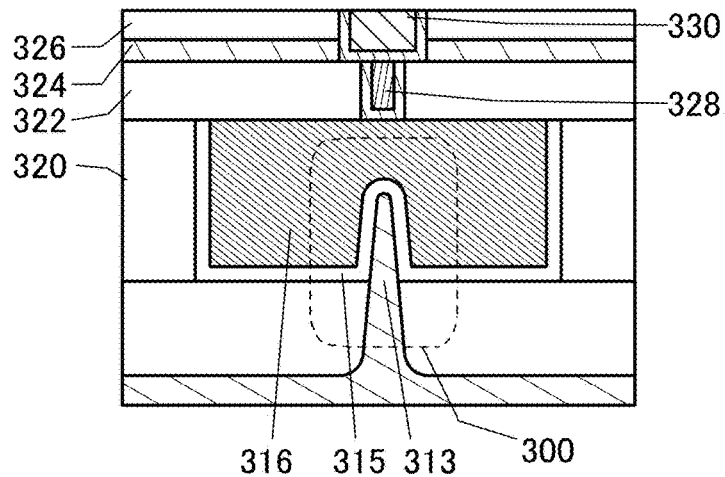

FIG. 20 is an example of a cross-sectional view of any one of the arithmetic circuit MAC1 to the arithmetic circuit MAC4 described in the above embodiments, and illustrates an example of a structure where a photoelectric conversion element is used as the photodiode in the circuit SNC. Specifically, a semiconductor device illustrated in FIG. 20 includes a transistor 300, a transistor 500, a capacitor 600, and a photoelectric conversion element 700. FIG. 22A is a cross-sectional view of the transistor 500 in the channel length direction, FIG. 22B is a cross-sectional view of the transistor 500 in the channel width direction, and FIG. 22C is a cross-sectional view of the transistor 300 in the channel width direction.

The transistor 500 is a transistor containing a metal oxide in a channel formation region (an OS transistor). The transistor 500 has features that the off-state current is low and that the field-effect mobility does not change even at high temperatures. The transistor 500 is used as a transistor included in a semiconductor device, for example, the arithmetic circuit MAC1 to the arithmetic circuit MAC4 described in the above embodiments, whereby a semiconductor device whose operating capability does not deteriorate even at a high temperature can be obtained. In particular, when the transistor 500 is used as the transistor Tr11, potentials written to the memory cells AM, the memory cells AMr, and the like can be retained for a long time by utilizing the feature of a low off-state current. The use of the transistor 500 as the transistor Tr41, the transistor Tr42, and the like enables a potential written to the node NS in the circuit RPC to be retained for a long time. The use of the transistor 500 as the transistor included in the switch SW1 enables a potential written to the first terminal of the capacitor C6 to be retained for a long time. The use of the transistor 500 as the transistor included in the switch SW2 enables a potential written to the first terminal of the capacitor C7 to be retained for a long time.

The transistor 500 is provided above the transistor 300, for example, and the capacitor 600 is provided above the transistor 300 and the transistor 500, for example. The capacitor 600 can be used as the capacitor and the like included in the arithmetic circuit MAC1 to the arithmetic circuit MAC4 and the like described in the above embodiments. Note that depending on a circuit configuration, the capacitor 600 illustrated in FIG. 20 is not necessarily provided.

The photoelectric conversion element 700 is provided above the capacitor 600, for example.

The transistor 300 is provided on a substrate 311 and includes a conductor 316, an insulator 315, a semiconductor region 313 that is part of the substrate 311, and a low-resistance region 314a and a low-resistance region 314b each functioning as a source region or a drain region. Note that the transistor 300 can be used as, for example, the transistor and the like included in the arithmetic circuit MAC1 to the arithmetic circuit MAC4 and the like described in the above embodiments. Specifically, the transistor 300 can be used as transistors included in the operational amplifier OP[1] to the operational amplifier OP[n] included in the circuit IVTC in FIG. 5A or FIG. 5B, for example. As another example, the transistor 300 can be used as the transistor Tr31, the transistor Tr32[1] to the transistor Tr32[n], the transistor Tr33, the transistor Tr34, the transistor Tr35, and the transistor Tr36[1] to the transistor Tr36[n]. Note that FIG. 20 illustrates a structure where a gate of the transistor 300 is electrically connected to one of a source and a drain of the transistor 500 through a pair of electrodes of the capacitor 600. However, depending on the configurations of the arithmetic circuit MAC1 to the arithmetic circuit MAC4 and the like, it is possible to employ a structure where one of a source and a drain of the transistor 300 is electrically connected to one of the source and the drain of the transistor 500 through the pair of electrodes of the capacitor 600, a structure where one of the source and the drain of the transistor 300 is electrically connected to a gate of the transistor 500 through the pair of electrodes of the capacitor 600, or a structure where each terminal of the transistor 300 is not electrically connected to each terminal of the transistor 500 or each terminal of the capacitor 600.

A semiconductor substrate (e.g., a single crystal substrate or a silicon substrate) is preferably used as the substrate 311.

In the transistor 300, the top surface and the side surface in the channel width direction of the semiconductor region 313 are covered with the conductor 316 with the insulator 315 therebetween, as illustrated in FIG. 22C. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), GaN (gallium nitride), or the like. A structure using silicon whose effective mass is controlled by applying stress to the crystal lattice and changing the lattice spacing may be employed. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used in the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 21:
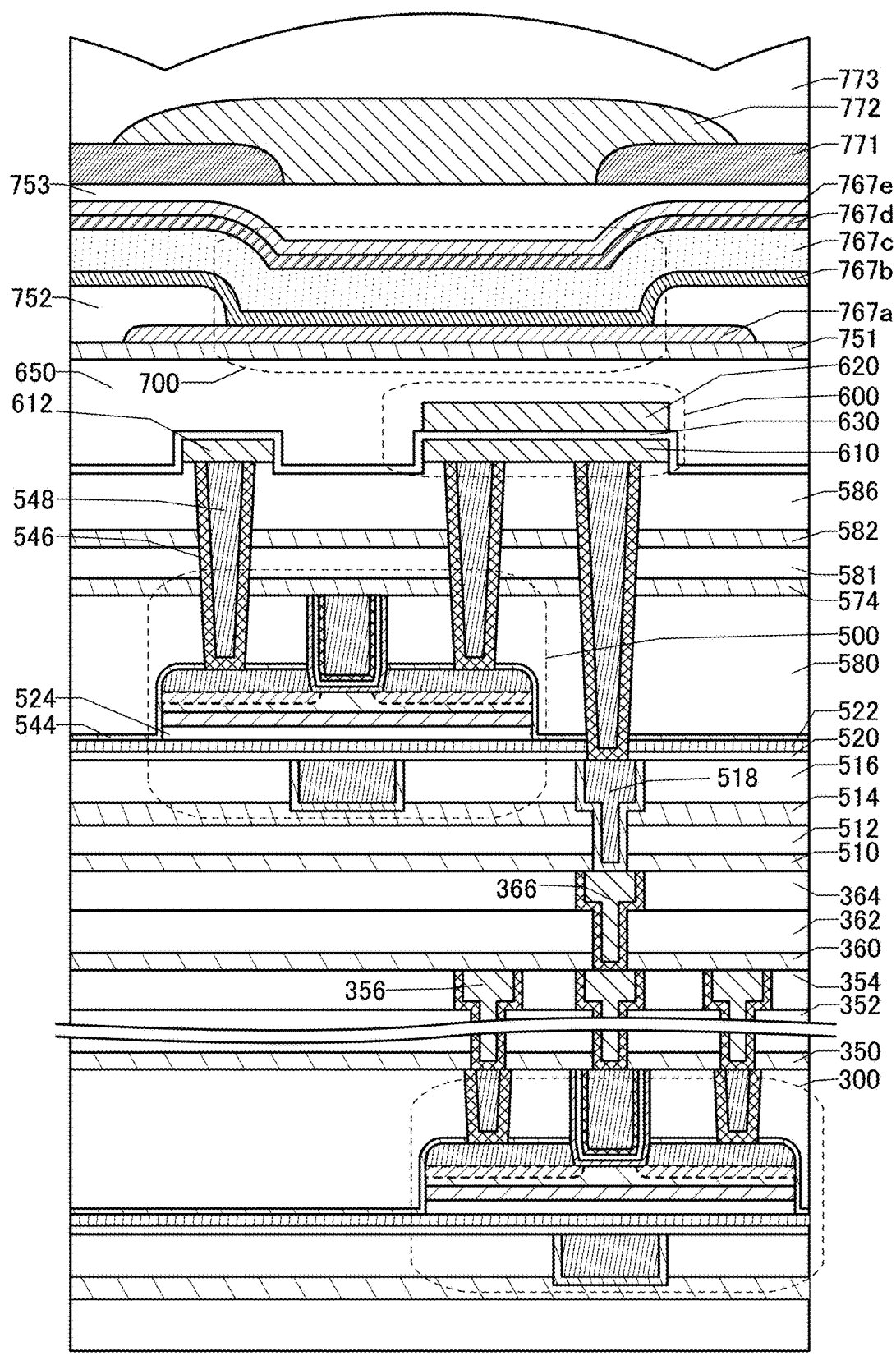
FIG. 21 is a schematic cross-sectional view illustrating a structure example of a semiconductor device.

Note that the transistor 300 shown in FIG. 20 is an example and the structure is not limited thereto; an appropriate transistor is used in accordance with a circuit configuration, a driving method, or the like. For example, when a semiconductor device is configured as a single-polarity circuit using only OS transistors, the transistor 300 can have a structure similar to that of the transistor 500 using an oxide semiconductor, as illustrated in FIG. 21. Note that the details of the transistor 500 will be described later.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to increase planarity.

As the insulator 324, it is preferable to use a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where a part of a conductor functions as a wiring and another part of the conductor functions as a plug.

As a material of each of plugs and wirings (e.g., the conductor 328 and the conductor 330), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings using a low-resistance conductive material such as aluminum or copper. The use of a low-resistance conductive material can reduce wiring resistance.

A wiring layer may be provided over the insulator 326 and the conductor 330. For example, in FIG. 20, an insulator 350, an insulator 352, and an insulator 354 are stacked in this order. Furthermore, a conductor 356 is formed in the insulator 350, the insulator 352, and the insulator 354. The conductor 356 has a function of a plug or a wiring connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 300 and the transistor 500 can be separated by the barrier layer, so that diffusion of hydrogen from the transistor 300 into the transistor 500 can be inhibited.

Note that for the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is maintained. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 20, an insulator 360, an insulator 362, and an insulator 364 are stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 300 and the transistor 500 can be separated by the barrier layer, so that diffusion of hydrogen from the transistor 300 into the transistor 500 can be inhibited.

A wiring layer (not illustrated) may be provided over the insulator 364 and the conductor 366.

In the above, the wiring layer including the conductor 356 and the wiring layer including the conductor 366 are described; however, the semiconductor device of this embodiment is not limited thereto. One or less wiring layer similar to the wiring layer including the conductor 356 may be provided, or three or more wiring layers similar to the wiring layer including the conductor 356 may be provided. In addition, two or more wiring layers similar to the wiring layer including the conductor 366 may be provided.

An insulator 510, an insulator 512, an insulator 514, and an insulator 516 are stacked in this order and provided over the insulator 364. A substance having a barrier property against oxygen, hydrogen, or the like is preferably used for any of the insulator 510, the insulator 512, the insulator 514, and the insulator 516.

For example, as the insulator 510 and the insulator 514, it is preferable to use a film having a barrier property that prevents diffusion of hydrogen, impurities, or the like from the substrate 311, a region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture, which are factors of a change in electrical characteristics of the transistor. Accordingly, aluminum oxide can prevent mixing of impurities such as hydrogen and moisture into the transistor 500 in the manufacturing process and after manufacturing of the transistor. In addition, release of oxygen from the oxide included in the transistor 500 can be inhibited. Therefore, aluminum oxide is suitably used for the protective film of the transistor 500.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, the diffusion of hydrogen from the transistor 300 into the transistor 500 can be inhibited.

The transistor 500 is provided above the insulator 516.

As illustrated in FIG. 22A and FIG. 22B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530*a* positioned over the insulator 524, an oxide 530*b* positioned over the oxide 530*a*, a conductor 542*a* and a conductor 542*b* positioned apart from each other over the oxide 530*b*, an insulator 580 that is positioned over the conductor 542*a* and the conductor 542*b* and is provided with an opening formed to overlap with a region between the conductor 542*a* and the conductor 542*b*, an oxide 530*c* positioned on a bottom and a side surface of the opening, an insulator 550 positioned on a formation surface of the oxide 530*c*, and a conductor 560 positioned on a formation surface of the insulator 550. Note that the conductor 542*a* and the conductor 542*b* are collectively referred to as a conductor 542 in this specification and the like.

As illustrated in FIG. 22A and FIG. 22B, an insulator 544 is preferably provided between the insulator 580 and the oxide 530*a*, the oxide 530*b*, the conductor 542*a*, and the conductor 542*b*. In addition, as illustrated in FIG. 22A and FIG. 22B, the conductor 560 preferably includes a conductor 560*a* provided on the inner side of the insulator 550 and a conductor 560*b* provided to be embedded on the inner side of the conductor 560*a*. As illustrated in FIG. 22A and FIG. 22B, an insulator 574 is preferably provided over the insulator 580, the conductor 560, and the insulator 550.

Note that in the following description, the oxide 530*a*, the oxide 530*b*, and the oxide 530*c* are sometimes collectively referred to as an oxide 530.

The transistor 500 is illustrated to have a structure in which the three layers of the oxide 530*a*, the oxide 530*b*, and the oxide 530c are stacked in the region where the channel is formed and in the vicinity thereof; however, one embodiment of the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is illustrated to have a stacked-layer structure of two layers in the transistor 500, one embodiment of the present invention is not limited thereto. For example, the conductor 560 may have a single-layer structure or a stacked-layer structure of three or more layers. Note that the transistor 500 illustrated in FIG. 20, FIG. 22A, and FIG. 22B is an example, and the structure is not limited thereto; an appropriate transistor can be used in accordance with a circuit configuration, a driving method, or the like.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not include a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is placed to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

In addition, the conductor 503 has a structure similar to that of the conductor 518; a conductor 503a is formed in contact with an inner wall of an opening of the insulator 514 and the insulator 516, and a conductor 503b is formed on the inner side. Although the transistor 500 is illustrated to have a structure in which the conductor 503a and the conductor 503b are stacked, one embodiment of the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which the oxygen is less likely to pass). Note that in this specification, a function of inhibiting diffusion of impurities or oxygen means a function of inhibiting diffusion of any one or all of the impurities and the oxygen.

For example, when the conductor 503a has a function of inhibiting diffusion of oxygen, a reduction in conductivity of the conductor 503b due to oxidation can be inhibited.

In the case where the conductor 503 also functions as a wiring, a conductive material with high conductivity that contains tungsten, copper, or aluminum as its main component is preferably used for the conductor 503b. In the case where the conductivity of the wiring can be kept high, the conductor 503a is not necessarily provided. Note that the conductor 503b is illustrated as a single layer but may have a stacked-layer structure, for example, a stack of titanium or titanium nitride and any of the above conductive materials.

The insulator 520, the insulator 522, and the insulator 524 have a function of a second gate insulating film.

Here, as the insulator 524 that is in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of "VoH→Vo+H" occurs. Part of hydrogen generated at this time is bonded to oxygen to be H$_2$O, and removed from the oxide 530 or an insulator near the oxide 530 in some cases. Part of hydrogen is diffused into or gettered (also referred to as gettering) by the conductor 542a and the conductor 542b in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "Vo+O→null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of VoH.

When the insulator 524 includes an excess-oxygen region, it is preferable that the insulator 522 have a function of inhibiting diffusion of oxygen (e.g., oxygen atoms and oxygen molecules) (or that the above oxygen be less likely to pass through the insulator 522).

When the insulator 522 has a function of inhibiting diffusion of oxygen, impurities or the like, oxygen contained in the oxide 530 is not diffused to the insulator 520 side, which is preferable. Furthermore, the conductor 503 can be inhibited from reacting with oxygen contained in the insulator 524, the oxide 530, or the like.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be lowered while the physical thickness is maintained.

It is particularly preferable to use an insulator containing an oxide of one or both of aluminum and hafnium, which is an insulating material that has a function of inhibiting diffusion of impurities, oxygen, and the like (through which the oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the above insulator.

In addition, it is preferable that the insulator 520 be thermally stable. For example, silicon oxide and silicon oxynitride, which have thermal stability, are suitable. Furthermore, when an insulator that is a high-k material is combined with silicon oxide or silicon oxynitride, the insulator 520 having a stacked-layer structure that has thermal stability and a high relative permittivity can be obtained.

Note that in the transistor 500 in FIG. 22A and FIG. 22B, the insulator 520, the insulator 522, and the insulator 524 are shown as the second gate insulating film having a stacked-layer structure of three layers; alternatively, the second gate insulating film may be a single layer or may have a stacked-layer structure of two layers or four or more layers. In that case, the stacked layers are not necessarily formed of the same material and may be formed of different materials.

In the transistor 500, a metal oxide functioning as an oxide semiconductor is preferably used for the oxide 530 including the channel formation region. For example, as the oxide 530, a metal oxide such as an In-M-Zn oxide (the element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, the In-M-Zn oxide that can be used as the oxide 530 is preferably a CAAC-OS (C-Axis Aligned Crystalline Oxide Semiconductor) or a CAC-OS (Cloud-Aligned Composite Oxide Semiconductor). Alternatively, an In—Ga oxide, an In—Zn oxide, an In oxide, or the like may be used as the oxide 530.

Furthermore, a metal oxide with a low carrier concentration is preferably used for the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. In the case where hydrogen enters an oxygen vacancy in the oxide 530, the oxygen vacancy and the hydrogen are bonded to each other to form VoH in some cases. The VoH serves as a donor and an electron serving as a carrier is generated in some cases. In some cases, bonding of part of hydrogen to oxygen bonded to a metal atom generates electrons serving as carriers. Thus, a transistor using a metal oxide containing a large amount of hydrogen is likely to have normally-on characteristics. Moreover, hydrogen in a metal oxide easily moves by stress such as heat and an electric field; thus, the reliability of a transistor may be low when the metal oxide contains a large amount of hydrogen. In one embodiment of the present invention, VoH in the oxide 530 is preferably reduced as much as possible so that the oxide 530 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen supplying treatment) to obtain a metal oxide whose VoH is sufficiently reduced. When a metal oxide in which impurities such as VoH are sufficiently reduced is used for a channel formation region of a transistor, stable electrical characteristics can be given.

A defect that is an oxygen vacancy into which hydrogen has entered can function as a donor of a metal oxide. However, it is difficult to evaluate the defects quantitatively. Thus, the metal oxide is sometimes evaluated in terms of not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

In the case where a metal oxide is used as the oxide 530, the metal oxide is an intrinsic (also referred to as i-type) or substantially intrinsic semiconductor that has a large band gap, and the carrier concentration of the metal oxide in the channel formation region is preferably lower than $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

In the case where a metal oxide is used as the oxide 530, contact between the oxide 530 and each of the conductor 542a and the conductor 542b may diffuse oxygen in the oxide 530 into the conductor 542a and the conductor 542b, resulting in oxidation of the conductor 542a and the conductor 542b in some cases. It is highly possible that oxidation of the conductor 542a and the conductor 542b lowers the conductivity of the conductor 542a and the conductor 542b. Note that diffusion of oxygen in the oxide 530 into the conductor 542a and the conductor 542b can be rephrased as absorption of oxygen in the oxide 530 by the conductor 542a and the conductor 542b.

When oxygen in the oxide 530 diffuses into the conductor 542a and the conductor 542b, a different layer is sometimes formed between the conductor 542a and the oxide 530b and between the conductor 542b and the oxide 530b. The different layer contains a larger amount of oxygen than the conductor 542a and the conductor 542b and thus presumably has an insulating property. In this case, a three-layer structure of the conductor 542a or the conductor 542b, the different layer, and the oxide 530b can be regarded as a three-layer structure of a metal, an insulator, and a semiconductor and is sometimes referred to as a MIS (Metal-Insulator-Semiconductor) structure or referred to as a diode-connected structure mainly formed of the MIS structure.

Note that the different layer is not necessarily formed between the oxide 530b and each of the conductor 542a and the conductor 542b; for example, the different layer is formed between the oxide 530c and each of the conductor 542a and the conductor 542b in some cases.

The metal oxide functioning as the channel formation region in the oxide 530 has a band gap of preferably 2 eV or more, further preferably 2.5 eV or more. The use of a metal oxide having a wide band gap can reduce the off-state current of the transistor.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic ratio of the element M to the constituent elements in the metal oxide used for the oxide 530a is preferably higher than the atomic ratio of the element M to the constituent elements in the metal oxide used for the oxide 530b. The atomic ratio of the element M to In in the metal oxide used for the oxide 530a is preferably higher than the atomic ratio of the element M to In in the metal oxide used for the oxide 530b. The atomic ratio of In to the element M in the metal oxide used for the oxide 530b is preferably higher than the atomic ratio of In to the element M in the metal oxide used for the oxide 530a. Moreover, a metal oxide that can be used as the oxide 530a or the oxide 530b can be used as the oxide 530c.

Specifically, as the oxide 530a, a metal oxide in which an atomic ratio of In to Ga and Zn is In:Ga:Zn=1:3:4 or 1:1:0.5 is used. As the oxide 530b, a metal oxide in which an atomic ratio of In to Ga and Zn is In:Ga:Zn=4:2:3 or 1:1:1 is used. As the oxide 530c, a metal oxide in which an atomic ratio of In to Ga and Zn is In:Ga:Zn=1:3:4 or an atomic ratio of Ga to Zn is Ga:Zn=2:1 or Ga:Zn=2:5 is used. Specific examples of the case where the oxide 530c has a stacked-layer structure include a stacked-layer structure of a layer in which an atomic ratio of In to Ga and Zn is In:Ga:Zn=4:2:3 and a layer with In:Ga:Zn=1:3:4; a stacked-layer structure of a layer in which an atomic ratio of Ga to Zn is Ga:Zn=2:1 and a layer in which an atomic ratio of In to Ga and Zn is In:Ga:Zn=4:2:3; a stacked-layer structure of a layer in which an atomic ratio of Ga to Zn is Ga:Zn=2:5 and a layer in which an atomic ratio of In to Ga and Zn is In:Ga:Zn=4:2:3; and a stacked-layer structure of gallium oxide and a layer in which an atomic ratio of In to Ga and Zn is In:Ga:Zn=4:2:3.

For example, in the case where the atomic ratio of In to the element M in the metal oxide used as the oxide 530a is lower than the atomic ratio of In to the element M in the metal oxide used as the oxide 530b, an In—Ga—Zn oxide having a composition with an atomic ratio of In:Ga:Zn=5:1:6 or a neighborhood thereof, In:Ga:Zn=5:1:3 or a neighborhood thereof, In:Ga:Zn=10:1:3 or a neighborhood thereof, or the like can be used as the oxide 530b.

As the oxide 530b, it is also possible to use a metal oxide having a composition of In:Zn=2:1, a composition of In:Zn=5:1, a composition of In:Zn=10:1, or a composition in the neighborhood of any one of these compositions, other than the above-described compositions.

The oxide 530a, the oxide 530b, and the oxide 530c are preferably combined to satisfy the above relation of the atomic ratios. For example, it is preferable that the oxide 530a and the oxide 530c each be a metal oxide having a composition of In:Ga:Zn=1:3:4 or a composition in the neighborhood thereof and the oxide 530b be a metal oxide having a composition of In:Ga:Zn=4:2:3 to 4:2:4.1 or a composition in the neighborhood thereof. Note that the above composition represents the atomic ratio of an oxide formed over a base or the atomic ratio of a sputtering target. Moreover, it is suitable that the proportion of In is increased in the composition of the oxide 530b because the transistor can have a higher on-state current, higher field-effect mobility, or the like.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the densities of defect states in mixed layers formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element as its component; an alloy containing any of the above metal elements in combination; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

The conductor 542a and the conductor 542b are illustrated to have a single-layer structure in FIG. 22A and FIG. 22B, but may have a stacked-layer structure of two or more layers. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 22A, a region 543a and a region 543b are sometimes formed as low-resistance regions at the interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover side surfaces of the oxide 530 and the insulator 524 and to be in contact with the insulator 522.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used as the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, impurities such as water and hydrogen contained in the insulator 580 can be inhibited from diffusing into the oxide 530b through the oxide 530c and the insulator 550. Furthermore, oxidation of the conductor 560 due to excess oxygen contained in the insulator 580 can be inhibited.

The insulator 550 functions as a first gate insulating film. The insulator 550 is preferably placed in contact with the inner side (the top surface and the side surface) of the oxide 530c. Like the insulator 524, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide each containing excess oxygen. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 into the conductor 560. Providing the metal oxide that inhibits diffusion of oxygen inhibits diffusion of excess oxygen from the insulator 550 into the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as leakage current might arise because of a thinner gate insulating film; for that reason, when the insulator functioning as the gate insulating film has a stacked-layer structure of a high-k material and a thermally stable material, a gate potential during transistor operation can be lowered while the physical thickness is kept. Furthermore, the stacked-layer structure can be thermally stable and have a high relative permittivity.

Although the conductor 560 functioning as the first gate electrode has a two-layer structure in FIG. 22A and FIG. 22B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, and the like), and a copper atom. Alternatively, it is preferable to use a conductive material having a function of inhibiting diffusion of oxygen (e.g., at least one of an oxygen atom and an oxygen molecule). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used. For the conductor 560a, the oxide semiconductor that can be used for the oxide 530 can be used. In that case, when the conductor 560b is deposited by a sputtering method, the conductor 560a can have a reduced value of electrical resistance to be a conductor. Such a conductor can be referred to as an OC (Oxide Conductor) electrode.

A conductive material containing tungsten, copper, or aluminum as its main component is preferably used for the conductor 560b. Furthermore, the conductor 560b also functions as a wiring, and thus a conductor having high conductivity is preferably used for the conductor 560b. For example, a conductive material containing tungsten, copper, or aluminum as its main component can be used. Moreover, the conductor 560b may have a stacked-layer structure, for example, a stacked-layer structure of titanium or titanium nitride and the above conductive material.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide are preferable because an excess-oxygen region can be easily formed in a later step.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be small for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, atop surface of the conductor 560, and atop surface of the insulator 550. When the insulator 574 is formed by a sputtering method, excess-oxygen regions can be provided in the insulator 550 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably reduced.

A conductor 540a and a conductor 540b are placed in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that are described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture, which are factors of a change in electrical characteristics of the transistor. Accordingly, aluminum oxide can prevent mixing of impurities such as hydrogen and moisture into the transistor 500 in the manufacturing process and after manufacturing of the transistor. In addition, release of oxygen from the oxide included in the transistor 500 can be inhibited. Therefore, aluminum oxide is suitably used for the protective film of the transistor 500.

An insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using materials similar to those for the conductor 328 and the conductor 330.

Note that after the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. In the case where an opening is formed to surround the transistor 500, for example, formation of an opening reaching the insulator 514 or the insulator 522 and the formation of the insulator having a high barrier property in contact with the insulator 514 or the insulator 522 are suitable because these formation steps can also serve as some of the manufacturing steps of the transistor 500. For the insulator having a high barrier property against hydrogen or water, a material similar to that for the insulator 522 can be used, for example.

Next, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 20; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, is used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a semiconductor device using a transistor including an oxide semiconductor. Alternatively, a semiconductor device using a transistor including an oxide semiconductor can be miniaturized or highly integrated.

Next, other structure examples of the OS transistor illustrated in FIG. 20 and FIG. 21 will be described.

Figure 23A:
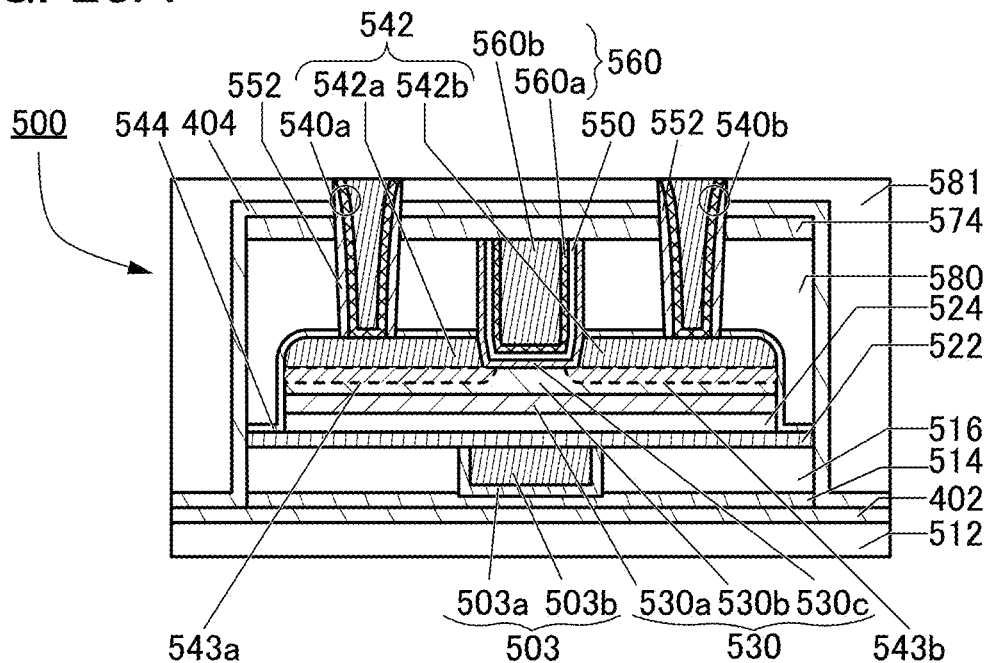
FIG. 23A and FIG. 23B are schematic cross-sectional views illustrating a structure example of a transistor.
Figure 23B:
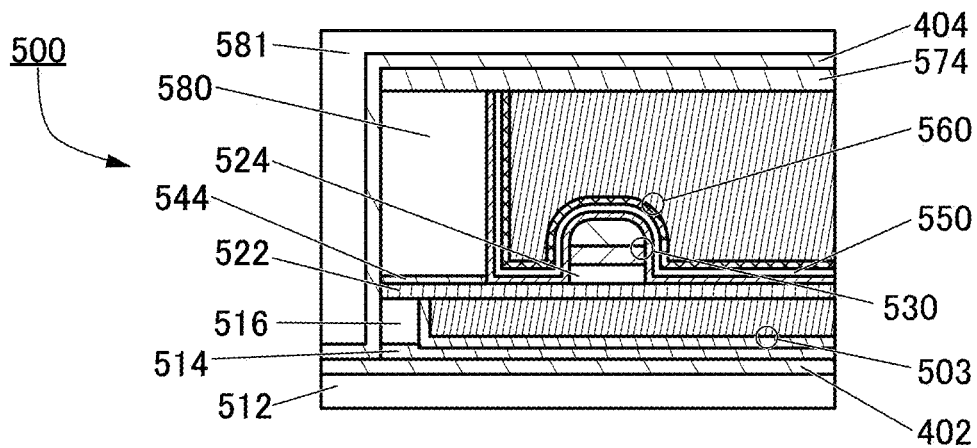

FIG. 23A and FIG. 23B illustrate a variation example of the transistor 500 illustrated in FIG. 22A and FIG. 22B. FIG. 23A is a cross-sectional view of the transistor 500 in the channel length direction, and FIG. 23B is a cross-sectional view of the transistor 500 in the channel width direction. Note that the structure illustrated in FIG. 23A and FIG. 23B can also be applied to other transistors, such as the transistor 300, included in the semiconductor device of one embodiment of the present invention.

The transistor 500 having the structure illustrated in FIG. 23A and FIG. 23B is different from the transistor 500 having the structure illustrated in FIG. 22A and FIG. 22B in including an insulator 402 and an insulator 404. Furthermore, the transistor 500 having the structure illustrated in FIG. 23A and FIG. 23B is different from the transistor 500 having the structure illustrated in FIG. 22A and FIG. 22B in that insulators 552 are provided in contact with a side surface of the conductor 540a and a side surface of the conductor 540b. Moreover, the transistor 500 having the structure illustrated in FIG. 23A and FIG. 23B is different from the transistor 500 having the structure illustrated in FIG. 22A and FIG. 22B in that the insulator 520 is not included.

In the transistor 500 having the structure illustrated in FIG. 23A and FIG. 23B, the insulator 402 is provided over the insulator 512. In addition, the insulator 404 is provided over the insulator 574 and the insulator 402.

In the transistor 500 having the structure illustrated in FIG. 23A and FIG. 23B, the insulator 514, the insulator 516, the insulator 522, the insulator 524, the insulator 544, the insulator 580, and the insulator 574 are provided and covered with the insulator 404. That is, the insulator 404 is in contact with the top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and the top surface of the insulator 402. Thus, the oxide 530 and the like are isolated from the outside by the insulator 404 and the insulator 402.

It is preferable that the insulator 402 and the insulator 404 have high capability of inhibiting diffusion of hydrogen (e.g., at least one of a hydrogen atom, a hydrogen molecule, and the like) or a water molecule. For example, the insulator 402 and the insulator 404 are preferably formed using silicon nitride or silicon nitride oxide with a high hydrogen barrier property. This can inhibit diffusion of hydrogen or the like into the oxide 530, whereby degradation of the characteristics of the transistor 500 can be inhibited. Consequently, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, for the insulator 552, an insulator such as silicon nitride, aluminum oxide, or silicon nitride oxide that is a material having a high hydrogen barrier property is preferably used. In particular, it is preferable to use silicon nitride for the insulator 552 because of its high hydrogen barrier property. By using a material having a high hydrogen barrier property for the insulator 552, diffusion of impurities such as water or hydrogen from the insulator 580 and the like into the oxide 530 through the conductor 540a and the conductor 540b can be inhibited. Furthermore, oxygen contained in the insulator 580 can be inhibited from being absorbed by the conductor 540a and the conductor 540b. As described above, the reliability of the semiconductor device of one embodiment of the present invention can be increased.

Figure 24:
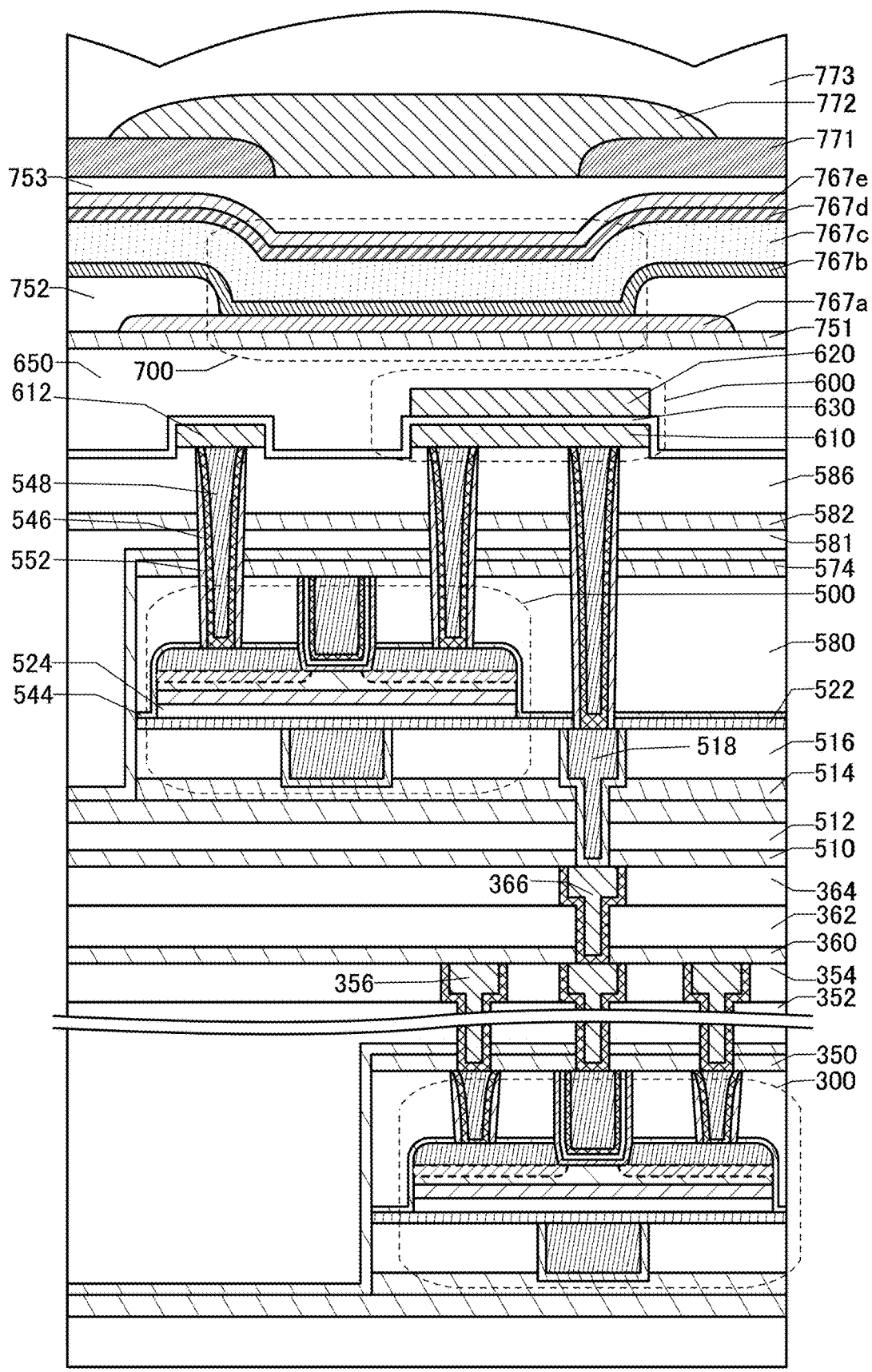
FIG. 24 is a schematic cross-sectional view illustrating a structure example of a semiconductor device.

FIG. 24 is a cross-sectional view showing a structure example of the semiconductor device in which the transistor 500 and the transistor 300 have the structure illustrated in FIG. 23A and FIG. 23B. The insulator 552 is provided on a side surface of the conductor 546.

Figure 25A:
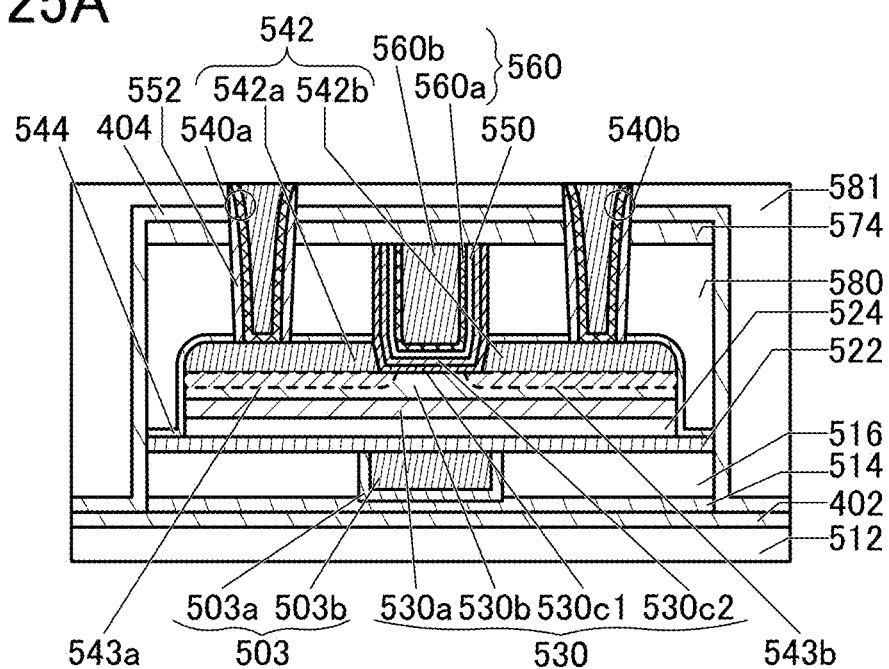
FIG. 25A and FIG. 25B are schematic cross-sectional views illustrating a structure example of a transistor.
Figure 25B:
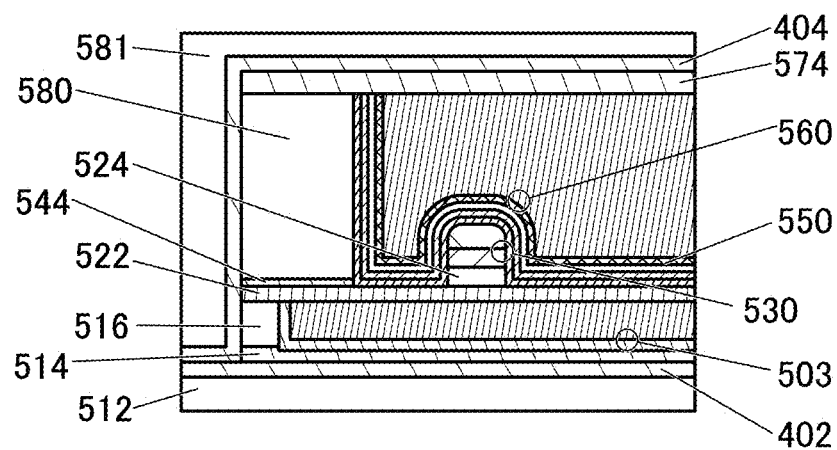

The transistor structure of the transistor 500 illustrated in FIG. 23A and FIG. 23B may be changed according to circumstances. As a variation example of the transistor 500 illustrated in FIG. 23A and FIG. 23B, a transistor illustrated in FIG. 25A and FIG. 25B can be employed, for example. FIG. 25A is a cross-sectional view of the transistor in the channel length direction, and FIG. 25B is a cross-sectional view of the transistor in the channel width direction. The transistor illustrated in FIG. 25A and FIG. 25B is different from the transistor illustrated in FIG. 23A and FIG. 23B in that the oxide 530c has a two-layer structure of an oxide 530c1 and an oxide 530c2.

The oxide 530c1 is in contact with the top surface of the insulator 524, a side surface of the oxide 530a, the top surface and a side surface of the oxide 530b, side surfaces of the conductor 542a and the conductor 542b, a side surface of the insulator 544, and a side surface of the insulator 580. The oxide 530c2 is in contact with the insulator 550.

An In—Zn oxide can be used as the oxide 530c1, for example. For the oxide 530c2, it is possible to use a material similar to the material that can be used for the oxide 530c when the oxide 530c has a single-layer structure. For example, as the oxide 530c2, a metal oxide with In:Ga:Zn=1:3:4 [atomic ratio], Ga:Zn=2:1 [atomic ratio], or Ga:Zn=2:5 [atomic ratio] can be used.

When the oxide 530c has a two-layer structure of the oxide 530c1 and the oxide 530c2, the on-state current of the transistor can be increased as compared with the case where the oxide 530c has a single-layer structure. Thus, the transistor can be used as a power MOS transistor, for example. Note that the oxide 530c included in the transistor having the structure illustrated in FIG. 22A and FIG. 22B can also have a two-layer structure of the oxide 530c1 and the oxide 530c2.

The transistor having the structure illustrated in FIG. 25A and FIG. 25B can be used as the transistor 300 illustrated in FIG. 20 or FIG. 21, for example. In addition, as described above, the transistor 300 can be used, for example, as a transistor included in the semiconductor device described in the above embodiments, such as the arithmetic circuit MAC1 to the arithmetic circuit MAC4 described in the above embodiments. Note that the transistor illustrated in FIG. 25A and FIG. 25B can be employed as a transistor included in the semiconductor device of one embodiment of the present invention, other than the transistor 300 and the transistor 500.

Figure 26:
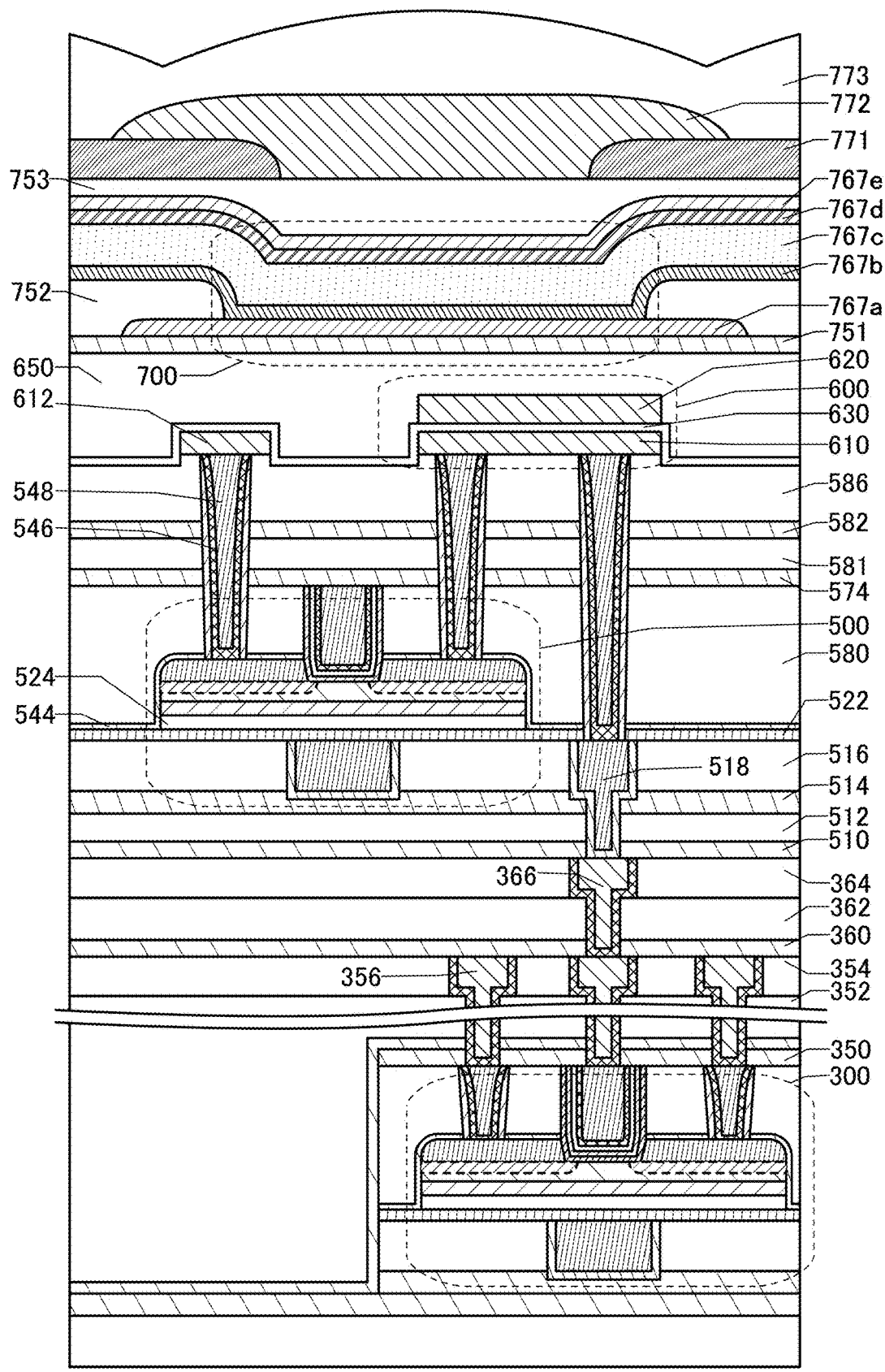
FIG. 26 is a schematic cross-sectional view illustrating a structure example of a semiconductor device.

FIG. 26 is a cross-sectional view showing a structure example of a semiconductor device in which the transistor 500 has the transistor structure illustrated in FIG. 22A and the transistor 300 has the transistor structure illustrated in FIG. 25A. Note that a structure is employed in which the insulator 552 is provided on the side surface of the conductor 546 as in FIG. 24. As illustrated in FIG. 26, in the semiconductor device of one embodiment of the present invention, the transistor 300 and the transistor 500 can have different structures while both the transistor 300 and the transistor 500 are OS transistors.

Next, a capacitor that can be used in the semiconductor devices in FIG. 20, FIG. 21, FIG. 24, and FIG. 26 will be described.

Figure 27A:
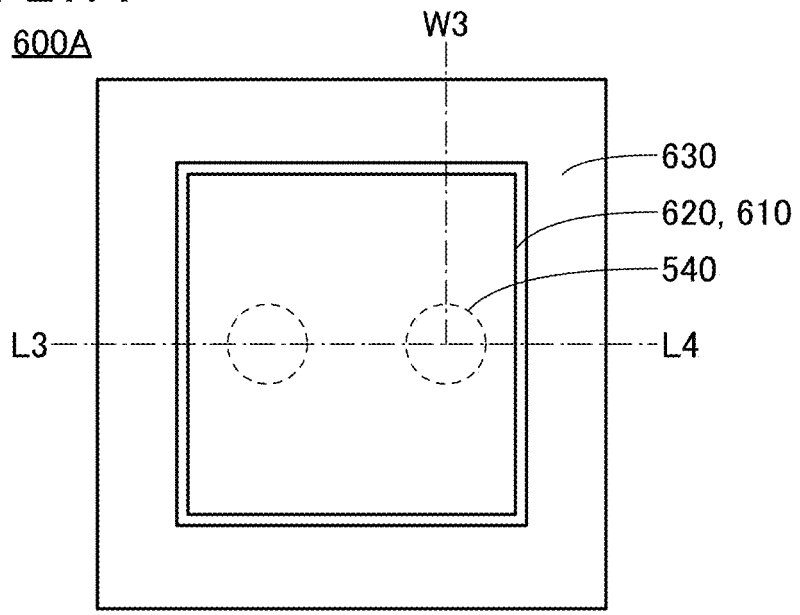
FIG. 27A is a top view illustrating a structure example of a capacitor.
Figure 27B:
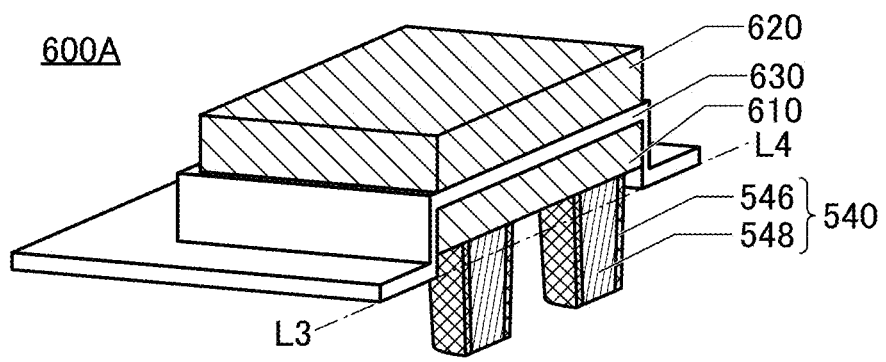
FIG. 27B and FIG. 27C are cross-sectional perspective views illustrating the structure example of the capacitor.
Figure 27C:
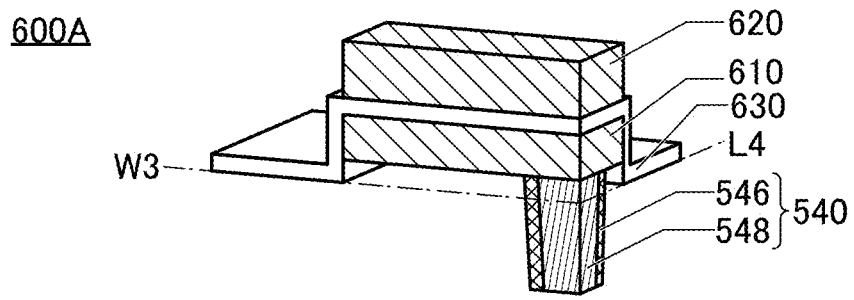

FIG. 27 illustrates a capacitor 600A as an example of the capacitor 600 that can be used in the semiconductor devices illustrated in FIG. 20, FIG. 21, FIG. 24, and FIG. 26. FIG. 27A is a top view of the capacitor 600A, FIG. 27B is a perspective view illustrating a cross section of the capacitor 600A along the dashed-dotted line L3-L4, and FIG. 27C is a perspective view illustrating a cross section of the capacitor 600A along the dashed-dotted line W3-L4.

The conductor 610 functions as one of a pair of electrodes of the capacitor 600A, and the conductor 620 functions as the other of the pair of electrodes of the capacitor 600A. The insulator 630 functions as a dielectric positioned between the pair of electrodes.

The insulator 630 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide.

Note that in this specification, hafnium oxynitride refers to a material that contains oxygen at a higher proportion than nitrogen, and hafnium nitride oxide refers to a material that contains nitrogen at a higher proportion than oxygen.

As another example, the insulator 630 may have a stacked-layer structure using a material with high dielectric strength, such as silicon oxynitride, and a high permittivity (high-k) material. In the capacitor 600A having such a structure, a sufficient capacitance can be ensured owing to the high permittivity (high-k) insulator, and the dielectric strength can be increased owing to the insulator with high dielectric strength; hence, the electrostatic breakdown of the capacitor 600A can be inhibited.

Examples of the insulator of a high permittivity (high-k) material (a material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Alternatively, for example, a single layer or stacked layers of an insulator containing a high-k material such as aluminum oxide, hafnium oxide, tantalum oxide, zirconium oxide, lead zirconate titanate (PZT), strontium titanate ($SrTiO_3$), or (Ba,Sr)$TiO_3$ (BST) may be used as the insulator 630. In the case where the insulator 630 has stacked layers, a three-layer structure in which zirconium oxide, aluminum oxide, and zirconium oxide are formed in this order, or a four-layer structure in which zirconium oxide, aluminum oxide, zirconium oxide, and aluminum oxide are formed in this order can be employed, for example. For the insulator 630, a compound containing hafnium and zirconium may be used, for example. As miniaturization and high integration of semiconductor devices progress, a problem such as leakage current from a transistor and a capacitor might arise because of a thinner gate insulator and a thinner dielectric used in the capacitor. When a high-k material is used as an insulator functioning as the gate insulator and the dielectric used in the capacitor, a gate potential during operation of the transistor can be lowered and the capacitance of the capacitor can be ensured while the physical thicknesses of the gate insulator and the dielectric are maintained.

A bottom portion of the conductor 610 in the capacitor 600 is electrically connected to the conductor 546 and the conductor 548. The conductor 546 and the conductor 548 function as plugs or wirings for connection to another circuit element. In FIG. 27A to FIG. 27C, the conductor 546 and the conductor 548 are collectively denoted as a conductor 540.

For clarification of the drawing, the insulator 586 in which the conductor 546 and the conductor 548 are embedded and the insulator 650 that covers the conductor 620 and the insulator 630 are omitted in FIG. 27.

Although the capacitor 600 illustrated in FIG. 20, FIG. 21, FIG. 24, FIG. 26, FIG. 27A, FIG. 27B, and FIG. 27C is a planar capacitor, the shape of the capacitor is not limited thereto. For example, the capacitor 600 may be a cylindrical capacitor 600B illustrated in FIG. 28A to FIG. 28C.

Figure 28A:
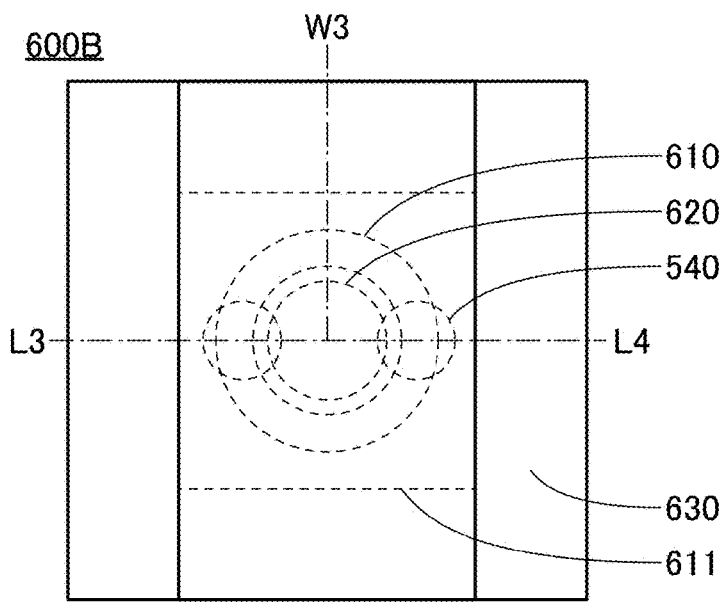
FIG. 28A is a top view illustrating a structure example of a capacitor.
Figure 28B:
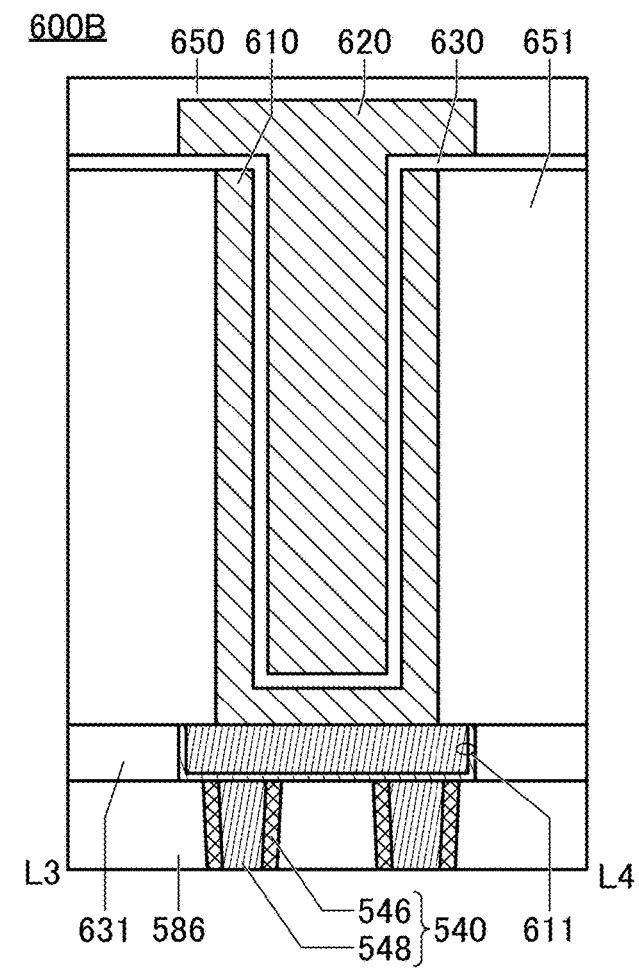
FIG. 28B is a cross-sectional view illustrating the structure example of the capacitor.
Figure 28C:
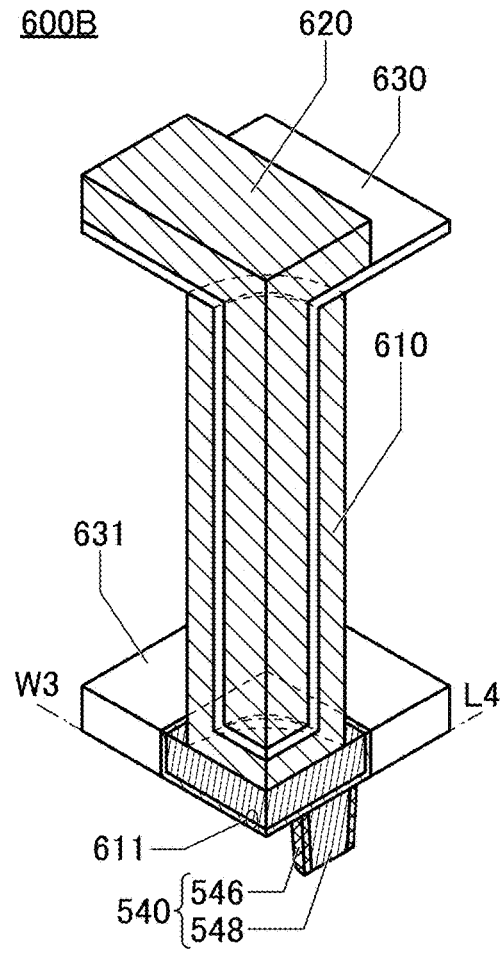
FIG. 28C is a cross-sectional perspective view illustrating the structure example of the capacitor.

FIG. 28A is a top view of the capacitor 600B, FIG. 28B is a cross-sectional view of the capacitor 600B along the dashed-dotted line L3-L4, and FIG. 28C is a perspective view illustrating a cross section of the capacitor 600B along the dashed-dotted line W3-L4.

In FIG. 28B, the capacitor 600B includes an insulator 631 over the insulator 586 in which the conductor 540 is embedded, an insulator 651 having an opening portion, the conductor 610 functioning as one of a pair of electrodes, and the conductor 620 functioning as the other of the pair of electrodes.

For clarification of the drawing, the insulator 586, an insulator 650, and the insulator 651 are omitted in FIG. 28C.

For the insulator 631, a material similar to that for the insulator 586 can be used, for example.

A conductor 611 is embedded in the insulator 631 to be electrically connected to the conductor 540. For the conductor 611, a material similar to those for the conductor 330 and the conductor 518 can be used, for example.

For the insulator 651, a material similar to that for the insulator 586 can be used, for example.

The insulator 651 has an opening portion as described above, and the opening portion overlaps with the conductor 611.

The conductor 610 is formed on the bottom portion and the side surface of the opening portion. In other words, the conductor 610 overlaps with the conductor 611 and is electrically connected to the conductor 611.

The conductor 610 is formed in such a manner that an opening portion is formed in the insulator 651 by an etching method or the like, and then the conductor 610 is formed by a sputtering method, an ALD method, or the like. After that, the conductor 610 formed over the insulator 651 can be removed by a CMP (Chemichal Mechanical Polishing) method or the like while the conductor 610 formed in the opening portion is left.

The insulator 630 is positioned over the insulator 651 and the formation surface of the conductor 610. Note that the insulator 630 functions as a dielectric positioned between the pair of electrodes in the capacitor.

The conductor 620 is formed over the insulator 630 so as to fill the opening portion of the insulator 651.

The insulator 650 is formed to cover the insulator 630 and the conductor 620.

The electrostatic capacitance of the cylindrical capacitor 600B illustrated in FIG. 28 can be higher than that of the planar capacitor 600A.

Next, the photoelectric conversion element 700 provided above the capacitor 600 in FIG. 20, FIG. 21, FIG. 24, and FIG. 26 will be described.

The photoelectric conversion element 700 includes a layer 767a, a layer 767b, a layer 767c, a layer 767d, and a layer 767e, for example.

The photoelectric conversion element 700 illustrated in FIG. 20, FIG. 21, FIG. 24, and FIG. 26 is an example of an organic optical conductive film. The layer 767a is a lower electrode, the layer 767e is an upper electrode having a light-transmitting property, and the layer 767b, the layer 767c, and the layer 767d correspond to a photoelectric conversion portion. Note that instead of the photoelectric conversion element 700 illustrated in FIG. 20, FIG. 21, FIG. 24, and FIG. 26, a PN junction photodiode, an avalanche photodiode, or the like may be used, for example.

The layer 767a serving as the lower electrode can be one of an anode and a cathode, and the layer 767b serving as the upper electrode can be the other of the anode and the cathode. Note that in this embodiment, the layer 767a is the cathode and the layer 767b is the anode.

The layer 767a is preferably a low-resistance metal layer or the like, for example. Specifically, for example, aluminum, titanium, tungsten, tantalum, silver, or a stack thereof can be used as the layer 767a.

As the layer 767e, for example, a conductive layer having a high visible-light-transmitting property is preferably used. Specifically, for example, indium oxide, tin oxide, zinc oxide, indium tin oxide, gallium zinc oxide, indium gallium zinc oxide, graphene, or the like can be used for the layer 767e. Note that the layer 767e can be omitted.

One of the layer 767b and the layer 767d in the photoelectric conversion portion can be a hole-transport layer and the other can be an electron-transport layer. The layer 767c can be a photoelectric conversion layer.

For the hole-transport layer, molybdenum oxide can be used, for example. For the electron-transport layer, fullerene such as $C_{60}$ or $C_{70}$, or a derivative thereof can be used, for example.

As the photoelectric conversion layer, a mixed layer of an n-type organic semiconductor and a p-type organic semiconductor (a bulk heterojunction structure) can be used.

In the semiconductor devices in FIG. 20, FIG. 21, FIG. 24, and FIG. 26, an insulator 751 is provided over the insulator 650, and the layer 767a is provided over the insulator 751. An insulator 752 is provided over the insulator 751 and the layer 767a. The layer 767b is provided over the insulator 752 and the layer 767a.

The layer 767c, the layer 767d, the layer 767e, and an insulator 753 are provided in this order to be stacked over the layer 767b.

The insulator 751 functions as an interlayer insulating film, for example. Like the insulator 324, the insulator 751 is preferably formed using an insulator having a barrier property against hydrogen, for example. The use of an insulator having a barrier property against hydrogen as the insulator 751 can inhibit diffusion of hydrogen into the transistor 500. Thus, the insulator 751 can be formed using any of the materials that can be used for the insulator 324, for example.

The insulator 752 functions as an element isolation layer, for example. The insulator 752 is provided to prevent a short circuit with an adjacent photoelectric conversion element, which is not illustrated. An organic insulator or the like is preferably used as the insulator 752, for example.

The insulator 753 functions as a planarization film having a light-transmitting property, for example. The insulator 753 can be formed using a material such as silicon oxide, silicon oxynitride, silicon nitride oxide, or silicon nitride, for example.

A light-blocking layer 771, an optical conversion layer 772, and a microlens array 773 are provided above the insulator 753, for example.

The light-blocking layer 771 provided over the insulator 753 can suppress entry of light into an adjacent pixel. As the light-blocking layer 771, a metal layer of aluminum, tungsten, or the like can be used. Alternatively, the metal layer and a dielectric film having a function of an anti-reflection film may be stacked.

A color filter can be used as the optical conversion layer 772 provided over the insulator 753 and the light-blocking layer 771. When colors of R (red), G (green), B (blue), Y (yellow), C (cyan), M (magenta), and the like are assigned to the color filters of respective pixels, a color image can be obtained.

When a wavelength cut filter is used as the optical conversion layer 772, the imaging device can capture images in various wavelength regions.

For example, when a filter that blocks light having a wavelength shorter than or equal to that of visible light is used as the optical conversion layer 772, an infrared imaging device can be obtained. When a filter that blocks light having a wavelength shorter than or equal to that of near infrared light is used as the optical conversion layer 772, a far-infrared imaging device can be obtained. When a filter that blocks light having a wavelength longer than or equal to that of visible light is used as the optical conversion layer 772, an ultraviolet imaging device can be obtained.

Furthermore, when a scintillator is used for the optical conversion layer 772, it is possible to achieve an imaging device that obtains an image visualizing the intensity of radiation, which is used for an X-ray imaging device or the like. Radiation such as X-rays passes through an object and enters the scintillator, and then is converted into light (fluorescence) such as visible light or ultraviolet light owing to a photoluminescence phenomenon. Then, the photoelectric conversion element 700 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light, ultraviolet light, or the like. For example, it is possible to use a resin or ceramics in which $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, ZnO, or the like is dispersed.

The microlens array 773 is provided over the light-blocking layer 771 and the optical conversion layer 772. Light passing through an individual lens of the microlens array 773 goes through the optical conversion layer 772 directly under the lens, and the photoelectric conversion element 700 is irradiated with the light. With the microlens array 773, collected light can be incident on the photoelectric conversion element 700; thus, photoelectric conversion can be efficiently performed. The microlens array 773 is preferably formed using a resin, glass, or the like with a high visible-light-transmitting property.

Although FIG. 20, FIG. 21, FIG. 24, and FIG. 26 each illustrate the structure of the semiconductor device in which the photoelectric conversion element 700 using an organic optical conductive film is provided above the transistor 300 and the transistor 500, the semiconductor device of one embodiment of the present invention is not limited thereto. For example, the semiconductor device of one embodiment of the present invention may be provided with a back-surface irradiation type PN junction photoelectric conversion element instead of the photoelectric conversion element 700.

Figure 29:
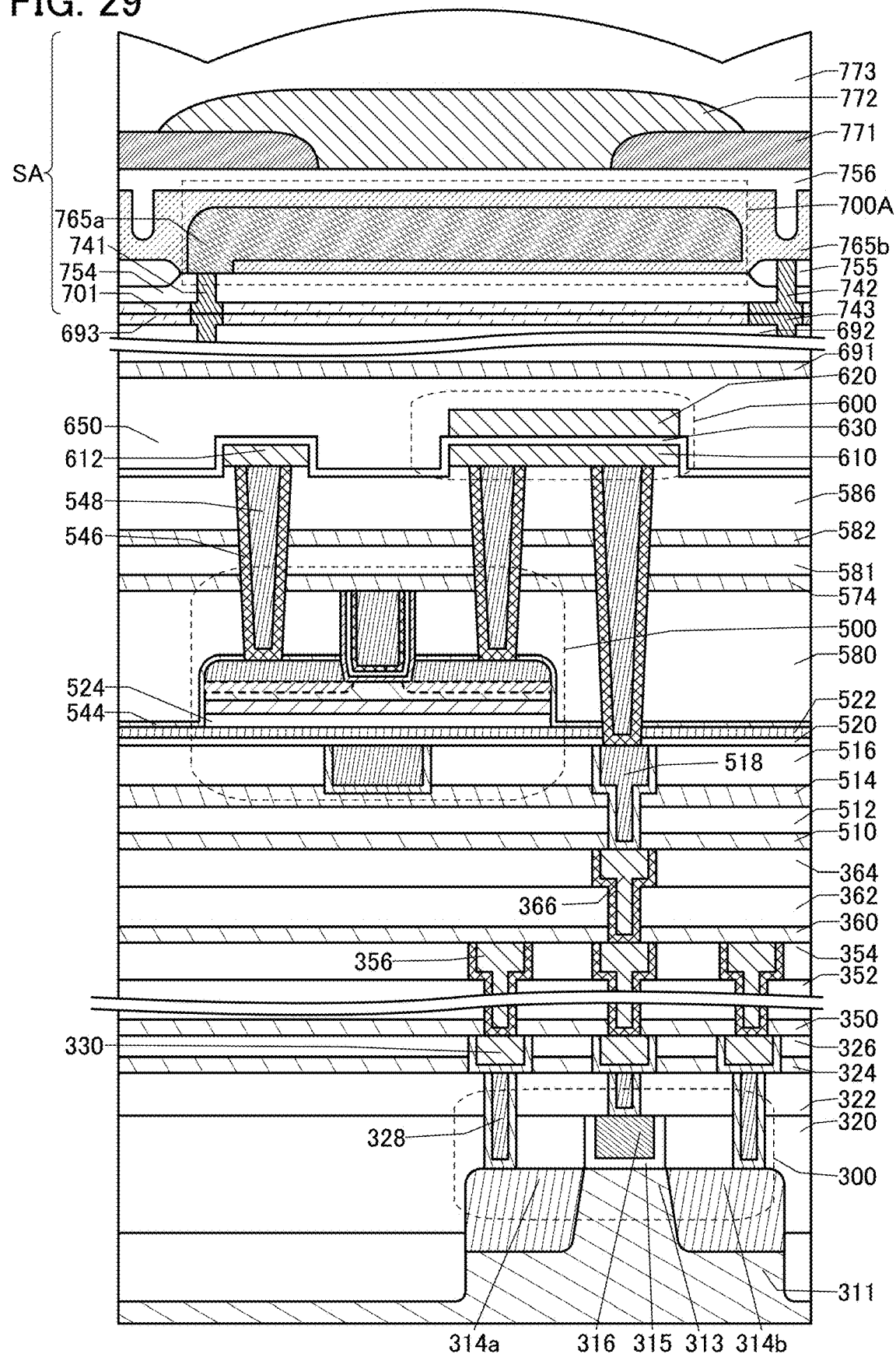
FIG. 29 is a schematic cross-sectional view illustrating a structure example of a semiconductor device.

FIG. 29 illustrates a structure example of a semiconductor device in which a back-surface irradiation type pn-junction photoelectric conversion element 700A is provided above the transistor 300 and the transistor 500. In the semiconductor device illustrated in FIG. 29, a component SA including the photoelectric conversion element 700A is attached onto the substrate 311 where the transistor 300, the transistor 500, and the capacitor 600 are provided.

Note that the component SA includes the light-blocking layer 771, the optical conversion layer 772, and the microlens array 773; the above description can be referred to for these components.

The photoelectric conversion element 700A is a PN junction photodiode formed on a silicon substrate and includes a layer 765b corresponding to a p-type region and a layer 765a corresponding to an n-type region. The photoelectric conversion element 700A is a pinned photodiode and can suppress a dark current and reduce noise with a thin p-type region (part of the layer 765b) provided on the surface side (current extraction side) of the layer 765a.

An insulator 701, a conductor 741, and a conductor 742 each have a function of a bonding layer. An insulator 754 has functions of an interlayer insulating film and a planarization film. An insulator 755 has a function of an element isolation layer. An insulator 756 has a function of suppressing carrier leakage.

The silicon substrate is provided with a groove that separates pixels, and the insulator 756 is provided on the top surface of the silicon substrate and in the groove. The insulator 756 can suppress leakage of carriers generated in the photoelectric conversion element 700A to an adjacent pixel. The insulator 756 also has a function of suppressing entry of stray light. Therefore, color mixture can be suppressed with the insulator 756. Note that an anti-reflection film may be provided between the top surface of the silicon substrate and the insulator 756.

The element isolation layer can be formed by a LOCOS (LOCal Oxidation of Silicon) method. Alternatively, an STI (Shallow Trench Isolation) method or the like may be used to form the element isolation layer. As the insulator 756, for example, an inorganic insulating film of silicon oxide, silicon nitride, or the like or an organic insulating film of polyimide, acrylic, or the like can be used. The insulator 756 may have a multilayer structure.

The layer 765a (corresponding to the n-type region and the cathode) of the photoelectric conversion element 700A is electrically connected to the conductor 741. The layer 765b (corresponding to the p-type region and the anode) is electrically connected to the conductor 742. The conductor 741 and the conductor 742 each include a region embedded in the insulator 701. Furthermore, surfaces of the insulator 701, the conductor 741, and the conductor 742 are planarized to be level with each other.

An insulator 691 and an insulator 692 are stacked in this order above the insulator 650. An opening portion is provided in the insulator 691 and the insulator 692, and a conductor 743 is formed to fill the opening portion.

For the insulator 691, the material usable for the insulator 751 can be used, for example.

For the insulator 692, the material usable for the insulator 650 can be used, for example.

The insulator 693 and the insulator 701 each function as part of a bonding layer. In addition, the conductor 741, the conductor 742, and the conductor 743 each function as part of a bonding layer.

For example, silicon oxide, silicon oxynitride, silicon nitride oxide, silicon nitride, titanium nitride, or the like can be used for the insulator 693 and the insulator 701. Since the insulator 693 and the insulator 701 are bonded to each other, it is particularly preferable that the insulator 693 and the insulator 701 be formed using the same components.

For example, copper, aluminum, tin, zinc, tungsten, silver, platinum, gold, or the like can be used for the conductor 741, the conductor 742, and the conductor 743. It is particularly preferable to use copper, aluminum, tungsten, or gold for easy bonding of the conductor 741 and the conductor 743, and the conductor 742 and the conductor 743.

The conductor 741, the conductor 742, and the conductor 743 may each have a multilayer structure including a plurality of layers. For example, a first conductor may be formed on the side surface of the opening portion in which the conductor 741, the conductor 742, or the conductor 743 is provided, and then a second conductor may be formed to fill the opening portion. A conductor having a barrier property against hydrogen, such as tantalum nitride, can be used as the first conductor, and tungsten with high conductivity can be used as the second conductor, for example.

In a pre-process for bonding the bonding layer on the substrate 311 side and the bonding layer on the component SA side, the surfaces of the insulator 693 and the conductor 743 are planarized so that they are level with each other on the substrate 311 side. Similarly, the surfaces of the insulator 701, the conductor 741, and the conductor 742 are planarized so that they are level with each other on the component SA side.

In the case where bonding of the insulator 693 and the insulator 701, i.e., bonding of the insulating layers, is performed in the bonding step, a hydrophilic bonding method or the like can be employed in which, after high planarity is obtained by polishing or the like, the surfaces subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When bonding of the conductor 741 and the conductor 743 and bonding of the conductor 742 and the conductor 743, i.e., bonding of the conductors, are performed, for example, a surface activated bonding method can be used in which an oxide film, a layer adsorbing impurities, and the like on the surface are removed by sputtering processing or the like and the cleaned and activated surfaces are brought into contact to be bonded to each other. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

Through the above-described bonding step, the conductor 743 on the substrate 311 side can be electrically connected to the conductor 741 and the conductor 742 on the component SA side. In addition, mechanically strong connection can be established between the insulator 693 on the substrate 311 side and the insulator 701 on the component SA side.

When the substrate 311 and the component SA are bonded to each other, the insulating layers and the metal layers coexist on their bonding surfaces; therefore, the surface activated bonding method and the hydrophilic bonding method are performed in combination, for example.

For example, it is possible to use a method in which the surfaces are made clean after polishing, the surfaces of the metal layers are subjected to antioxidant treatment followed by hydrophilicity treatment, and then bonding is performed. Furthermore, hydrophilicity treatment may be performed on the surfaces of the metal layers being a hardly oxidizable metal such as gold. Note that a bonding method other than the above-mentioned methods may be used.

Note that this embodiment can be implemented in appropriate combination with the other embodiments described in this specification.

Embodiment 6

Described in this embodiment is a metal oxide (hereinafter also referred to as an oxide semiconductor) that can be used in an OS transistor described in the above embodiment.

The metal oxide preferably contains at least indium or zinc. In particular, indium and zinc are preferably contained. In addition to them, aluminum, gallium, yttrium, tin, or the like is preferably contained. Furthermore, one kind or two or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of crystal structures of an oxide semiconductor is described with reference to FIG. 30A. FIG. 30A is a diagram showing classification of crystal structures of an oxide semiconductor, typically IGZO (a metal oxide containing In, Ga, and Zn).

As shown in FIG. 30A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite). Note that the term "Crystalline" excludes single crystal, poly crystal, and completely amorphous. The term "Crystal" includes single crystal and poly crystal.

Note that the structures in the thick frame in FIG. 30A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 30B shows an XRD spectrum, which is obtained using GIXD (Grazing-Incidence XRD) measurement, of a CAAC-IGZO film classified into "Crystalline" (the vertical axis represents intensity in arbitrary unit (a.u.)). Note that a GIXD method is also referred to as a thin film method or a Seemann-Bohlin method. The XRD spectrum that is shown in FIG. 30B and obtained by GIXD measurement is hereinafter simply referred to as an XRD spectrum. The CAAC-IGZO film in FIG. 30B has a composition in the vicinity of In:Ga:Zn=4:2:3 [atomic ratio]. The CAAC-IGZO film in FIG. 30B has a thickness of 500 nm.

As shown in FIG. 30B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 30B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 30C shows a diffraction pattern of a CAAC-IGZO film. FIG. 30C shows a diffraction pattern obtained with the NBED method in which an electron beam is incident in the direction parallel to the substrate. The CAAC-IGZO film in FIG. 30C has a composition in the vicinity of In:Ga:Zn=4:2:3 [atomic ratio]. In the nanobeam electron diffraction method, electron diffraction is performed with a probe diameter of 1 nm.

As shown in FIG. 30C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 30A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region with a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one kind or two or more kinds selected from aluminum, gallium, yttrium, tin, titanium, and the like), the CAAC-OS tends to have a layered crystal structure (also referred to as a layered structure) in which layers containing indium (In) and oxygen (hereinafter In layers) and layers containing the element M, zinc (Zn), and oxygen (hereinafter (M,Zn) layers) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for an OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has a higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. As another example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (p), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by SIMS) are set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type because of generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be implemented in appropriate combination with the other embodiments described in this specification.

Embodiment 7

In this embodiment, examples of a semiconductor wafer where the semiconductor device or the like described in the above embodiment is formed and electronic components incorporating the semiconductor device will be described.

<Semiconductor Wafer>

First, an example of a semiconductor wafer where a semiconductor device or the like is formed is described with reference to FIG. 31A.

Figure 31A:
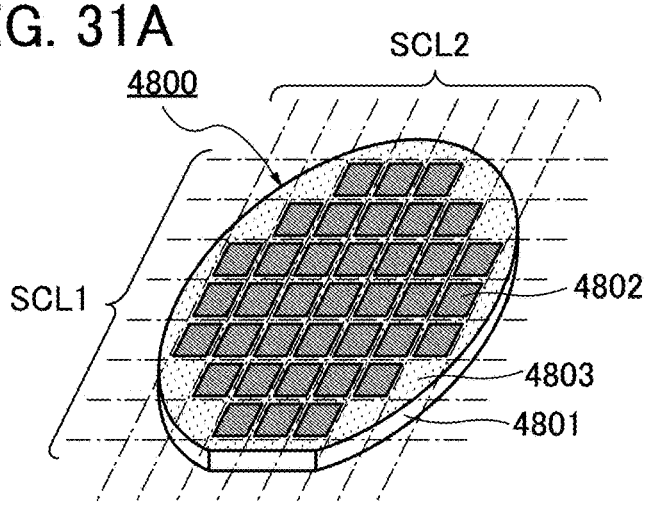
FIG. 31A is a perspective view illustrating an example of a semiconductor wafer.

A semiconductor wafer 4800 illustrated in FIG. 31A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on a surface of the wafer 4801 by a wafer process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated with dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

Figure 31B:
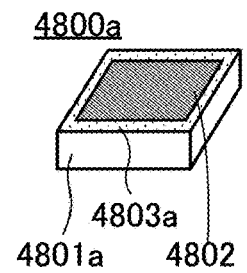
FIG. 31B is a perspective view illustrating an example of a chip.

With the dicing step, a chip 4800a as illustrated in FIG. 31B can be cut out from the semiconductor wafer 4800. The chip 4800a includes a wafer 4801a, the circuit portion 4802, and a spacing 4803a. Note that it is preferable to make the spacing 4803a as small as possible. In this case, the width of the spacing 4803 between adjacent circuit portions 4802 is substantially the same as a cutting allowance of the scribe line SCL1 or a cutting allowance of the scribe line SCL2.

Note that the shape of an element substrate of one embodiment of the present invention is not limited to the shape of the semiconductor wafer 4800 illustrated in FIG. 31A. The element substrate may be a rectangular semiconductor wafer, for example. The shape of the element substrate can be changed as appropriate, depending on a manufacturing process of an element and an apparatus for manufacturing the element.

<Electronic Component>

Figure 31C:
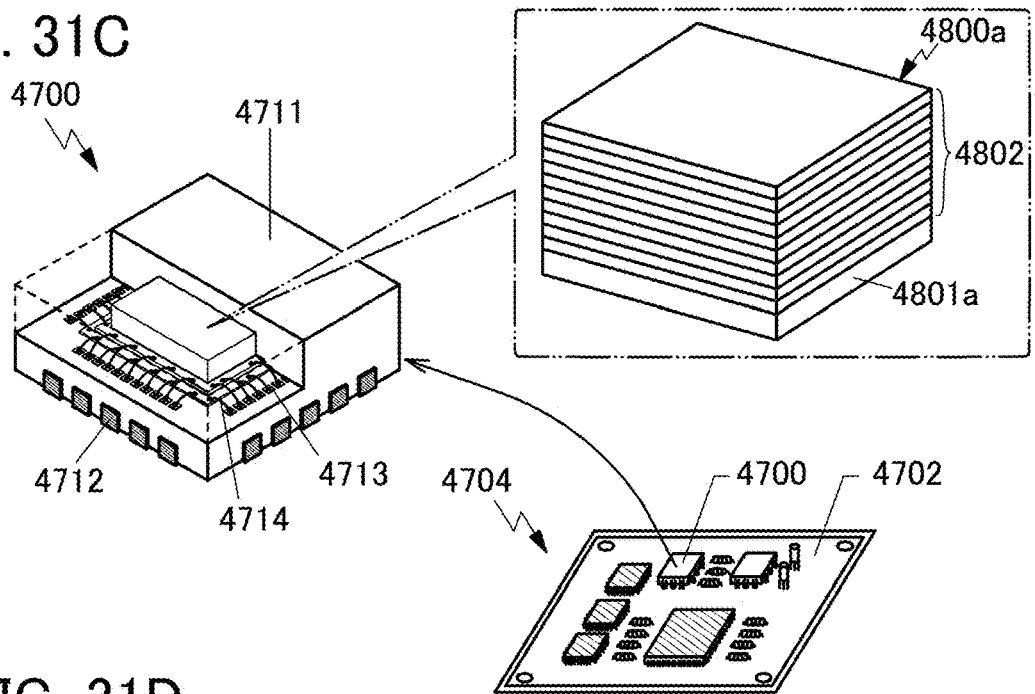
FIG. 31C and FIG. 31D are perspective views illustrating examples of electronic components.

FIG. 31C is a perspective view of an electronic component 4700 and a substrate (a mounting board 4704) on which the electronic component 4700 is mounted. The electronic component 4700 illustrated in FIG. 31C includes the chip 4800a in a mold 4711. Note that the chip 4800a may have a structure in which the circuit portions 4802 are stacked as illustrated in FIG. 31C. To illustrate the inside of the electronic component 4700, some portions are omitted in FIG. 31C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, whereby the mounting board 4704 is completed.

Figure 31D:
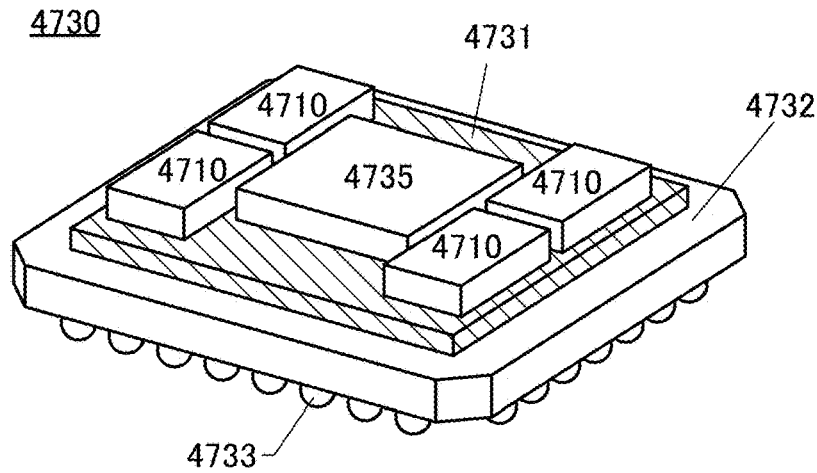

FIG. 31D is a perspective view of an electronic component 4730. The electronic component 4730 is an example of a SiP (System in Package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor device 4710 include the semiconductor device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings have a single-layer structure or a layered structure. Moreover, the interposer 4731 has a function of electrically connecting an integrated circuit provided on the interposer 4731 to an electrode provided on the package substrate 4732. Accordingly, the interposer is sometimes referred to as a redistribution substrate or an intermediate substrate. A through electrode is provided in the interposer 4731 and used to electrically connect an integrated circuit and the package substrate 4732 in some cases. In the case of using a silicon interposer, a TSV (Through Silicon Via) can also be used as the through electrode.

A silicon interposer is preferably used as the interposer 4731. The silicon interposer can be manufactured at lower cost than an integrated circuit because it is not necessary to provide an active element. Meanwhile, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, a surface of a silicon interposer has high planarity; hence, a poor connection between the silicon interposer and an integrated circuit provided thereon is less likely to occur. It is particularly preferable to use a silicon interposer for a 2.5D package (2.5D mounting) in which a plurality of integrated circuits are arranged side by side on the interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 31D shows an example in which the electrode 4733 is formed of a solder ball. The solder balls are provided in a matrix on the bottom portion of the package substrate 4732, whereby BGA (Ball Grid Array) mounting can be achieved. Alternatively, the electrode 4733 may be formed of a conductive pin. When the conductive pins are provided in a matrix on the bottom portion of the package substrate 4732, PGA (Pin Grid Array) mounting can be achieved.

The electronic component 4730 can be mounted on another substrate by any of various mounting methods other than BGA and PGA. For example, amounting method such as an SPGA (Staggered Pin Grid Array), an LGA (Land Grid Array), a QFP (Quad Flat Package), a QFJ (Quad Flat J-leaded package), or a QFN (Quad Flat Non-leaded package) can be employed.

Next, an electronic component including an image sensor chip (an imaging device) that includes a photoelectric conversion element will be described.

Figure 32A:
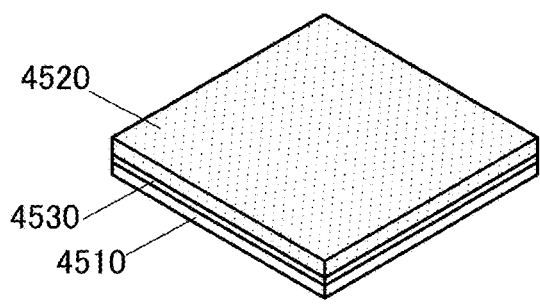
FIG. 32A to FIG. 32F are perspective views illustrating a package and a module each including an imaging device.

FIG. 32A is an external perspective view of the top surface side of a package in which an image sensor chip is placed. The package includes a package substrate 4510 to which an image sensor chip 4550 (see FIG. 32C) is fixed, a cover glass 4520, an adhesive 4530 for bonding them, and the like.

Figure 32D:
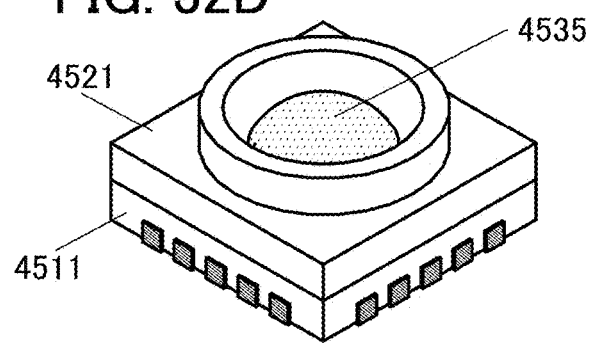
Figure 32B:
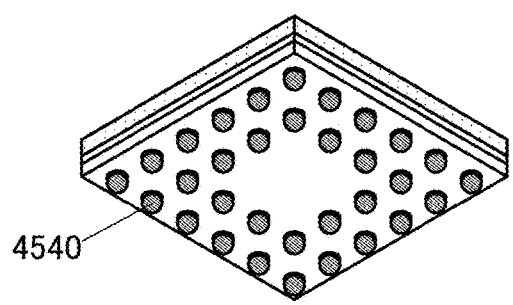

FIG. 32B is an external perspective view of the bottom surface side of the package. A BGA (Ball Grid Array) in which solder balls are used as bumps 4540 on the bottom surface of the package is employed. Note that other than the BGA, an LGA (Land Grid Array), a PGA (Pin Grid Array), or the like may be employed.

Figure 32E:
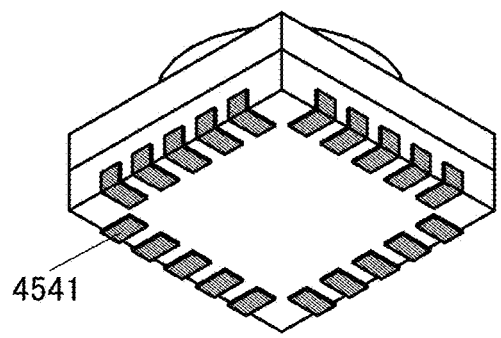
Figure 32C:
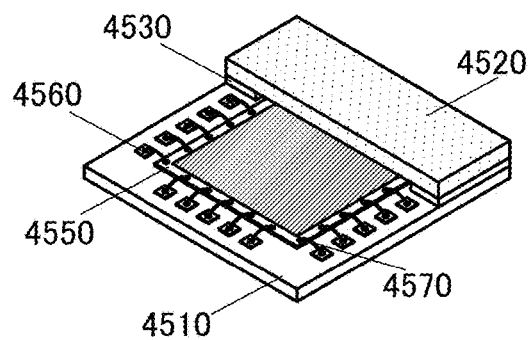

FIG. 32C is a perspective view of the package, in which parts of the cover glass 4520 and the adhesive 4530 are not illustrated. Electrode pads 4560 are formed over the package substrate 4510, and the electrode pads 4560 and the bumps 4540 are electrically connected to each other via through-holes. The electrode pads 4560 are electrically connected to the image sensor chip 4550 through wires 4570.

FIG. 32D is an external perspective view of the top surface side of a camera module in which an image sensor chip is placed in a package with a built-in lens. The camera module includes a package substrate 4511 to which an image sensor chip 4551 (FIG. 32F) is fixed, a lens cover 4521, a lens 4535, and the like. An IC chip 4590 (FIG. 32F) having functions of a driver circuit, a signal conversion circuit, and the like of an imaging device is provided between the package substrate 4511 and the image sensor chip 4551; thus, the structure as an SiP (System in Package) is included.

FIG. 32E is an external perspective view of the bottom surface side of the camera module. A QFN (Quad Flat No-lead package) structure in which lands 4541 for mounting are provided on the bottom surface and side surfaces of the package substrate 4511 is employed. Note that this structure is an example, and a QFP (Quad Flat Package) or the above-mentioned BGA may also be employed.

Figure 32F:
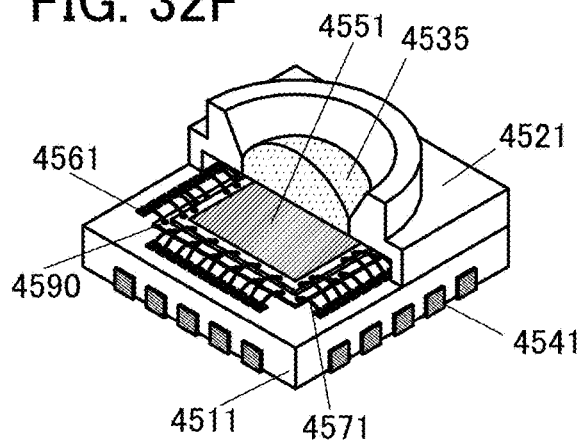

FIG. 32F is a perspective view of the module, in which parts of the lens cover 4521 and the lens 4535 are not illustrated. The lands 4541 are electrically connected to electrode pads 4561, and the electrode pads 4561 are electrically connected to the image sensor chip 4551 or the IC chip 4590 through wires 4571.

The image sensor chip placed in a package having the above form can be easily mounted on a printed circuit board and the like; hence, the image sensor chip can be incorporated into a variety of semiconductor devices and electronic devices.

Note that this embodiment can be implemented in appropriate combination with the other embodiments described in this specification.

Embodiment 8

Figure 33:
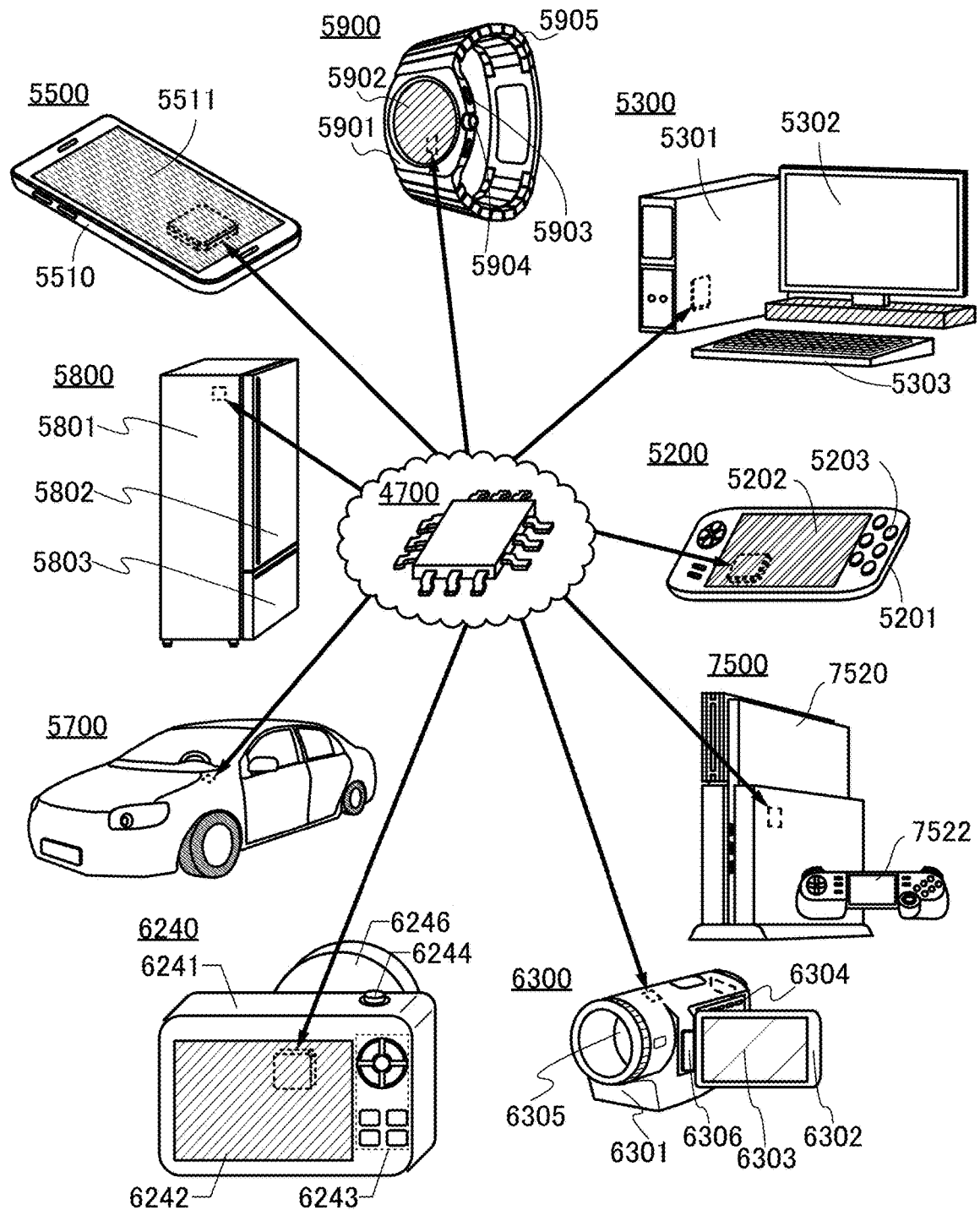
FIG. 33 is a perspective view illustrating examples of electronic devices.

In this embodiment, examples of electronic devices each including the semiconductor device described in the above embodiment will be described. FIG. 33 illustrates electronic devices each including the electronic component 4700 including the semiconductor device.

[Mobile Phone]

An information terminal 5500 illustrated in FIG. 33 is a mobile phone (a smartphone), which is a type of portable information terminal. The information terminal 5500 includes a housing 5510 and a display portion 5511, and as input interfaces, a touch panel is provided in the display portion 5511 and a button is provided in the housing 5510.

The information terminal 5500 can execute an application utilizing artificial intelligence with the use of the semiconductor device described in the above embodiment. Examples of the application utilizing artificial intelligence include an application for interpreting a conversation and displaying its content on the display portion 5511; an application for recognizing letters, diagrams, and the like input to the touch panel of the display portion 5511 by a user and displaying them on the display portion 5511; and an application for biometric authentication using fingerprints, voice prints, or the like.

[Wearable Terminal]

FIG. 33 illustrates a watch-type information terminal 5900 as an example of a wearable terminal. The information terminal 5900 includes a housing 5901, a display portion 5902, an operation button 5903, an operator 5904, a band 5905, and the like.

The wearable terminal can execute an application utilizing artificial intelligence with the use of the semiconductor device described in the above embodiment, like the information terminal 5500. Examples of the application utilizing artificial intelligence include an application for managing the health condition of the user of the wearable terminal and a navigation system that selects the optimal route and navigates the user on the basis of the input of the destination.

[Information Terminal]

FIG. 33 illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the semiconductor device described in the above embodiment, like the information terminal 5500 described above. Examples of the application utilizing artificial intelligence include design-support software, text correction software, and software for automatic menu generation. Furthermore, with the use of the desktop information terminal 5300, novel artificial intelligence can be developed.

Note that although FIG. 33 illustrates the smartphone, the desktop information terminal, and the wearable terminal as examples of electronic devices, one embodiment of the present invention can also be applied to information terminals other than smartphones, desktop information terminals, and wearable terminals. Examples of information terminals other than smartphones, desktop information terminals, and wearable terminals include a PDA (Personal Digital Assistant), a laptop information terminal, and a workstation.

[Household Appliance]

FIG. 33 illustrates an electric refrigerator-freezer 5800 as an example of a household appliance. The electric refrigerator-freezer 5800 includes a housing 5801, a refrigerator door 5802, a freezer door 5803, and the like.

When the semiconductor device described in the above embodiment is used in the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Here, an electric refrigerator-freezer is described as an example of a household appliance; other examples of household appliances include a vacuum cleaner, a microwave oven, an electric oven, a rice cooker, a water heater, an IH (Induction Heating) cooker, a water server, a heating-cooling combination appliance such as an air conditioner, a washing machine, a drying machine, and an audio visual appliance.

[Game Machines]

FIG. 33 illustrates a portable game machine 5200 as an example of a game machine. The portable game machine 5200 includes a housing 5201, a display portion 5202, a button 5203, and the like.

FIG. 33 illustrates a stationary game machine 7500 as another example of a game machine. The stationary game machine 7500 includes a main body 7520 and a controller 7522. The controller 7522 can be connected to the main body 7520 with or without a wire. Although not illustrated in FIG. 33, the controller 7522 can include a display portion that displays a game image, and an input interface besides a button, such as a touch panel, a stick, a rotating knob, or a sliding knob, for example. The shape of the controller 7522 is not limited to that shown in FIG. 33, and the shape of the controller 7522 may be changed variously in accordance with the genres of games. For example, in a shooting game such as an FPS (First Person Shooter) game, a gun-shaped controller having a trigger button can be used. As another example, in a music game or the like, a controller having a shape of a music instrument, audio equipment, or the like can be used. Furthermore, the stationary game machine may include a camera, a depth sensor, a microphone, and the like so that the game player can play a game using a gesture and/or a voice instead of a controller.

Videos displayed on the game machine can be output with a display device such as a television device, a personal computer display, a game display, and a head-mounted display.

When the semiconductor device described in the above embodiment is used in the portable game machine 5200, the portable game machine 5200 with low power consumption can be achieved. Furthermore, heat generation from a circuit can be reduced owing to low power consumption; thus, the influence of heat generation on the circuit itself, the peripheral circuit, and the module can be reduced.

Furthermore, when the semiconductor device described in the above embodiment is used in the portable game machine 5200, the portable game machine 5200 including artificial intelligence can be achieved.

In general, the progress of a game, the actions and words of game characters, and expressions of a phenomenon and the like in the game are programed in the game; however, the use of artificial intelligence in the portable game machine 5200 enables expressions not limited by the game program. For example, it becomes possible to change expressions such as questions posed by the player, the progress of the game, time, and actions and words of game characters.

When a game requiring a plurality of players is played on the portable game machine 5200, the artificial intelligence can create a virtual game player; thus, the game can be played alone with the game player created by the artificial intelligence as an opponent.

Although FIG. 33 illustrates the portable game machine as an example of a game machine, the electronic device of one embodiment of the present invention is not limited thereto. Examples of the electronic device of one embodiment of the present invention include a home stationary game machine, an arcade game machine installed in entertainment facilities (e.g., a game center and an amusement park), and a throwing machine for batting practice installed in sports facilities.

[Moving Vehicle]

The semiconductor device described in the above embodiment can be used in an automobile, which is a moving vehicle, and around the driver's seat in an automobile.

FIG. 33 illustrates an automobile 5700 as an example of a moving vehicle.

An instrument panel that can display a speedometer, a tachometer, a mileage, a fuel meter, a gearshift state, air-conditioning setting, and the like is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, thereby providing a high level of safety. That is, displaying an image taken by the imaging device provided on the exterior of the automobile 5700 can compensate for blind areas and enhance safety.

Since the semiconductor device described in the above embodiment can be used as the components of artificial intelligence, the semiconductor device can be used for an automatic driving system of the automobile 5700, for example. The semiconductor device can also be used for a system for navigation, risk prediction, or the like. The display device may display navigation information, risk prediction information, or the like.

Note that although an automobile is described above as an example of the moving vehicle, the moving vehicle is not limited to an automobile. Other examples of the moving vehicle include a train, a monorail train, a ship, and a flying object (a helicopter, an unmanned aircraft (a drone), an airplane, and a rocket), and these moving vehicles can include a system utilizing artificial intelligence when equipped with a computer of one embodiment of the present invention.

[Camera]

The semiconductor device described in the above embodiment can be used in a camera.

FIG. 33 illustrates a digital camera 6240 as an example of an imaging device. The digital camera 6240 includes a housing 6241, a display portion 6242, operation buttons 6243, a shutter button 6244, and the like, and a detachable lens 6246 is attached to the digital camera 6240. Here, the lens 6246 of the digital camera 6240 is detachable from the housing 6241 for replacement; alternatively, the lens 6246 may be incorporated into the housing 6241. Moreover, the digital camera 6240 can be additionally equipped with a stroboscope, a viewfinder, or the like.

When the semiconductor device described in the above embodiment is used in the digital camera 6240, the digital camera 6240 with low power consumption can be achieved. Furthermore, heat generation from a circuit can be reduced owing to low power consumption; thus, the influence of heat generation on the circuit itself, the peripheral circuit, and the module can be reduced.

Furthermore, when the semiconductor device described in the above embodiment is used in the digital camera 6240, the digital camera 6240 including artificial intelligence can be achieved. Utilizing the artificial intelligence enables the digital camera 6240 to have a function of automatically recognizing a subject such as a face or an object, a function of adjusting a focus on the subject, a function of automatically using a flash in accordance with environments, a function of toning a taken image, and the like.

[Video Camera]

The semiconductor device described in the above embodiment can be used in a video camera.

FIG. 33 illustrates a video camera 6300 as an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Videos displayed on the display portion 6303 may be switched in accordance with the angle at the joint 6306 between the first housing 6301 and the second housing 6302.

When a video taken by the video camera 6300 is recorded, the video needs to be encoded based on a data recording format. With the use of artificial intelligence, the video camera 6300 can perform the pattern recognition by artificial intelligence during encoding. By the pattern recognition, difference data on a person, an animal, an object, and the like included in continuously taken image data is calculated, so that the data can be compressed.

[Expansion Device for PC]

The semiconductor device described in the above embodiment can be used in a calculator such as a PC (Personal Computer) and an expansion device for an information terminal.

Figure 34A:
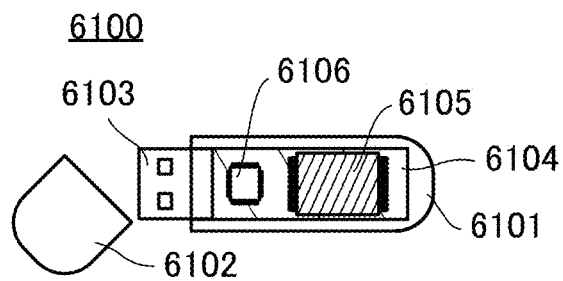
FIG. 34A to FIG. 34C are perspective views illustrating examples of electronic devices.

FIG. 34A illustrates, as an example of the expansion device, a portable expansion device 6100 that includes a chip capable of arithmetic processing and is externally attached to a PC. The expansion device 6100 can perform arithmetic processing using the chip when connected to a PC with a USB (Universal Serial Bus), for example. FIG. 34A illustrates the portable expansion device 6100; however, the expansion device of one embodiment of the present invention is not limited thereto and may be a relatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device or the like described in the above embodiment. For example, a chip 6105 (e.g., the semiconductor device described in the above embodiment, the electronic component 4700, or a memory chip) and a controller chip 6106 are attached to the substrate 6104. The USB connector 6103 functions as an interface for connection to an external device.

The use of the expansion device 6100 for a PC and the like can increase the arithmetic processing capability of the PC. Thus, a PC with insufficient processing capability can perform arithmetic operation of artificial intelligence, moving image processing, and the like.

[Broadcasting System]

The semiconductor device described in the above embodiment can be used for a broadcasting system.

Figure 34B:
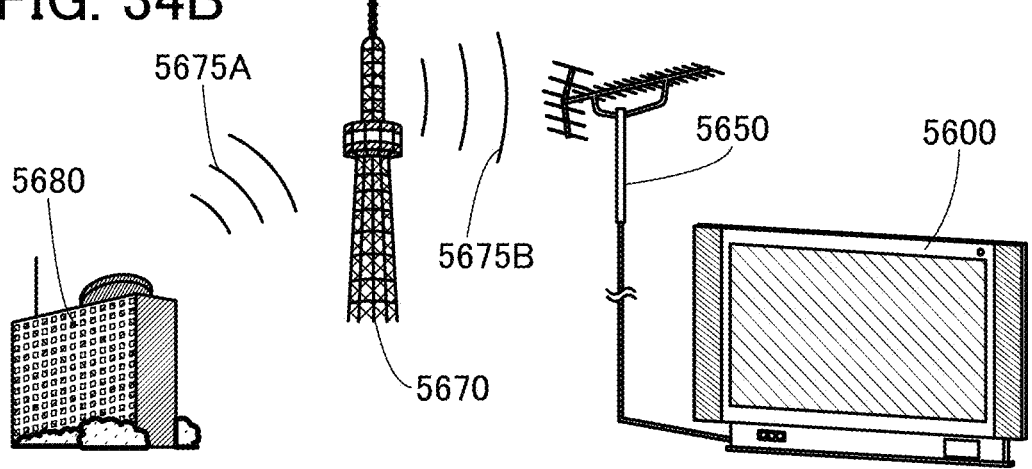

FIG. 34B schematically illustrates data transmission in a broadcasting system. Specifically, FIG. 34B illustrates a path in which a radio wave (a broadcasting signal) transmitted from a broadcast station 5680 reaches a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 34B, a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 34B and may be satellite broadcasting using an artificial satellite, data broadcasting using an optical line, or the like.

The above-described broadcasting system may be a broadcasting system that utilizes artificial intelligence by including the semiconductor device described in the above embodiment. When the broadcast data is transmitted from the broadcast station 5680 to the TV 5600 of each household, the broadcast data is compressed with an encoder. When the antenna 5650 receives the compressed broadcast data, the compressed broadcast data is decompressed with a decoder of the receiving device in the TV 5600. Utilizing the artificial intelligence enables, for example, recognition of a display pattern included in a displayed image in motion compensation prediction, which is one of the compressing methods for the encoder. In-frame prediction utilizing artificial intelligence, for example, can also be performed. As another example, when the broadcast data with low resolution is received and the broadcast data is displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K and 8K) broadcasting, which needs a large amount of broadcast data.

As the application of artificial intelligence in the TV 5600, a recording device with artificial intelligence may be provided in the TV 5600, for example. With such a structure, the artificial intelligence can learn the user's preference, so that TV programs that suit the user's preference can be recorded automatically in the recording device.

[Authentication System]

The semiconductor device described in the above embodiment can be used for an authentication system.

Figure 34C:
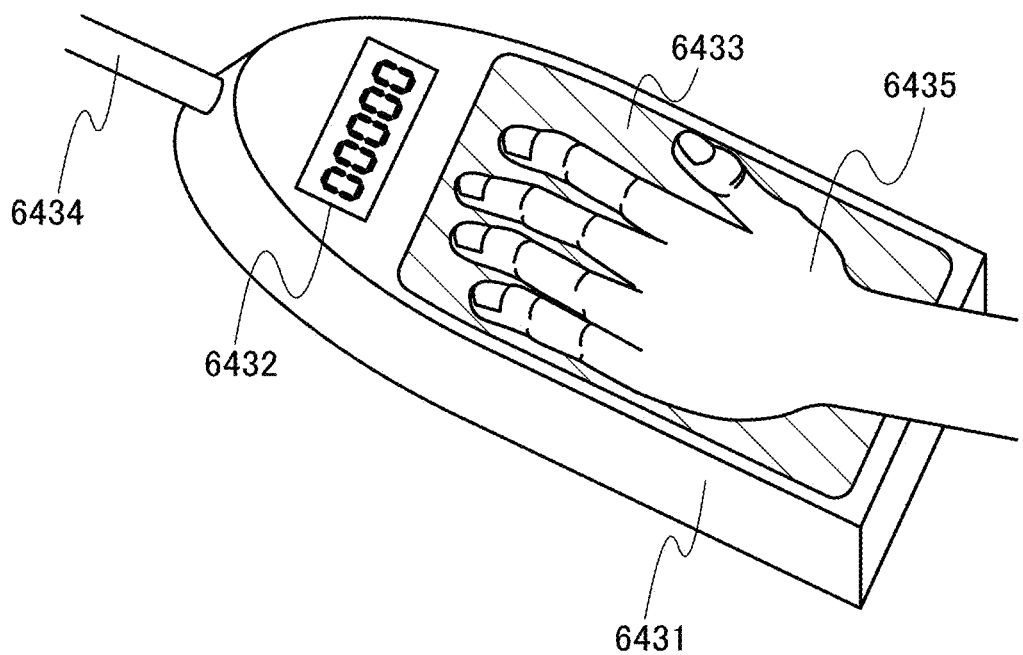

FIG. 34C illustrates a palm print authentication device including a housing 6431, a display portion 6432, a palm print reading portion 6433, and a wiring 6434.

FIG. 34C illustrates a situation in which the palm print authentication device obtains a palm print of a hand 6435. The obtained palm print is subjected to the pattern recognition utilizing artificial intelligence, so that personal authentication of the palm print can be performed. Thus, a system that performs highly secure authentication can be constructed. Without limitation to the palm print authentication device, the authentication system of one embodiment of the present invention may be a device that performs biometric authentication by obtaining biological information of fingerprints, veins, faces, iris, voice prints, genes, physiques, or the like.

[Alarm]

The semiconductor device described in the above embodiments can be used in an alarm.

Figure 35A:
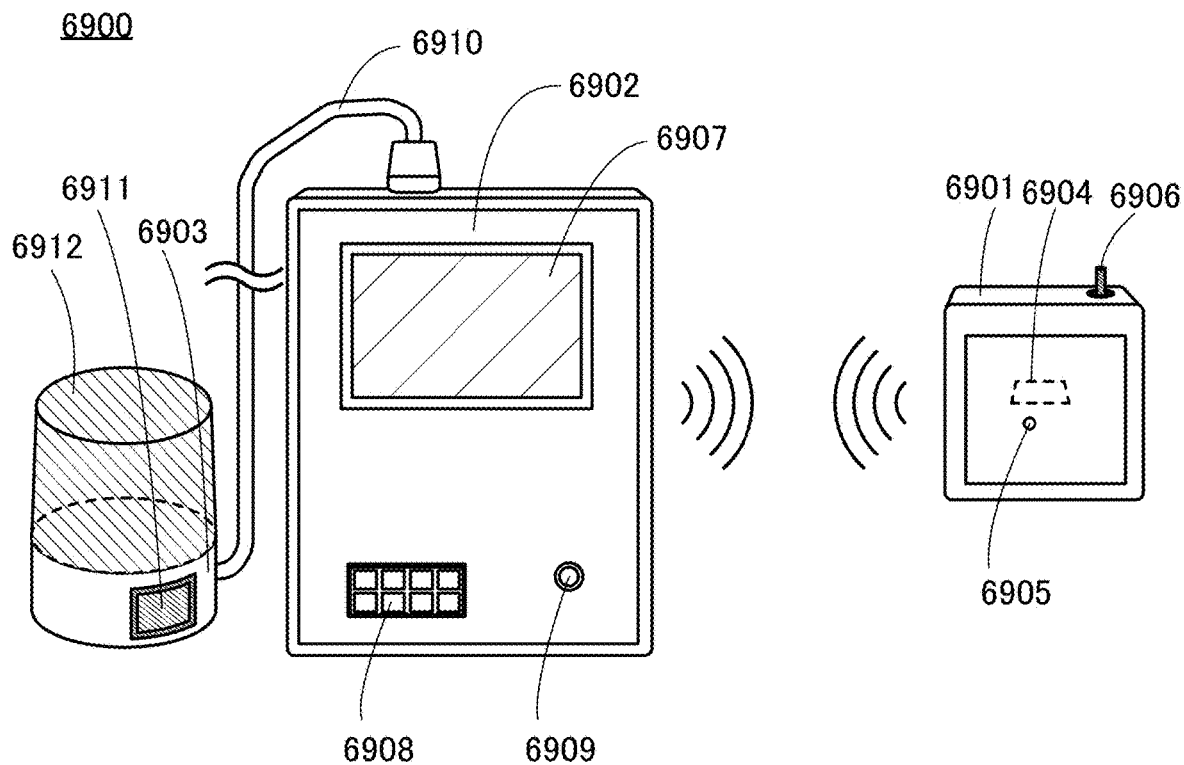
FIG. 35A to FIG. 35C are schematic views illustrating examples of electronic devices.

FIG. 35A illustrates an alarm 6900 that includes a sensor 6901, a receiver 6902, and a transmitter 6903.

The sensor 6901 includes a sensor circuit 6904, an air vent 6905, an operation key 6906, and the like. A detection object that passes through the air vent 6905 is sensed with the sensor circuit 6904. The sensor circuit 6904 can be, for example, a detector whose detection object is water leakage, electric leakage, gas leakage, fire, the water level of a river that may overflow, the seismic intensity of an earthquake, a radiation, or the like.

For example, when the sensor circuit 6904 senses the detection object with a predetermined value or more, the sensor 6901 sends information thereon to the receiver 6902. The receiver 6902 includes a display unit 6907, operation keys 6908, an operation key 6909, a wiring 6910, and the like. The receiver 6902 controls the operation of the transmitter 6903 in accordance with the information from the sensor 6901. The transmitter 6903 includes a speaker 6911, a lighting device 6912, and the like. The transmitter 6903 has a function of giving an alarm in accordance with a command from the transmitter 6903. Although FIG. 35A illustrates an example in which the transmitter 6903 gives a sound alarm using the speaker 6911 and gives an optical alarm using the lighting device 6912 such as a red light, the transmitter 6903 may give any one of the alarms or another alarm.

In the case where the sensor circuit functions as a fire alarm, the receiver 6902 may command fire prevention equipment such as a shutter to perform a predetermined operation when an alarm is given. Although FIG. 35A illustrates an example in which signals are wirelessly transmitted and received between the receiver 6902 and the sensor 6901, signals may be transmitted and received via a wiring or the like. In addition, although FIG. 35A illustrates an example in which a signal is transmitted from the receiver 6902 to the transmitter 6903 via the wiring 6910, a signal may be wirelessly transmitted.

[Robot]

The semiconductor device described in the above embodiments can be used in a robot.

Figure 35B:
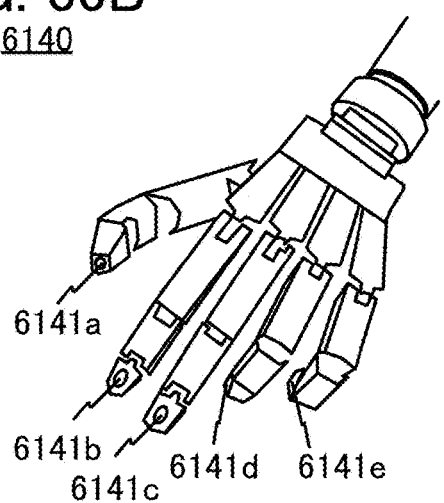

FIG. 35B illustrates an example of a robot. A robot 6140 includes a tactile sensor 6141*a* to a tactile sensor 6141*e*. The robot 6140 can grasp an object with the use of the tactile sensor 6141*a* to the tactile sensor 6141*e*. The tactile sensor 6141*a* to the tactile sensor 6141*e* have a function such that a current flows through the object in accordance with a contact area at the time of touching the object, for example, and the robot 6140 can recognize from the amount of the flowing current that the robot 6140 grasps the object.

Figure 35C:
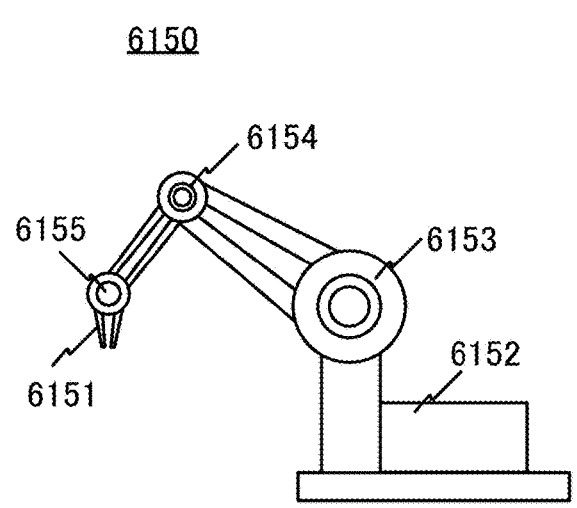

FIG. 35C illustrates an example of an industrial robot. The industrial robot preferably includes a plurality of drive shafts to control the driving range minutely. An example is shown in which an industrial robot 6150 includes a function unit 6151, a control unit 6152, a drive shaft 6153, a drive shaft 6154, and a drive shaft 6155. The function unit 6151 preferably includes a sensor such as an image detection module.

The function unit 6151 preferably has one or more functions of grasping, cutting, welding, applying, and bonding an object, for example. The productivity of the industrial robot 6150 is increased as the response is improved. In order that the industrial robot 6150 can operate precisely, a sensor that detects a minute current or the like is preferably provided.

Note that this embodiment can be implemented in appropriate combination with the other embodiments described in this specification.

REFERENCE NUMERALS

MAC1: arithmetic circuit, MAC1-1: arithmetic circuit, MAC1-2: arithmetic circuit, MAC2: arithmetic circuit, MAC3: arithmetic circuit, MAC4: arithmetic circuit, CA: memory cell array, AM[1,1]: memory cell, AM[m,1]: memory cell, AM[1,n]: memory cell, AM[m,n]: memory cell, AM[1,t]: memory cell, AM[n,1]: memory cell, AM[n,t]: memory cell, AMr[1]: memory cell, AMr[m]: memory cell, AMr[n]: memory cell, AMb[1]: memory cell, AMb[n]: memory cell, CMS: circuit, CS1[1]: circuit, CS1[n]: circuit, CS2[1]: circuit, CS2[n]: circuit, CM: circuit, WDD: circuit, XLD: circuit, LGC: circuit, LS: circuit, MUX: circuit, SCA: circuit, RPC[1]: circuit, RPC[m]: circuit, SNC: circuit, SWC: circuit, SWT[1]: circuit, SWT[m]: circuit, WLD: circuit, IVTC: circuit, ACTV: circuit, BL[1]: wiring, BL[n]: wiring, BL[t]: wiring, BLr: wiring, BLO[1]: wiring, BLO[n]: wiring, WD[1]: wiring, WD[n]: wiring, WD[t]: wiring, WDr: wiring, WL[1]: wiring, WL[m]: wiring, WL[n]: wiring, WLb: wiring, XL[1]: wiring, XL[m]: wiring, XL[n]: wiring, XLb: wiring, OL[1]: wiring, OL[n]: wiring, NIL[1]: wiring, NIL[n]: wiring, NIL[t]: wiring, LXS[1]: wiring, LXS[m]: wiring, DXS[1]: wiring, DXS[m]: wiring, VR: wiring, VRA: wiring, VHE: wiring, VLE: wiring, VdL: wiring, AND: wiring, VBE: wiring, VDE: wiring, VSE: wiring, VRS: wiring, CVL: wiring, SL1: wiring, SL2: wiring, SL3: wiring, SL4: wiring, SL5: wiring, SL5B: wiring, SL6: wiring, SL8[1]: wiring, SL8[m]: wiring, TXL: wiring, RSL: wiring, SCL: wiring, SPL: wiring, DAT: wiring, LAT: wiring, SEL[1]: wiring, SEL[m]: wiring, DL[1]: wiring, DL[m]: wiring, Tr11: transistor, Tr12: transistor, Tr31: transistor, Tr32[1]: transistor, Tr32[n]: transistor, Tr33: transistor, Tr34: transistor, Tr35: transistor, Tr36[1]: transistor, Tr36[n]: transistor, Tr41: transistor, Tr42: transistor, Tr43: transistor, Tr44: transistor, C1: capacitor, C6: capacitor, C7: capacitor, C8: capacitor, RE[1]: resistor, RE[n]: resistor, LE[1]: load, LE[n]: load, SW1: switch, SW2: switch, SW3[1]: switch, SW3[n]: switch, SW4[1]: switch, SW4[n]: switch, SW5*a*: switch, SW5*b*: switch, SW6[1]: switch, SW6[n]: switch, SW8[1]: switch, SW8[m]: switch, OP[1]: operational amplifier, OP[n]: operational amplifier, PD: photodiode, LTA[1]: latch circuit, LTA[m]: latch circuit, LTB[1]: latch circuit, LTB[m]: latch circuit, BF[1]: buffer circuit, BF[m]: buffer circuit, N[1,1]: node, N[m,1]: node, N[1,n]: node, N[m,n]: node, Nr[1]: node, Nr[m]: node, Nb[1]: node, Nb[n]: node, NS: node, DT: data, SA: component, SCL1: scribe line, SCL2: scribe line, 100: neural network, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 402: insulator, 404: insulator, 500: transistor, 503: conductor, 503*a*: conductor, 503*b*: conductor, 510: insulator, 512: insulator, 514: insulator, 516: insulator, 518: conductor, 520: insulator, 522: insulator, 524: insulator, 530: oxide, 530*a*: oxide, 530*b*: oxide, 530*c*: oxide, 530*c*1: oxide, 530*c*2: oxide, 540: conductor, 540*a*: conductor, 540*b*: conductor, 542: conductor, 542*a*: conductor, 542*b*: conductor, 543*a*: region, 543*b*: region, 544: insulator, 546: conductor, 548: conductor, 550: insulator, 552: insulator, 560: conductor, 560*a*: conductor, 560*b*: conductor, 574: insulator, 580: insulator, 581: insulator, 582: insulator, 586: insulator, 600: capacitor, 600A: capacitor, 600B: capacitor, 610: conductor, 611: conductor, 612: conductor, 620: conductor, 630: insulator, 631: insulator, 650: insulator, 651: insulator, 691: insulator, 692: insulator, 693: insulator, 700: photoelectric conversion element, 700A: photoelectric conversion element, 701: insulator, 741: conductor, 742: conductor, 743: conductor, 751: insulator, 752: insulator, 753: insulator, 754: insulator, 755: insulator, 756: insulator, 765*a*: layer, 765*b*: layer, 767*a*: layer, 767*b*: layer, 767*c*: layer, 767*d*: layer, 767*e*: layer, 771: light-blocking layer, 772: optical conversion layer, 773: microlens array, 4510: package substrate, 4511: package substrate, 4520: cover glass, 4521: lens cover, 4530: adhesive, 4535: lens, 4540: bump, 4541: land, 4550: image sensor chip, 4551: image sensor chip, 4560: electrode pad, 4561: electrode pad, 4570: wire, 4571: wire, 4590: IC chip, 4700: electronic component, 4702: printed circuit board, 4704: mounting board, 4710: semiconductor device, 4711: mold, 4712: land, 4713: electrode pad, 4714: wire, 4730: electronic component, 4731: interposer, 4732: package substrate, 4733: electrode, 4735: semiconductor device, 4800: semiconductor wafer, 4800*a*: chip, 4801: wafer, 4801*a*: wafer, 4802: circuit portion, 4803: spacing, 4803*a*: spacing, 5200: portable game machine, 5201: housing, 5202: display portion, 5203: button, 5300: desktop information terminal, 5301: main body, 5302: display, 5303: keyboard, 5500: information terminal, 5510: housing, 5511: display portion, 5600: TV, 5650: antenna, 5670: radio wave tower, 5675A: radio wave, 5675B: radio wave, 5680: broadcast station, 5700: automobile, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6100: expansion device, 6101: housing, 6102: cap, 6103: USB connector, 6104: substrate, 6105: chip, 6106: controller chip, 6140: robot, 6141*a*: tactile sensor, 6141*b*: tactile sensor, 6141*c*: tactile sensor, 6141*d*: tactile sensor, 6141*e*: tactile sensor, 6150: industrial robot, 6151: function unit, 6152: control unit, 6153: drive shaft, 6154: drive shaft, 6155: drive shaft, 6240: digital camera, 6241: housing, 6242: display portion, 6243: operation button, 6244: shutter button, 6246: lens, 6300: video camera, 6301: first housing, 6302: second housing, 6303: display portion, 6304: operation key, 6305: lens, 6306: joint, 6431: housing, 6432: display portion, 6433: palm print reading portion, 6434: wiring, 6435: hand, 6900: alarm, 6901: sensor, 6902: receiver, 6903: transmitter, 6904: sensor circuit, 6905: air vent, 6906: operation key, 6907: display portion, 6908: operation key, 6909: operation key, 6910: wiring, 6911: speaker, 6912: lighting device, 7500: stationary game machine, 7520: main body, 7522: controller

The invention claimed is:

1. A semiconductor device comprising:
a first cell, a second cell, a first circuit, a second circuit, a third circuit, a fourth circuit, a first wiring, a second wiring, and a third wiring,
wherein the first cell comprises a first capacitor,
wherein the second cell comprises a second capacitor,
wherein the third circuit comprises a sensor,
wherein the first circuit comprises a fifth circuit and a sixth circuit,
wherein the first cell is electrically connected to the first circuit through the first wiring,
wherein a first terminal of the first capacitor in the first cell is electrically connected to the third wiring,
wherein the second cell is electrically connected to the first circuit through the second wiring,
wherein a first terminal of the second capacitor in the second cell is electrically connected to the third wiring,
wherein the second circuit is electrically connected to the fourth circuit,
wherein the third circuit is electrically connected to the fourth circuit,
wherein the third wiring is electrically connected to the fourth circuit,
wherein the fourth circuit has a function of setting a state between the second circuit and the third wiring and a state between the third circuit and the third wiring,
wherein the first cell has:
a function of holding a first potential at a second terminal of the first capacitor when a first input potential is input to the third wiring;
a function of feeding a current based on the first potential between the first cell and the first wiring; and
a function of feeding a current based on a second potential between the first cell and the first wiring when the first potential held at the second terminal of the first capacitor changes to the second potential in response to a change of the first input potential of the third wiring to a second input potential,
wherein the second cell has:
a function of holding a third potential at a second terminal of the second capacitor when the first input potential is input to the third wiring;
a function of feeding a current based on the third potential between the second cell and the second wiring; and
a function of feeding a current based on a fourth potential between the second cell and the second wiring when the third potential held at the second terminal of the second capacitor changes to the fourth potential in response to a change of the first input potential of the third wiring to the second input potential,
wherein when the potential of the third wiring is the first input potential, a first current flows between the first circuit and the first wiring and a second current flows between the first circuit and the second wiring, wherein when the potential of the third wiring is the second input potential, a third current flows between the first circuit and the first wiring and a fourth current flows between the first circuit and the second wiring, wherein the fifth circuit has a function of feeding the first current with an amount $I_1$ to the first wiring when the potential of the third wiring is the second input potential, wherein the sixth circuit has a function of feeding the second current with an amount $I_2$ to the first wiring when the potential of the third wiring is the second input potential, wherein the first circuit has a function of obtaining an amount $I_3$ of the third current and an amount $I_4$ of the fourth current and generating a current with an amount $I_1-I_2-I_3+I_4$ when the potential of the third wiring is the second input potential, wherein the second circuit has:
 a function of generating a fifth potential;
 a function of generating a sixth potential based on internal data input to the second circuit; and
 a function of outputting the fifth potential as the first input potential or the sixth potential as the second input potential to the fourth circuit, and wherein the third circuit has:
 a function of generating a seventh potential before the sensor obtains information;
 a function of generating an eighth potential based on the information obtained by the sensor; and
 a function of outputting the seventh potential as the first input potential or the eighth potential as the second input potential to the fourth circuit.

2. The semiconductor device according to claim 1,
wherein the third circuit comprises a first transistor, a second transistor, a third transistor, and a fourth transistor,
wherein a first terminal of the sensor is electrically connected to a first terminal of the first transistor,
wherein a second terminal of the first transistor is electrically connected to a first terminal of the second transistor and a gate of the third transistor, and
wherein a first terminal of the third transistor and a first terminal of the fourth transistor are electrically connected to the third wiring through the fourth circuit.

3. The semiconductor device according to claim 1,
wherein the sensor comprises a photodiode.

4. The semiconductor device according to claim 1,
wherein the first cell comprises a fifth transistor and a sixth transistor,
wherein the second cell comprises a seventh transistor and an eighth transistor,
wherein a first terminal of the fifth transistor is electrically connected to the second terminal of the first capacitor and a gate of the sixth transistor,
wherein a first terminal of the sixth transistor is electrically connected to the first wiring,
wherein a first terminal of the seventh transistor is electrically connected to the second terminal of the second capacitor and a gate of the eighth transistor, and
wherein a first terminal of the eighth transistor is electrically connected to the second wiring.

5. The semiconductor device according to claim 1,
wherein the second circuit comprises a digital-to-analog converter circuit, and
wherein the digital-to-analog converter circuit converts an input digital signal based on the internal data into the sixth potential, and outputs the sixth potential to the fourth circuit.

6. The semiconductor device according to claim 1,
wherein the third circuit is positioned above the first cell and the second cell.

7. A semiconductor device comprising:
a first cell comprising a first capacitor;
a second cell comprising a second capacitor:
a first circuit electrically connected to the first cell through a first wiring and electrically connected to the second cell through a second wiring;
a second circuit electrically connected to a fourth circuit; and
a third circuit electrically connected to the fourth circuit, the third circuit comprising a sensor,
wherein a first terminal of the first capacitor is electrically connected to the fourth circuit through a third wiring,
wherein a first terminal of the second capacitor is electrically connected to the fourth circuit through the third wiring,
wherein the third circuit further comprises a first transistor, a second transistor, a third transistor, and a fourth transistor,
wherein a first terminal of the sensor is electrically connected to a first terminal of the first transistor,
wherein a second terminal of the first transistor is electrically connected to a first terminal of the second transistor and a gate of the third transistor, and
wherein a first terminal of the third transistor and a first terminal of the fourth transistor are electrically connected to the third wiring through the fourth circuit.

8. The semiconductor device according to claim 7,
wherein the sensor comprises a photodiode.

9. The semiconductor device according to claim 7,
wherein the first cell comprises a fifth transistor and a sixth transistor,
wherein the second cell comprises a seventh transistor and an eighth transistor,
wherein a first terminal of the fifth transistor is electrically connected to the second terminal of the first capacitor and a gate of the sixth transistor,
wherein a first terminal of the sixth transistor is electrically connected to the first wiring,
wherein a first terminal of the seventh transistor is electrically connected to the second terminal of the second capacitor and a gate of the eighth transistor, and
wherein a first terminal of the eighth transistor is electrically connected to the second wiring.

10. The semiconductor device according to claim 7,
wherein the second circuit comprises a digital-to-analog converter circuit.

11. The semiconductor device according to claim 7,
wherein the third circuit is positioned above the first cell and the second cell.

* * * * *